(12) United States Patent
Kitano et al.

(10) Patent No.: US 6,632,281 B2
(45) Date of Patent: Oct. 14, 2003

(54) SUBSTRATE PROCESSING APPARATUS AND SUBSTRATE PROCESSING METHOD

(75) Inventors: Junichi Kitano, Nirasaki (JP); Yuji Matsuyama, Kumamoto-ken (JP)

(73) Assignee: Tokyo Electron Limited, Tokyo-To (JP)

( * ) Notice: Subject to any disclaimer, the term of this patent is extended or adjusted under 35 U.S.C. 154(b) by 130 days.

(21) Appl. No.: 09/772,923

(22) Filed: Jan. 31, 2001

(65) Prior Publication Data

US 2001/0013161 A1 Aug. 16, 2001

(30) Foreign Application Priority Data

Feb. 1, 2000 (JP) .................................. 2000-024221
Feb. 16, 2000 (JP) .................................. 2000-038509
May 2, 2000 (JP) .................................. 2000-133304
May 10, 2000 (JP) .................................. 2000-137509

(51) Int. Cl.[7] ............................................. B05C 11/08
(52) U.S. Cl. .............................. 118/58; 118/66; 118/52; 118/666; 118/692; 396/611
(58) Field of Search ........................ 118/52, 612, 66, 118/666, 667, 692, 58, 61; 427/240; 396/611

(56) References Cited

U.S. PATENT DOCUMENTS 5,725,664 A    3/1998   Nanbu et al.
5,785,741 A  * 7/1998   Li et al. .................................. 96/4
5,876,280 A    3/1999   Kitano et al.
5,952,149 A    9/1999   Sakai et al.
6,054,181 A    4/2000   Nanbu et al.
6,467,976 B2 * 10/2002  Matsuyama et al. ........ 396/611

FOREIGN PATENT DOCUMENTS

EP    0 843 343    5/1998
JP    8-88367      4/1996

* cited by examiner

*Primary Examiner*—Curtis Mayes
*Assistant Examiner*—Yewebdar T. Tadesse
(74) *Attorney, Agent, or Firm*—Oblon, Spivak, McClelland, Maier & Neustadt, P.C.

(57) ABSTRACT

On top of respective areas divided by partition plates, that is, a cassette station, a processing station, and an interface section in a coating and developing processing system, gas supply sections for supplying an inert gas into the respective areas are provided. Exhaust pipes for exhausting atmospheres in the respective areas are provided at the bottom of the respective areas. The atmospheres in the respective areas are maintained in a clean condition by supplying the inert gas not containing impurities such as oxygen and fine particles from the respective gas supply sections into the respective areas and exhausting the atmospheres in the respective areas from the exhaust pipes.

17 Claims, 44 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for performing coating processing of a resist solution or developing processing, for example, for a substrate such as a semiconductor wafer, a glass substrate for a liquid crystal display, or the like.

2. Description of the Related Art

In a photolithography process in the process of fabricating a semiconductor device, for example, resist coating processing of forming a resist film on the surface of a wafer, exposure processing of exposing the wafer by irradiating a pattern on the wafer, developing processing of developing the exposed wafer, heating processing and cooling processing before the coating processing, before and after the exposure processing, and after the developing processing, and the like are performed. Such processing is performed in processing units provided individually, and these processing units are unified to compose a coating and developing processing system so as to continuously perform such successive processing.

Generally, the coating and developing processing system is composed of a loader/unloader section for carrying a wafer into/out of the coating and developing processing system, a processing section having a coating processing unit, a developing processing unit, a thermal processing unit, and the like and performing the majority of the aforesaid wafer processing, an aligner outside the system for subjecting the wafer to exposure processing, and an interface section, provided adjacent to the processing section and the aligner, for delivering the wafer between the processing section and the aligner.

When the wafer is processed in this coating and developing processing system, in order to prevent impurities such as fine particles from adhering to the wafer, air cleaned by an air purifier or the like is supplied as down-flowing air into the coating and developing processing system, while an atmosphere inside the coating and developing system is exhausted, whereby the wafer can be processed in a clean condition.

Moreover, to realize sensitive exposure, a chemically amplified resist is used. The chemically amplified resist has a basic polymer insoluble in an alkaline developing solution, for example, and an acid generator, and obtains high resolution by causing polarity changes in an exposed portion and an unexposed portion by the use of a catalytic reaction of an acid. In the aligner, a circuit pattern is exposed in a resist film by using a mask, and an elimination reaction is caused to a protective group which protects a hydroxyl group of the basic polymer by the acid produced at this time. Thereafter, the wafer is transferred to the thermal processing unit, where the catalytic reaction of the acid is accelerated to quicken the elimination reaction by PEB (post-exposure baking) which is heating after exposure, and thereby the exposed portion, for example, is made soluble in the alkaline developing solution. The wafer is then transferred to the developing processing unit and the portion which is made soluble is removed by the developing solution, whereby a precise circuit patter is obtained.

In recent years, however, exposure technology in which a beam with a shorter wavelength is used is being developed to form a finer and more precise circuit pattern, and when the beam with the shorter wavelength is used, it is confirmed that impurities at molecular level such as oxygen, basic substances, ozone, and vapor which have been insignificant so far exert a bad influence on the formation of the precise circuit pattern. Specially when the impurities adhere to the wafer on the occasion of exposure, an appropriate pattern is not exposed, and thus a drop in yield can not be avoided.

Accordingly, it is necessary for the impurities not to adhere to the wafer under processing, but the use of clean air as before is inappropriate because the air itself contains impurities such as oxygen.

An acid produced at the time of exposure has high reactivity, and hence shows a neutralization reaction with basic substances in air during the transfer of the wafer. In this case, the acid is deactivated, which causes a change in the formation of a slightly soluble surface layer and the line width of the circuit pattern. The elimination reaction of a protective group depends on the temperature, and some kind of chemically amplified resist causes the elimination reaction of the productive base by a catalytic reaction of the acid, for example, even in the state of an ordinary temperature. Therefore, there is the possibility that the elimination reaction progresses during transfer before PEB, which causes pattern deformation, the deterioration of reproducibility, and the like.

Even in such pattern deformation as can be conventionally ignored, there is still room for improvement in these days when a more precise circuit pattern is demanded, but such clean air and system configuration as before can not meet the demand.

Moreover, the wafer comes and goes between the processing section and the exposure processing section via the interface section. There is the possibility that the neutralization reaction of the acid or the elimination reaction of the productive base occur after exposure as described above, while the acid is not produced before exposure, and consequently the conditions of an atmosphere inside the interface section demanded before and after exposure are different. Thus, the formation of the optimum atmosphere for the condition of the wafer after exposure in the interface section is demanded.

SUMMARY OF THE INVENTION

An object of the present invention is to provide a substrate processing apparatus and a substrate processing method capable of preventing fine impurities at molecular level from adhering to a substrate such as a wafer or the like.

Another object of the present invention is to provide a substrate processing apparatus and a substrate processing method capable of preventing fine impurities at molecular level from adhering to a substrate such as a wafer or the like and individually controlling atmospheres in substrate routes before and after exposure in an interface section to prevent acid deactivation, pattern deformation, and the like.

Still another object of the present invention is to provide a substrate processing apparatus and a substrate processing method capable of improving the uniformity of developing line width in a surface of a substrate and between substrates by transferring the exposed substrate to a heating section while inhibiting the progress of a resolution reaction of a resist and performing heating processing there.

To attain the aforesaid objects, according to the present invention, a coating and developing processing system, which is a system for performing coating and developing processing for a substrate and characterized by comprising a loader/unloader section for carrying the substrate into/out of the system; a processing section having a coating processing unit for at least forming a coating film on the substrate, a developing processing unit for developing the substrate, a thermal processing unit for thermally processing the substrate, and a first transfer device for carrying the substrate into/out of the coating processing unit, the developing processing unit, and the thermal processing unit; an interface section having a second transfer device for transferring the substrate at least via a route between the processing section and an aligner for subjecting the substrate to exposure processing; a gas supply device for supplying an inert gas to the interface section; and an exhaust means for exhausting an atmosphere in the interface section in a casing of this system, is provided. Incidentally, the thermal processing unit includes a heating processing unit, a cooling processing unit, and a heating/cooling processing unit, and the like. Further, the processing section may include other processing units such as an extension unit for making the substrate wait and an adhesion unit for supplying a predetermined processing solution onto the substrate in order to enhance adhesion properties of the substrate and a coating solution.

The aforesaid supply of the inert gas to the interface section by the gas supply device and exhaust of the atmosphere in the interface section by the exhaust means enable the removal of impurities such as oxygen and vapor from within the interface section and the maintenance of the atmosphere inside the interface section in a clean condition. Consequently, the adhesion of impurities to the substrate is suppressed, whereby the substrate is processed suitably. Especially, if impurities adhere to the substrate when the substrate undergoes exposure processing, the impurities absorb energy of a laser beam and so on used in exposure, and as a result, the exposure processing is not performed suitably. Accordingly, it is important to maintain the interface section, which the substrate passes through immediately before the exposure processing, in a clean condition. It should be mentioned that the aforesaid inert gas is an inert gas for a processing solution used in the coating and developing processing system, for example, a coating solution such as a resist solution, and a developing solution, and a gas not containing oxygen, moisture, and organic substances, for example, nitrogen gas, argon, neon, or the like.

In the present invention, the system may comprise: a gas supply device for supplying the inert gas to an area having at least the thermal processing unit and the first transfer device in the processing section; and an exhaust means for exhausting an atmosphere at least in the area.

The aforesaid supply of the inert gas into the processing section in addition to the interface section enables the removal of impurities such as oxygen from within the processing section and the maintenance of the atmosphere inside the processing section in a clean condition, resulting in suppression of adhesion of the impurities to the substrate. Especially after a coating film is formed on the substrate and the substrate is subjected to heating processing, impurities are apt to adhere to the surface of the substrate. If impurities adhere in this case, exposure processing to be performed immediately after this can not be performed suitably. Hence, the removal of impurities from the surface of the substrate in the processing section is important. Incidentally, although the inert gas may be supplied at least into the aforesaid area in the processing section, it also may be supplied into an area other than the aforesaid area in the processing section, that is, an area where the coating processing unit and the developing processing unit are placed.

Further, in the present invention, the system may comprise: a gas supply device for supplying the inert gas to the loader/unloader section; and an exhaust means for exhausting an atmosphere in the loader/unloader section.

As described above, also in the loader/unloader section, the substrate can be more perfectly protected from impurities such as oxygen by supplying the inert gas thereto and maintaining the loader/unloader section in a clean condition as in the interface section and the area in the processing section.

The coating and developing processing system described so far may comprise a partition plate shutting off the atmosphere in the interface section from the atmosphere in the processing section, the partition plate may have a transit opening for delivering the substrate between the area in the processing section and the interface section, and the transit opening may have a shutter allowing the transit opening to freely open and close.

By dividing the interface section and the processing section by the partition plate as described above, the flow of the atmosphere inside the processing section into the interface section which is maintained in a clean condition thanks to the aforesaid supply of the inert gas can be suppressed. Moreover, by providing the transit opening in the partition plate and freely opening and closing the transit port by the shutter, the shutter can be opened only when the substrate is delivered between the interface section and the area in the processing section, which can prevent the mutual interference of the atmospheres in the processing section and the interface section and keep the atmosphere in the interface section clean. The reason why the position of the transit opening is limited to the partition plate in the area in the processing section is that the substrate is never transferred directly from any area other than the area in the processing section, that is, an area having the coating processing unit and the developing processing unit to the interface section.

Furthermore, in the present invention, the system may comprise another partition plate shutting off the atmosphere in the processing section from the atmosphere in the loader/unloader section, the aforesaid another partition plate may have another transit opening for delivering the substrate between the area in the processing section and the loader/unloader section, and the aforesaid another transit opening may have another shutter allowing the aforesaid another transit opening to freely open and close.

The aforesaid provision of the partition plate also between the processing section and the loader/unloader section and provision of the transit opening and the shutter for delivering the substrate between the area in the processing section and the loader/unloader section in the partition plate make it possible to suppress the interference of the atmospheres in the processing section and the loader/unloader section and maintain a predetermined atmosphere in the processing section. Especially, when the inert gas is supplied to the processing section as in claim 2, the flow of the relatively unclean atmosphere inside the loader/unloader section into the processing section is prevented, whereby the atmosphere in the processing section is maintained in a clean condition, and thus the adhesion of impurities to the substrate is suppressed.

In the coating and developing processing system described so far, it is suitable to clean at least a part of the atmosphere exhausted by the exhaust means and send the same as the inert gas to the gas supply device again. The aforesaid reuse of the atmosphere exhausted by the exhaust means in the gas supply device as the inert gas can reduce the amount of the inert gas newly required, leading to a reduction in the amount of the inert gas.

In the present invention, the system may comprise a temperature regulating means for regulating a temperature of the inert gas. This provision of the temperature regulating means makes it possible to maintain the atmosphere in the coating and developing processing system to which the inert gas is supplied at a predetermined temperature, whereby the processing, transfer, and the like of the substrate can be performed in the atmosphere at the predetermined temperature.

Moreover, in the present invention, it is more preferable that the pressure inside the interface section be set lower than the pressure inside the aligner.

The aforesaid setting of the pressure inside the interface section lower than the pressure inside the aligner can prevent the atmosphere in the interface section from flowing into the aligner. Hence, exposure processing for the substrate in the aligner is performed suitably in a predetermined atmosphere.

In the present invention, the pressure inside the interface section may be set lower than the pressure inside the area in the processing section. The aforesaid setting of the pressure inside the interface section lower than the pressure inside the area in the processing section can prevent the atmosphere in the interface section from flowing into the area in the processing section. Hence, a predetermined atmosphere is maintained in the processing section in which substrate processing units are provided and a variety of substrate processing is performed, and the variety of substrate processing can be performed suitably.

Further, in the present invention, the pressure inside the area in the processing section may be set higher than the pressure inside the loader/unloader section. The aforesaid setting of the pressure inside the area in the processing section higher than the pressure inside the loader/unloader section can prevent the flow of the atmosphere inside the loader/unloader section into the area in the processing section. Hence, similarly to the above, a predetermined atmosphere is maintained in the area in the processing section, and thus the variety of substrate processing can be performed suitably.

Furthermore, in the present invention, the pressure inside the area in the processing section may be set lower than the pressures inside the coating processing unit and the developing processing unit in the processing section. The aforesaid setting of the pressure inside the area in the processing section lower than the pressures inside the coating processing unit and the developing processing unit can prevent atmospheres in the coating processing unit and the developing processing unit from flowing into the area. Accordingly, the coating processing unit or the like in which the atmosphere is controlled more severely than the processing units such as a predetermined atmosphere is maintained in the thermal processing unit in the area, and thus coating processing and developing processing which are most important in this coating and developing processing can be performed suitably.

In the coating and developing processing system described thus far, the pressure inside the casing is set higher than the pressure outside the coating and developing processing system. By setting the pressure inside the casing higher than the pressure outside the coating and developing processing system as described above, the flow of an atmosphere outside the coating and developing processing system into the casing is prevented. Therefore, the contamination of an atmosphere inside the casing where the substrate is processed by the relatively dirty atmosphere outside the coating and developing processing system can be suppressed. It should be noted that the pressure outside the coating and developing processing system means the pressure inside a room where the coating and developing processing system is installed, for example, the pressure inside a clean room.

The present invention according to another aspect provides a coating and developing system, which is a system for performing coating and developing processing provided with: a processing section having a coating processing unit for at least forming a coating film on a substrate, a developing processing unit for developing the substrate, a thermal processing unit for thermally processing the substrate, and a substrate transfer device for carrying the substrate into/out of the coating processing unit, the developing processing unit, and the thermal processing unit; and an interface section for transferring the substrate via a route between the processing section and an aligner for subjecting the substrate to exposure processing, inside the casing, and characterized in that a first thermal processing unit for thermally processing the substrate before exposure, a first transfer device for transferring the substrate before exposure, a second thermal processing unit for thermally processing the substrate after exposure, and a second transfer device for transferring the substrate after exposure are arranged in the interface section, and that a first gas supply device for supplying an inert gas to an area before exposure having the first thermal processing unit and the first transfer device in the interface section, a first exhaust means for exhausting an atmosphere in the area before exposure, a second gas supply device for supplying the inert gas to an area after exposure having the second thermal processing unit and the second transfer device in the interface section, and a second exhaust means for exhausting an atmosphere in the area after exposure are provided. Incidentally, the thermal processing unit, the first thermal processing unit, and the second thermal processing unit include a heating processing unit, a cooling processing unit, a heating/cooling processing unit, and the like. Further, the processing section may include other processing units such as an extension unit for making the substrate wait and an adhesion unit for supplying a predetermined processing solution onto the substrate in order to enhance adhesion properties of the substrate and a coating solution.

According to the present invention, in the interface section, by supplying the inert gas to the area before exposure by the first gas supply device and exhausting the atmosphere in this area before exposure by the first exhaust means, impurities such as oxygen and vapor can be removed from within the area before exposure, and the area before exposure can be maintained in a clean condition. Consequently, the substrate can be transferred in a clean atmosphere from heating processing immediately before exposure processing to exposure processing, whereby the adhesion of impurities can be prevented. Especially, after the substrate on which a coating film is formed is subjected to heating processing, impurities are apt to adhere to the surface of the substrate. Moreover, if impurities adhere to the substrate when the substrate undergoes exposure processing, the impurities absorb energy of a laser beam and so on used in exposure, and as a result, there is the possibility that the exposure processing is not performed suitably. But, by maintaining the area before exposure in the interface section, which the substrate passes through immediately before the exposure processing, in a clean condition, the substrate can be processed suitably. It should be mentioned that the aforesaid inert gas is an inert gas for a processing solution used in the coating and developing processing system, for example, a coating solution and a developing solution, and a gas not containing oxygen, moisture, and organic substances, for example, nitrogen gas, argon, neon, or the like.

Moreover, by supplying the inert gas to the area after exposure by the second gas supply device and exhausting the atmosphere in this area after exposure by the second exhaust means, the area after exposure can be maintained in a clean condition similarly to the area before exposure. Especially when a chemically amplified resist which forms a circuit pattern on the substrate by a catalytic reaction of an acid is used, the acid is deactivated if impurities adheres to the substrate after exposure processing. But, the aforesaid maintenance of the area after exposure in the interface section, which the substrate passes through immediately after the exposure processing, in a clean condition can prevent the acid deactivation, leading to suitable performance of the subsequent developing processing.

The inert gas is supplied to each of the areas by the individual gas supply device, whereby atmospheres peculiar to the respective areas can be maintained in the areas before exposure and after exposure.

Since the peculiar atmospheres can be maintained in the respective areas, the second gas supply device may supply the inert gas having a temperature lower than the temperature of the inert gas to be supplied by the first gas supply device, or may supply the inert gas having a low oxygen concentration as described in claim 15.

When the first gas supply device supplies, for example, the inert gas having an ordinary temperature to the area before exposure, the second gas supply device supplies the inert gas having a temperature lower than the ordinary temperature, whereby the atmosphere in the area after exposure can be maintained in a low-temperature condition. Especially when the aforesaid chemically amplified resist has a property such that a protective group which protects a hydroxyl group of a basic polymer even at the ordinary temperature shows an elimination reaction, the elimination reaction of the protective group progresses on the substrate during its transfer within the area after exposure if the temperature of the atmosphere in the area after exposure is higher than the ordinary temperature. The maintenance of the area after exposure in a low-temperature condition, however, can inhibit the elimination reaction of the protective group during transfer. Hence, a circuit pattern can be satisfactorily formed. Moreover, the supply of the inert gas having a low oxygen concentration by the second gas supply device makes it possible to keep the concentration of oxygen in the atmosphere in the area after exposure low, which can prevent acid deactivation.

In the present invention, a partition plate shutting off the atmosphere in the area before exposure from the atmosphere in the area after exposure can be provided.

According to the present invention, the partition plate shuts off the area before exposure from the area after exposure in the interface section, which can prevent the mutual interference of the atmospheres, resulting in the maintenance of atmospheres peculiar to the respective areas in the areas before and after exposure. Specially when the area after exposure is maintained at the low temperature, it is effective to provide a partition plate between the areas as described above.

In the present invention, the system may have another partition plate shutting off an atmosphere in the processing section from an atmosphere in the interface section, the aforesaid another partition plate may have a first transit opening for delivering the substrate between the processing section and the area before exposure and a second transit opening for delivering the substrate between the processing section and the area after exposure, the first transit opening may have a first shutter allowing the first transit opening to freely open and close, and the second transit opening may have a second shutter allowing the second transit opening to freely open and close.

According to the present invention, by dividing the processing section and the interface section by another partition plate, the flow of the atmosphere inside the processing section into the areas before and after exposure in the interface section maintained in a clean condition by the aforesaid supply of the inert gas can be prevented. Further, the provision of the first shutter which can freely open and close at the first transit opening, for example, makes it possible to open the first shutter and let the substrate pass only when the substrate is delivered from the processing section to the area before exposure. Furthermore, the provision of the second shutter which can freely open and close at the second transit opening makes it possible to open the second shutter and let the substrate pass only when the substrate is delivered from the area after exposure to the processing section. Accordingly, the mutual interference of the atmospheres in the processing section and the interface section can be prevented, and the areas before and after exposure in the interface section can be maintained clean.

In the present invention, the temperature of the inert gas may be regulated. This regulation of the inert gas at a predetermined temperature allows atmospheres in respective areas to which the inert gas is supplied to be maintained at the predetermined temperature.

In the present invention, it is desirable to set the pressure in the interface section lower than the pressure in the aligner. According to such a structure, the flow of the atmospheres in the areas before and after exposure in the interface section into the aligner in which the atmosphere is severely controlled can be prevented by setting the pressure in the interface section lower than the pressure in the aligner.

A substrate processing apparatus of the present invention according to still another aspect comprises: a processing section for performing coating and developing processing for a substrate; an interface section for transferring the substrate at least via a route between the processing section and an aligner for subjecting the substrate to exposure processing; a chamber, disposed inside the interface section, for temporarily holding the substrate delivered from the processing section and to be transferred to the aligner; and an atmosphere controller for controlling an atmosphere in the chamber.

In the present invention, since the substrate delivered from the processing section and to be transferred to the aligner is temporarily held in the chamber in which the atmosphere is controlled, for example, the variation with time of the resist before exposure can be suppressed, and a change in the property of the resist can be prevented. As a result, the uniformity of line width can be raised.

The atmosphere controller here reduces the pressure inside the chamber and supplies an inert gas or dry air into the chamber.

The chamber can be structured to comprise: a purge room for temporarily holding and purging the substrate introduced into the chamber; a buffer room for holding the substrate; and a transfer device for transferring the substrate between the purge room and the buffer room. Incidentally, it is desirable that the buffer room have a transit opening for directly carrying out the substrate to the aligner.

A substrate processing apparatus of the present invention according to another aspect comprises: a coating processing unit for at least forming a coating film on a substrate; a developing processing unit for developing the substrate; a thermal processing unit for thermally processing the substrate; a transfer device for carrying the substrate into/out of the coating processing unit, the developing processing unit, and the thermal processing unit; and a blower for sending an inert gas to the substrate which is being transferred by the transfer device.

In the present invention, the blower for sending the inert gas to the substrate which is being transferred by the transfer device is provided, which eliminates influence on pattern resolution, for example, due to the occurrence of hydrolysis of the resist caused by moisture in atmospheric air during the transfer of the substrate after resist-coating and the bonding of the resist with oxygen in the atmospheric air.

Specifically, for example, the transfer device has tweezers for holding the substrate, and the blower has a top cover having a blast port for sending the inert gas from above the tweezers. In this case, a plurality of the blast ports may be provided to correspond to the shape of the tweezers, or may be provided to correspond to the shape of the substrate. The blower may be structured to have a temperature control mechanism for controlling the temperature of the inert gas or a humidity control mechanism for controlling the humidity of the inert gas. Incidentally, it is most efficient that the blower sends the inert gas when the transfer device transfers the substrate from the coating processing unit to the thermal processing unit.

A substrate processing apparatus of the present invention according to still another aspect is characterized by comprising: a reaction inhibiting section for performing processing of inhibiting the progress of a resolution reaction of a resist for a substrate coated with the resist and exposed; a heating section for heating the substrate processed in the reaction inhibiting section to progress the resolution reaction of the resist; a cooling section for cooling the substrate heated in the heating section to inhibit the progress of the resolution reaction of the resist; and a developing processing section for performing coating processing of a developing solution for the substrate cooled in the cooling section.

Specifically, the apparatus comprises: a cassette station including a mounting section on which a substrate cassette housing a plurality of substrates is mounted and a delivery means for receiving and sending the substrate from/to the substrate cassette mounted on the mounting section; a processing station, connected to the cassette station, for processing the substrate transferred by the delivery means; an aligner provided on the opposite side to the cassette station of the processing station; and an interface station, connected to the opposite side to the cassette station of the processing station, for delivering the substrate between the processing station and the aligner, and the interface station includes a reaction inhibiting section for performing processing of inhibiting the progress of a resolution reaction of a resist for a substrate coated with the resist and exposed, and the processing station includes a heating section for heating the substrate processed in the reaction inhibiting section to progress the resolution reaction of the resist, a cooling section for cooling the substrate heated in the heating section to inhibit the progress of the resolution reaction of the resist, and a developing processing section for performing coating processing of a developing solution for the substrate.

In such a substrate processing apparatus, the progress of the resolution reaction of the resist is inhibited during the transfer of the substrate from the aligner to the heating section, and thus in the heating section, the resolution reaction progresses on the same condition for the substrate in which the extent of the progress of the resolution reaction is made uniform. Therefore, when developing processing is performed, the extent of the progress of the resolution reaction is made uniform over the entire substrate, whereby the occurrence of the ununiformity of developing line width is suppressed.

In the above, it is desirable to place the reaction inhibiting section near the aligner, in which case the time of transfer between the aligner and the reaction inhibiting section is shortened, whereby the extent of the progress of the resolution reaction of the substrate transferred to the reaction inhibiting section is made more uniform, resulting in a rise in the uniformity of developing line width.

In this case, it is desirable that the reaction inhibiting section have a structure characterized by inhibiting the progress of the resolution reaction of the resist by cooling the substrate coated with the resist and exposed so as not to cause dew formation. Also, it is desirable that it have a structure characterized by inhibiting the progress of the resolution reaction of the resist by making the amount of moisture adhering to the substrate coated with the resist and exposed smaller than the amount of moisture adhering to the substrate when the substrate is transferred to the reaction inhibiting section, and characterized, for example, by making the amount of the moisture adhering to the substrate smaller than the amount of the moisture adhering to the substrate when the substrate is transferred to the reaction inhibiting section by supplying a gas having a humidity lower than the humidity of air in an atmosphere in which the reaction inhibiting section is placed.

The resist is a chemically amplified resist, the resolution reaction of which is progressed by an acid produced by exposure, for example, in which case the resolution reaction of the resist is a reaction that an acid produced by exposure decomposes a basic resin which is a main component of a resist material or changes its molecular structure to make the basic resin soluble in a developing solution.

Therefore, in a substrate processing method of the present invention comprising the steps of: heating a substrate coated with a resist and exposed in a heating section to progress a resolution reaction of the resist; cooling the substrate to inhibit the progress of the resolution reaction of the resist; and performing coating processing of a developing solution for the substrate, the exposed substrate is transferred to the heating section with the resolution reaction of the resist being inhibited.

Such a method is carried out by a substrate processing apparatus characterized by comprising: an exposure section for exposing a substrate coated with a resist; a heating section for heating the exposed substrate to progress a resolution reaction of the resist; a cooling section for cooling the heated substrate to inhibit the progress of the resolution reaction of the resist; and a developing processing section for performing coating processing of a developing solution for the cooled substrate, and transferring the exposed substrate to the heating section by a substrate transfer means with the resolution reaction of the resist being inhibited.

In this case, for example, the exposed substrate is transferred to the heating section with the progress of the resolution reaction of the resist being inhibited by being cooled so as not to cause dew formation. Moreover, the substrate may be transferred to the heating section with the progress of the resolution reaction of the resist being inhibited by making the amount of moisture adhering to the substrate when the substrate is transferred to the heating section smaller than the amount of moisture adhering to the substrate after exposure, in which case the exposed substrate is transferred to the heating section while a gas having a humidity lower than air is being supplied to the substrate.

Specifically, the apparatus has a structure characterized by comprising: a cassette station including a mounting section on which a substrate cassette housing a plurality of substrates is mounted and a delivery means for receiving and sending the substrate from/to the substrate cassette mounted on the mounting section; a processing station, connected to the cassette station, for processing the substrate transferred by the delivery means; an aligner provided on the opposite side to the cassette station of the processing station; an interface station, connected to the opposite side to the cassette station of the processing station, for delivering the substrate between the processing station and the aligner, and characterized in that the interface station comprises a heating section for heating the exposed substrate to progress a resolution reaction of a resist, the processing station comprises: a cooling section for cooling the substrate heated in the heating section to inhibit the progress of the resolution reaction of the resist; and a developing processing section for performing coating processing of a developing solution for the substrate, and that the interface station is cooled so as not to cause dew formation on the substrate to inhibit the progress of the resolution reaction of the resist.

In such a invention, the progress of the resolution reaction of the resist is inhibited during the transfer of the substrate from the aligner to the heating section, and thus in the heating section, the resolution reaction progresses on the same condition for the substrate in which the extent of the progress of the resolution reaction is made uniform. Therefore, when developing processing is performed, the extent of the progress of the resolution reaction is made uniform over the entire substrate, whereby the occurrence of the ununiformity of the developing line width is suppressed.

Moreover, the resist is a chemically amplified resist, the resolution reaction of which is progressed by an acid produced by exposure, for example, in which case the resolution reaction of the resist is a reaction that an acid produced by exposure decomposes a basic resin which is a main component of a resist material or changes molecular structure to make the basic resin soluble in a developing solution.

These objects and still other objects and advantages of the present invention will become apparent upon reading the following specification when taken in conjunction with the accompanying drawings.

DETAILED DESCRIPTION OF THE PREFERRED EMBODIMENT

Hereinafter, the preferred embodiments of the present invention will be explained.

(First Embodiment)

Figure 1:
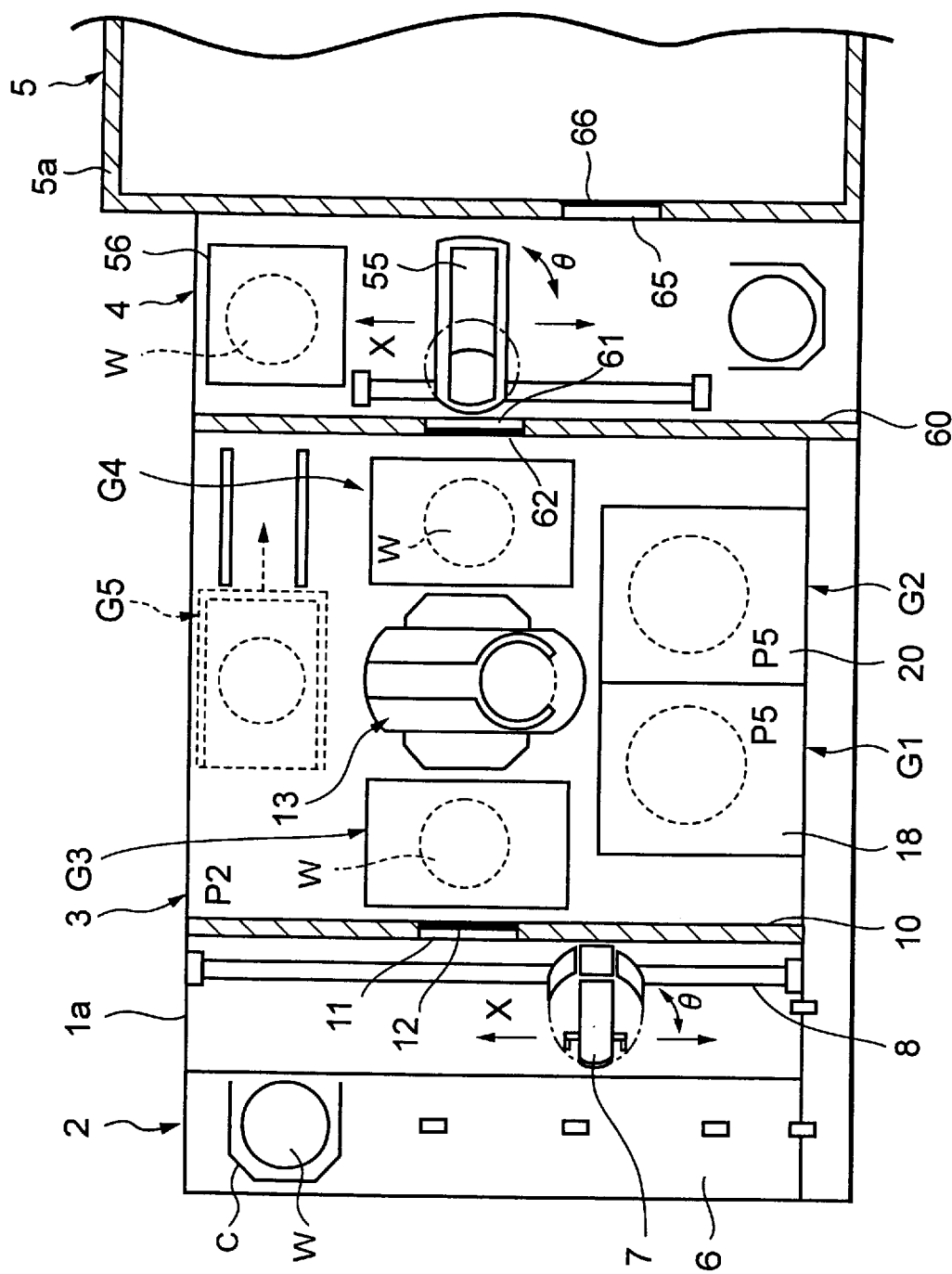
FIG. 1 is a plan view showing the external appearance of a coating and developing processing system according to a first embodiment of the present invention.
Figure 2:
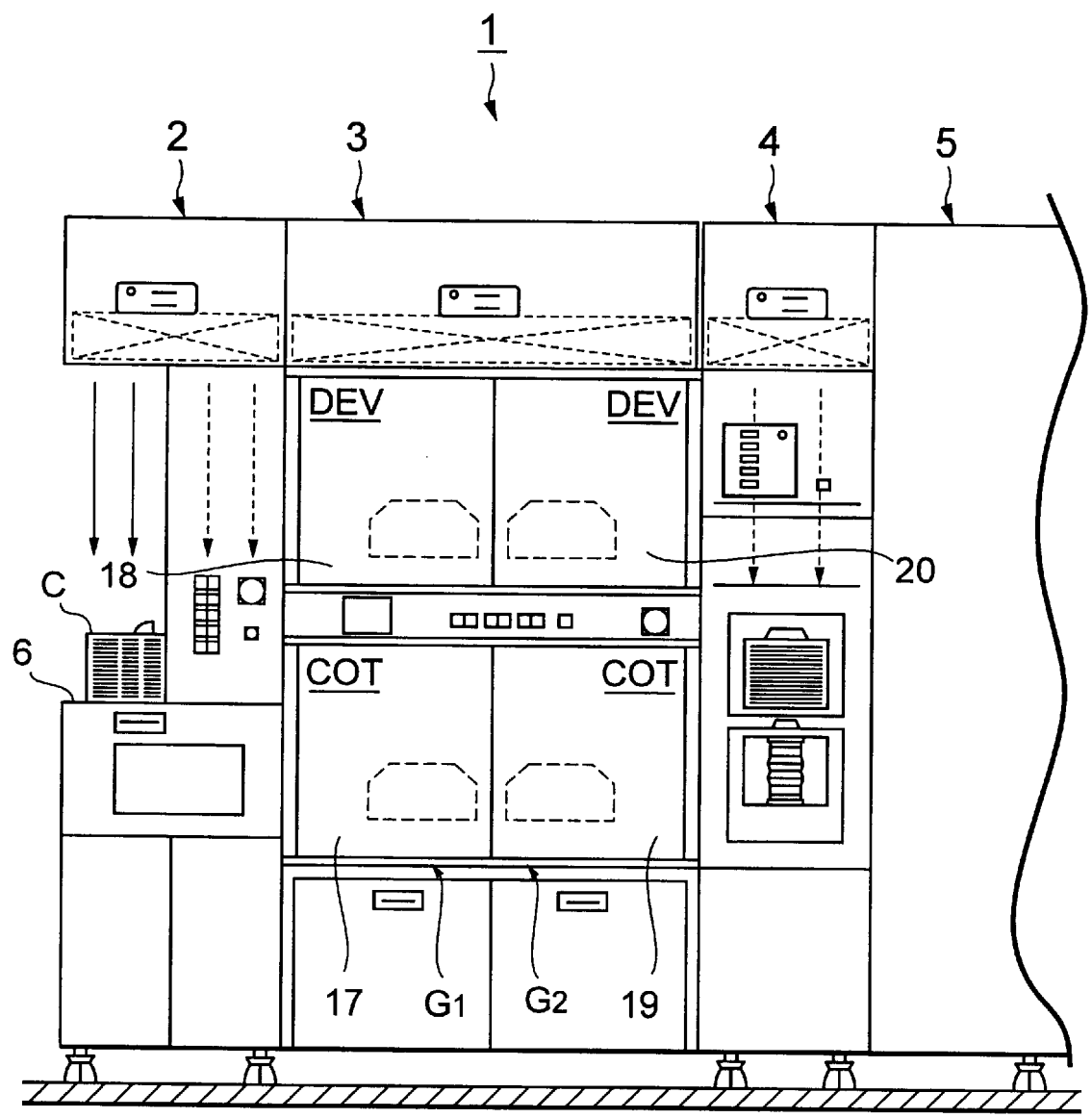
FIG. 2 is a front view of the coating and developing processing system in FIG. 1.
Figure 3:
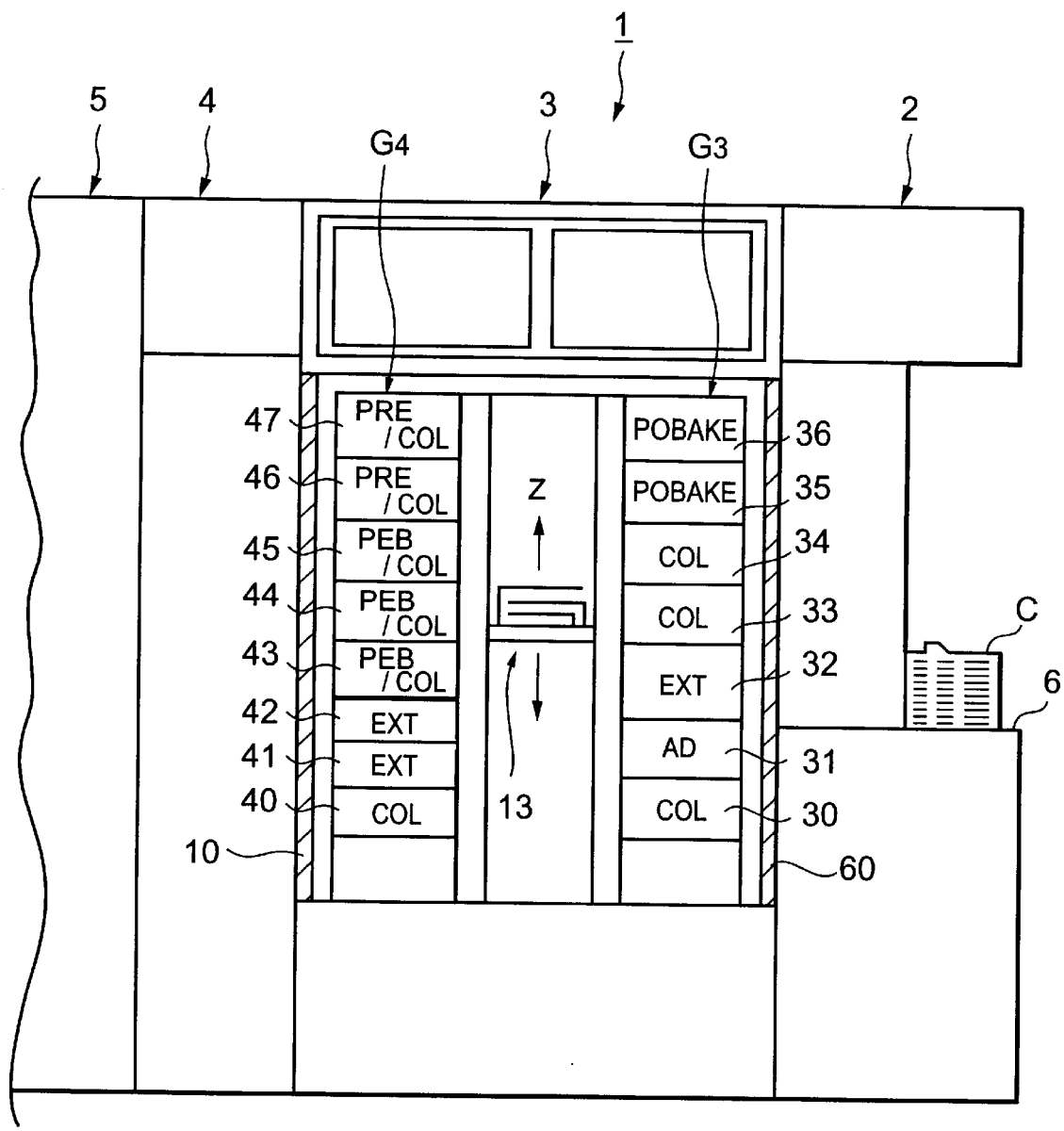
FIG. 3 is a rear view of the coating and developing processing system in FIG. 1.

FIG. 1 is a plane view of a coating and developing processing system (substrate processing apparatus) 1 according to this embodiment, FIG. 2 is a front view of the coating and developing processing system 1, and FIG. 3 is a rear view of the coating and developing processing system 1.

The coating and developing processing system 1, as shown in FIG. 1, has a structure in which a cassette station 2 as a loader/unloader section, for carrying, for example, 25 wafers W in a cassette into/out of the coating and developing processing system 1 from/to the outside and for carrying the wafer W into/out of a cassette C, a processing station 3 as a processing section, in which various processing units for performing predetermined processing for wafers W one by one in a process of a coating and developing processing are disposed in multiple tiers, and an interface section 4 which receives and sends the wafer W from/to an aligner 5 provided next to the coating and developing processing system 1 are integrally connected in its casing 1a.

In the cassette station 2, a plurality of cassettes C are freely mounted in an X-direction (in a top and bottom direction in FIG. 1) in a line at predetermined positions on a cassette mounting table 6 as a mounting section. Further, a wafer carrier 7 which can be transported in the direction of arrangement of the cassettes (the X-direction) and the direction of arrangement of the wafers W housed in the cassette C (a Z-direction; a vertical direction) is provided to be movable along a transfer path 8, and can selectively get access to the respective cassettes C.

The wafer carrier 7 has an alignment function of aligning the wafer W. This wafer carrier 7 is also structured to be able to get access to an extension unit 32 and an adhesion unit 31 which belong to a third processing unit group G3 of the processing station 3, as will be described later. Between the cassette station 2 and the processing station 3, a partition plate 10 for shutting off an atmosphere in the cassette station 2 from an atmosphere in the processing station 3 is provided. Further, a transit opening 11 is provided in the partition plate 10 at a position opposite to the aforesaid extension unit 32 and adhesion unit 31 which belong to the third processing unit group G3 so that the wafer W can be transferred between the cassette station 2 and the processing station 3 by the wafer carrier 7. Furthermore, a shutter 12 for freely opening/closing the transit opening 11 is provided in the transit opening 11, and the shutter 12 is opened only when the wafer W passes through the transit opening 11 and closed at all other times.

In the processing unit 3, a main transfer device 13 as a first transfer device is provided in its center portion, and around the main transfer device 13, various processing units are disposed in multiple tiers to compose processing unit groups. In this coating and developing processing system 1, four processing unit groups G1, G2, G3, and G4 are disposed, in which a first and second processing unit groups G1 and G2 are disposed on the front side of the coating and developing processing system 1, the third processing unit group G3 is disposed next to the cassette station 2, and a fourth processing unit group G4 is disposed next to the interface section 4. Further, a fifth processing unit group G5 shown by a broken line can be optionally disposed as an extra on the rear side. The main transfer device 13 can carry the wafer W into/out of various processing units which are disposed in the processing unit groups G1, G2, G3, and G4.

In the first processing unit group G1, for example as shown in FIG. 2, a resist coating unit 17 for coating the wafer W with a resist solution and a developing processing unit 18 for performing a developing processing for the wafer W after exposure processing are two-tiered from the bottom in order. Similarly in the second processing unit group G2, a resist coating unit 19 and a developing processing unit 20 are two-tiered from the bottom in order. Incidentally, in the resist coating unit 17 or 19 and the developing processing unit 18 or 20, an atmosphere controller not illustrated for maintaining a predetermined atmosphere in each unit is provided to maintain a clean atmosphere in each unit and to maintain a pressure inside each unit at a predetermined pressure.

In the third processing unit group G3, for example as shown in FIG. 3, a cooling unit 30 for cooling the wafer W, the adhesion unit 31 for enhancing adhesion properties of the resist solution and the wafer W, the extension unit 32 for making the wafer W wait, cooling units 33 and 34 for cooling the wafer W after the developing processing, post-baking units 35 and 36 for performing heating processing for the wafer W after the developing processing, and the like are, for example, seven-tiered from the bottom in order.

In the fourth processing unit group G4, for example, a cooling unit 40, extension units 41 and 42 for mounting the wafer W before and after the exposure processing and temporarily making the wafer W wait, heating/cooling processing units 43, 44, and 45 for heating the wafer W after the exposure processing and thereafter cooling it to a predetermined temperature (PEB/COL in FIG. 3), heating/cooling processing units 46 and 47 for heating the wafer W in order to vaporize a solvent in the resist solution and thereafter cooling it to a predetermined temperature (PRE/COL in FIG. 3) and the like are, for example, eight-tiered from the bottom in order.

Figure 4:
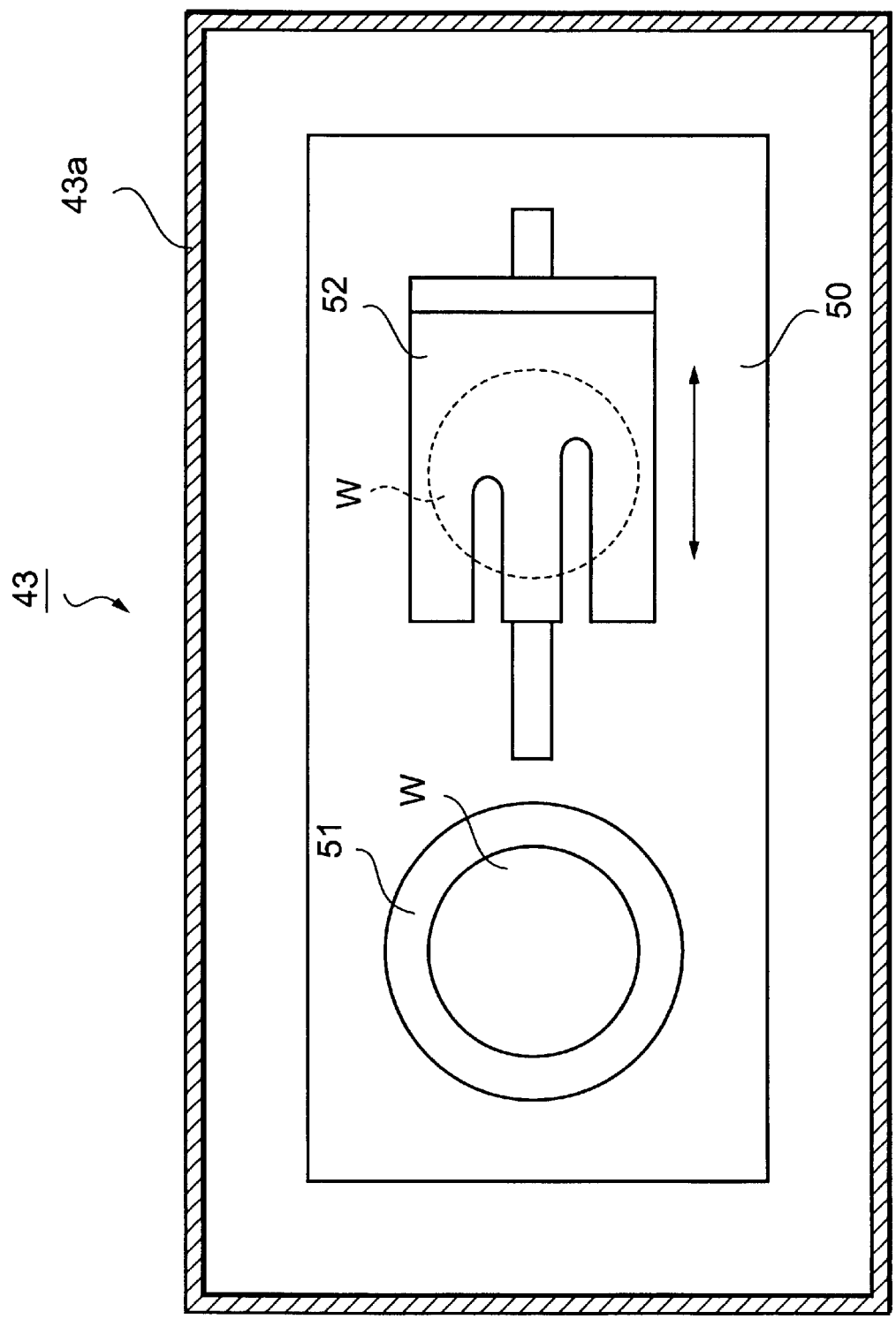
FIG. 4 is a horizontal sectional view showing an outline of a heating/cooling processing unit in the coating and developing processing system in FIG. 1.

The aforesaid heating/cooling processing unit 43 includes, as shown in FIG. 4, a disc-shaped hot plate 51 for heating the wafer W and a chill plate 52 which moves to a position above the hot plate 51 and receives the wafer W from above the hot plate 51 to cool it on a base table 50 inside its casing 43a. The wafer W continuously undergoes the heating/cooling processing in the same unit, to thereby keep a thermal budget which is given to the wafer W by heating constant. Incidentally, the structures of the other heating/cooling processing units 44 to 47 are the same as the heating/cooling processing unit 43.

A wafer carrier 55 as a second transfer device is provided in the center portion of the interface section 4. This wafer carrier 55 is structured to be movable in the X-direction (in the top and bottom direction in FIG. 1) and the Z-direction (the vertical direction), and to be rotatable in a θ-direction (a rotating direction around a Z-axis), and to be able to get access to the extension units 41, 42 which belong to the fourth processing unit group G4, a peripheral exposure unit 56 and the aligner 5, and to carry the wafer W to each of them.

Between the interface section 4 and the processing station 3, a partition plate 60 for shutting off an atmosphere inside the interface section 4 from an atmosphere inside the processing station 3 is provided. Further, a transit opening 61 is provided in the partition plate 60 at a position opposite to the extension units 41 and 42 which belong to the fourth processing unit group G4 so that the wafer W can be transferred between the processing station 3 and the interface section 4 by the aforesaid wafer carrier 55. Furthermore, a shutter 62 for freely opening and closing the transit opening 61 is provided in the transit opening 61, and the shatter 62 is opened only when the wafer W passes through the transit opening 61 and closed at all other times.

The aligner 5 for subjecting the wafer to the exposure processing is provided next to the interface section 4. The aligner 5 is sealed by a casing 5a of the aligner 5 and structured to be able to strictly control an atmosphere inside the aligner 5. Further, a transit opening 65 for carrying the wafer W into/out of the interface section 4 is provided on the interface section 4 side of the casing 5a, and a shutter 66 for freely opening and closing the transit opening 65 is provided in the transit opening 65.

Figure 5:
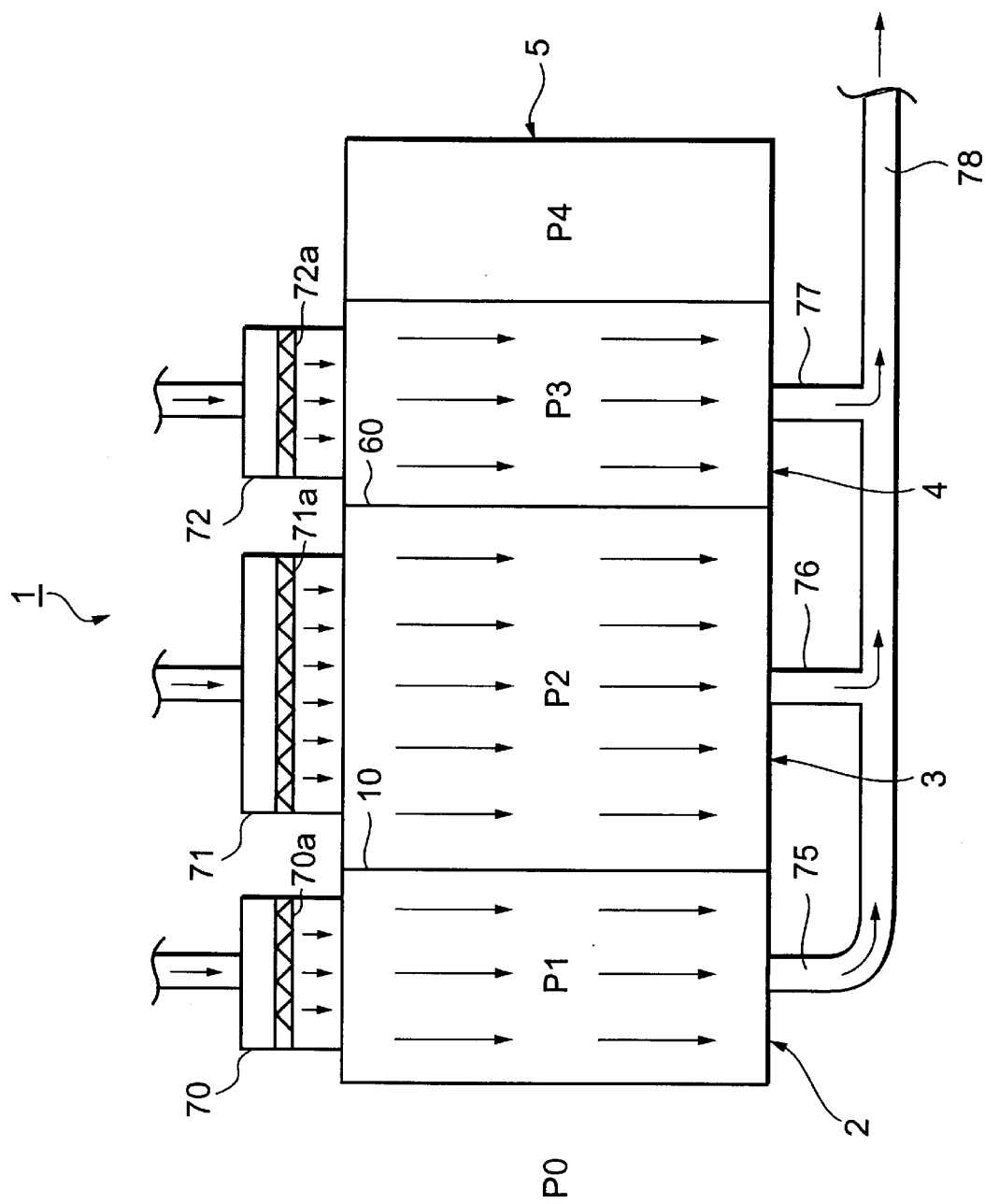
FIG. 5 is an explanatory view showing the flow of an inert gas supplied to the coating and developing processing system in FIG. 1.

On top of the aforesaid respective areas of the coating and developing processing system 1, that is, on top of the cassette station 2, the processing station 3, and the interface section 4, gas supply devices 70, 71, and 72 for supplying an inert gas are respectively provided as shown in FIG. 5, and it is possible to supply the inert gas individually from the gas supply device 70 into the cassette station 2, from the gas supply device 71 into the processing station 3, and from the gas supply device 72 into the interface section 4.

Filter devices 70a, 71a, and 72a are respectively provided in the gas supply devices 70, 71, and 72, and each of the filter devices 70a, 71a, and 72a includes a temperature/humidity regulating means for regulating the inert gas supplied from a supply source not illustrated or the like at a predetermined temperature and a predetermied humidity, a ULPA filter for removing fine particles in the inert gas, and a chemical filter for neutralizing alkaline components contained in the inert gas. Therefore, the inert gas which is cleaned and the temperature and humidity of which are regulated by each area can be supplied to the respective areas in the coating and developing processing system 1, that is, the cassette station 2, the processing station 3, and the interface section 4.

Meanwhile, at the bottom of the respective areas of the cassette station 2, the processing station 3, and the interface section 4, exhaust pipes 75, 76, and 77 as exhaust means are respectively provided, and the exhaust pipes 75, 76, and 77 are connected to a plant exhaust pipe 78 and are structured so that the atmosphere in each area is exhausted to the outside of the coating and developing processing system 1. Therefore, the inert gas supplied from the gas supply devices 70, 71, and 72 into the respective areas passes each area to be exhausted from the exhaust pipes 75, 76, and 77, and impurities such as oxygen, ozone, vapor, and so on in the respective areas are purged to keep the atmosphere clean in the respective areas. Further, the pressure in each area is controlled at a predetermined pressure by regulating the supply amount of the inert gas from the gas supply devices 70, 71, and 72 which correspond to the respective areas.

Next, a process of a photolithography which is operated in the coating and developing processing system 1 thus structured will be explained.

Before starting the processing of the wafer W, the inert gas which is regulated at predetermined temperature and humidity, for example, at 23° C. and 45%, and is rid of fine particles is supplied to each area in the coating and developing processing system 1, that is, the cassette station 2, the processing station 3, and the interface section 4 by the gas supply devices 70, 71, and 72. Then, the atmosphere in each area is replaced with a clean atmosphere not containing impurities such as fine particles and oxygen, and this state is maintained thereafter. Further, a pressure P1 in the cassette station 2, a pressure P2 in the processing station 3, a pressure P3 in the interface section 4, and a pressure P4 in the aligner 5 are set so that these have a relationship of P4>P3, P3>P2, P2>P1, thereby preventing the atmosphere inside the interface section 4 from flowing into the aligner 5, and the atmosphere inside the cassette station 2 and the interface section 4 from flowing into the processing station 3.

Moreover, as shown in FIG. 1, the pressure P2 in the processing station 3 is set to be lower than a pressure P5 in the resist coating units 17 and 19 and the developing processing units 18 and 20 which independently control the atmosphere therein as described above, thereby preventing the atmosphere in the processing station 3 from flowing into the unit such as the resist coating unit 17 and the like. Further, the pressures P1 to P5 are set to be higher than a pressure P0 inside a clean room in which the coating and developing processing system 1 is installed, so that the direct flow of an atmosphere inside the clean room which contains impurities, fine particles, and so on into the coating and developing processing system 1 is prevented.

Then, the processing of the wafer W is started, and in the cassette station 2 in which the atmosphere is kept clean, the wafer carrier 7 first removes one unprocessed wafer W from the cassette C and carries it through the transit opening 11 into the adhesion unit 31 of the processing station 3 in which the atmosphere is kept clean. At this time, the shutter 12 is temporarily opened, and when the wafer W is carried into the adhesion unit 31, the shutter 12 is closed again.

Then, the wafer W, coated with an adhesion reinforcing agent such as HMDS for enhancing an adhesion property with the resist solution in the adhesion unit 31, is carried into the cooling unit 30 by the main transfer device 13 to be cooled to a predetermined temperature. Thereafter, the wafer W is carried into the resist coating unit 17 or 19 to undergo resist coating processing. Then, the wafer W on which the resist film is formed is transferred to the heating/cooling processing unit 46 or 47 (PRE/COL in FIG. 3) to undergo heating/cooling processing. On this occasion, heating processing and cooling processing are not performed successively in the respective units provided individually, but the heating processing and the cooling processing are performed in the single unit such as the heating/cooling processing unit 46 or 47, so that the time required from the heating processing to the cooling processing for the wafer W can be kept constant at all times, which makes it possible to make the thermal budget which is given to the wafer W by the heating the same between the respective wafers W. Further, in this embodiment, all the heating/cooling processing from the resist coating processing to the developing processing is performed by using the heating/cooling processing units 43 to 47, whereby the time required from the resist coating to the developing processing can be made the same in all of the wafers W.

Subsequently, when the wafer W is carried into the extension unit 41 and the shutter 62 is opened, the wafer carrier 55 receives the wafer W from the extension unit 41 to carry it into the peripheral exposure unit 56 in the interface section 4 in which the atmosphere is kept clean. The shutter 62 is closed again when the carrying in/out of the wafer W is completed. After a peripheral portion of the wafer W is exposed in the peripheral exposure unit 56, the wafer W is carried into the aligner 5 through the transit opening 65. Here, after the shutter 66 is opened and the wafer W is carried into the aligner 5, the shutter 66 is closed again.

Next, the wafer W which has undergone exposure by being exposed according to a predetermined pattern in the aligner 5 passes through the interface section 4 to be carried into the extension unit 42 in the processing station 3 again by the wafer carrier 55. Then, the wafer W is carried into the heating/cooling processing unit 43, 44 or 45 by the main transfer device 13 to undergo heating/cooling processing after the exposure processing in due order.

Thereafter, the wafer W is transferred to the developing processing unit 18 or 20 to undergo developing processing. The wafer W after the developing processing is carried into the post-baking unit 35 or 36 to be heated, and subsequently, transferred to the cooling unit 33 or 34 to be cooled to a predetermined temperature. Then, it is carried into the extension unit 32 of the third processing unit group and returned to the cassette C in the cassette station 2 by the wafer carrier 7. The above process completes a successive photolithography process.

According to this embodiment described above, since the inert gas is supplied to each area of the cassette station 2, the processing station 3, and the interface section 4, the impurities such as oxygen and the fine particles in each area are reduced and removed, whereby the atmosphere in each area can be maintained clean. Therefore, the adhesion of the impurities such as oxygen and the fine particles to the wafer W during the processing is suppressed, so that the transfer of the wafer W and each processing can be preferably performed in the coating and developing processing system 1. Especially in the aligner 5, an influence due to the impurities such as oxygen is significant, and the removal of the impurities such as oxygen inside the interface section 4 can suppress the adhesion of the impurities to the wafer which is immediately before being carried into the aligner 5, which contributes to the yield of the wafer W to a great extent. Further, as a wavelength of a laser beam used in the aligner 5 is shorter, the influence due to the impurities becomes more significant, and hence the laser beam with a shorter wavelength, for example, 157 nm is more effectively used.

Moreover, the pressure P4 in the aligner 5 is set to be higher than the pressure P3 in the interface section 4, and the pressure P3 in the interface section 4 and the pressure P1 in the cassette station 2 are set to be lower than the pressure P2 in the processing station 3, thereby suppressing the flow of the atmosphere in the interface section 4 into the aligner 5, and the flows of the atmospheres in the interface section 4 and the cassette station 2 into the processing station 3. Therefore, predetermined atmospheres are maintained in the aligner 5 and the processing station 3.

Further, the pressure P2 in the processing station 3 is set to be lower than the pressure P5 in the resist coating units 17 and 19 and the developing processing units 18 and 20 in the processing station 3, thereby preventing the inert gas in the processing station 3 from flowing into the resist coating unit 17 and the like, which makes it possible to perform the resist coating processing and the developing processing for the wafer W in the predetermined atmosphere.

Furthermore, the pressures P1 to P5 in the respective areas are set to be higher than the pressure P0 in the clean room and therefore, it is prevented that the atmosphere in the clean room which includes impurities and fine particles in comparatively large quantities directly flows into the coating and developing processing system 1 to contaminate the interior of the coating and developing processing system 1.

Moreover, the partition plate 10 is provided between the cassette station 2 and the processing station 3, the partition plate 60 is provided between the processing station 3 and the interface section 4, and the shutters 12 and 62 are respectively provided in the partition plates 10 and 60, whereby the mutual interference of atmospheres in the respective areas is further suppressed, and the wafer W can be processed in the predetermined atmosphere by each area.

The aforesaid inert gas is supplied to each area after the temperature and the humidity thereof are regulated at predetermined temperature and humidity, whereby the temperature and the humidity in each area are maintained at the predetermined temperature and humidity, and the wafer W can be processed in the same condition at all times.

Figure 6:
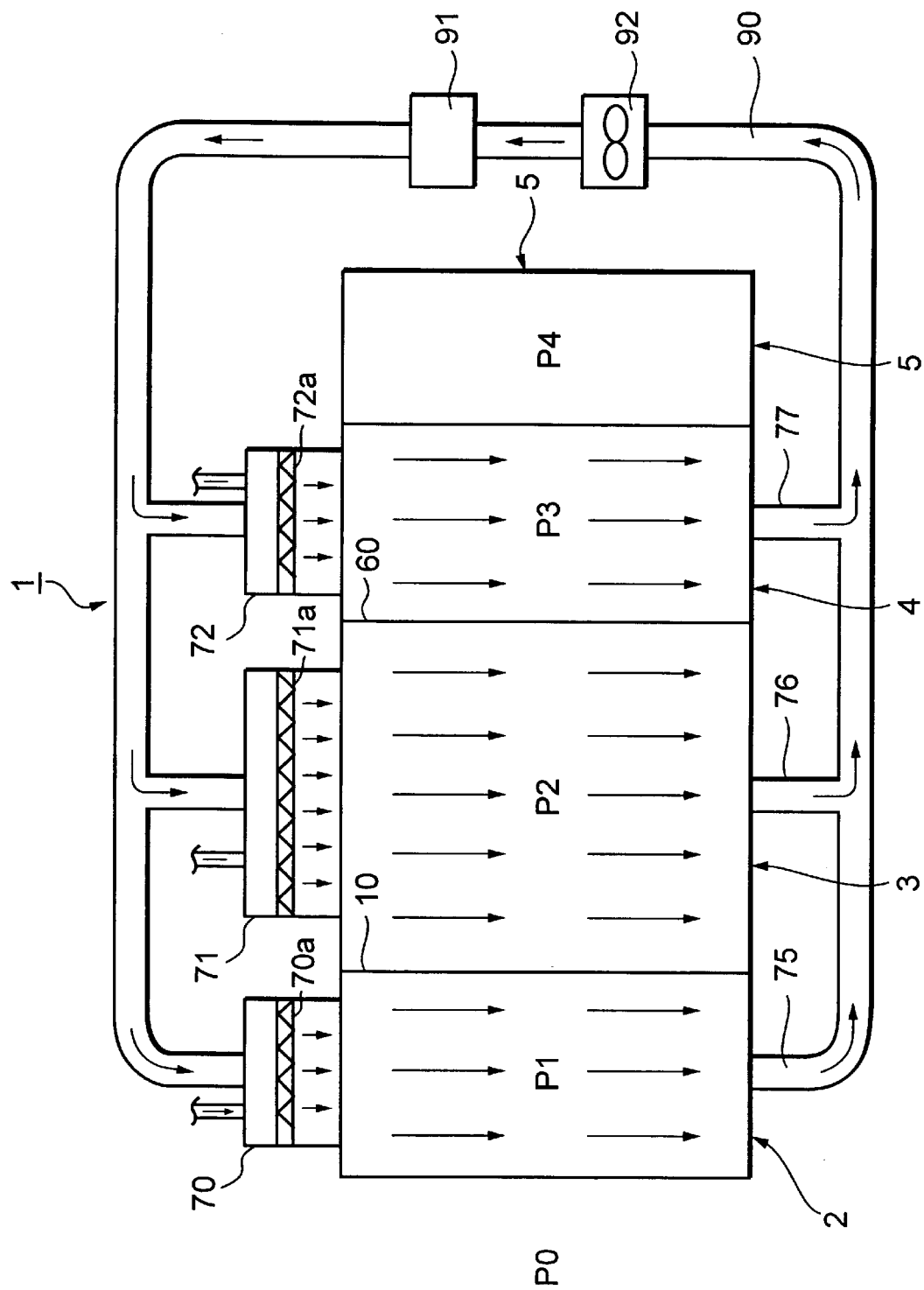
FIG. 6 is an explanatory view showing the flow of the inert gas when an atmosphere inside the coating and developing processing system is reused as the inert gas.

According to this embodiment described above, the atmosphere in each area exhausted from each of the exhaust pipes 75, 76, and 77 is exhausted as it is to the outside of the coating and developing processing system 1, but this atmosphere can be used again as the inert gas supplied from the gas supply devices 70, 71, and 72. In such a case, for example as shown in FIG. 6, a main exhaust pipe 90 which leads to the respective exhaust pipes 75, 76, and 77 is provided, and this main exhaust pipe 90 is made to lead to the aforesaid gas supply devices 70, 71 and 72. Further, in the main exhaust pipe 90, a filter 91 such as an ozone filter, a silica gel filter, a deoxidant filter, or the like and a fan 92 are provided. Based on the above structure, the atmosphere which is exhausted from each area is cleaned and supplied to the respective gas supply devices 70, 71, and 72 to be reused as the inert gas. The filter 91 has a function of removing impurities such as oxygen, and can remove the impurities in the atmosphere which run through the respective areas. Incidentally, instead of the filter 91, a device which can remove oxygen, ozone, moisture, and so on may be provided to clean the aforesaid atmosphere.

Thus, by reusing the atmosphere exhausted from each of the exhaust pipes 75, 76, 77 as the inert gas, the amount of the inert gas to be newly supplied and energy required for regulating the temperature can be reduced.

In the embodiment described above, the inert gas is supplied to all of the areas of the cassette station 2, the processing station 3, and the interface section 4, but it can be supplied only to the interface section 4. The aforesaid supply of the inert gas to the interface section 4 and removal of the impurities from the interface section 4 can suppress the adhesion of the impurities to the wafer W immediately before and after the exposure processing in which the impurities exert the most significant influence thereon.

Further, the inert gas may be supplied only to the interface section 4 and the processing station 3. Thus, by supplying the inert gas to the processing station 3 in addition to the interface section 4 as described above, a clean atmosphere is maintained in the processing station 3 in which the majority of processing of the coating and developing processing is performed, and the wafer W can be processed in the clean atmosphere.

Incidentally, the above explained embodiment is about the coating and developing processing system of the wafer W in the process of photolithography in a fabricating process of a semiconductor wafer device, but the present invention is also applicable to a coating and developing processing system of substrates other than a semiconductor wafer, such as an LCD substrate.

According to the present invention, the inert gas is supplied into the coating and developing processing system to suppress the adhesion of impurities at molecular level such as oxygen, ozone, organic substances, and the like to the substrate, whereby the substrate is suitably processed without being influenced by the impurities, which makes it possible to enhance yield.

In particular, by removing the impurities in the interface section, the substrate which is not contaminated by the impurities is carried into the aligner, and the exposure processing of the substrate can be suitably operated.

(Second embodiment)

Figure 7:
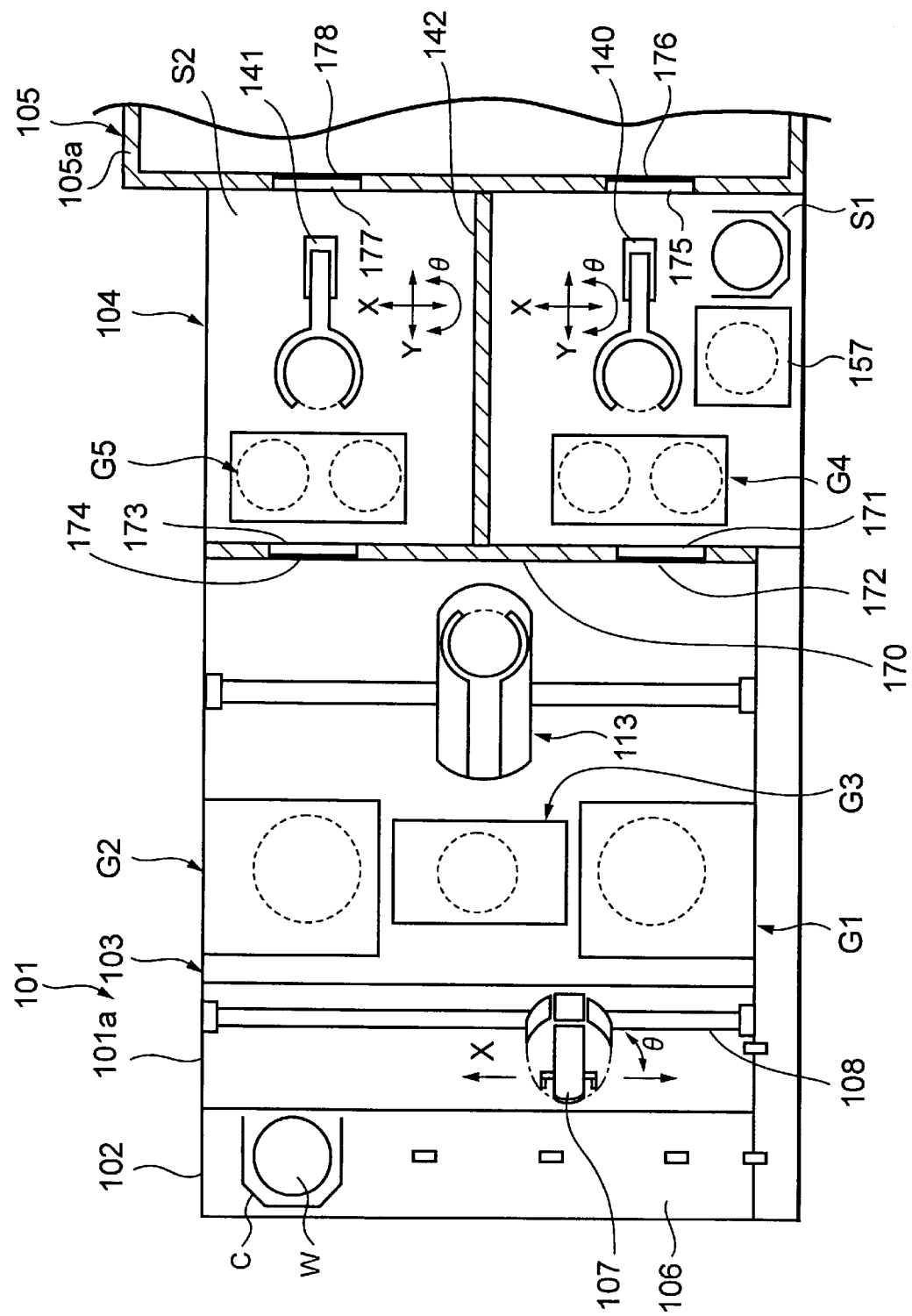
FIG. 7 is a plan view showing the external appearance of a coating and developing processing system according to a second embodiment of the present invention.
Figure 8:
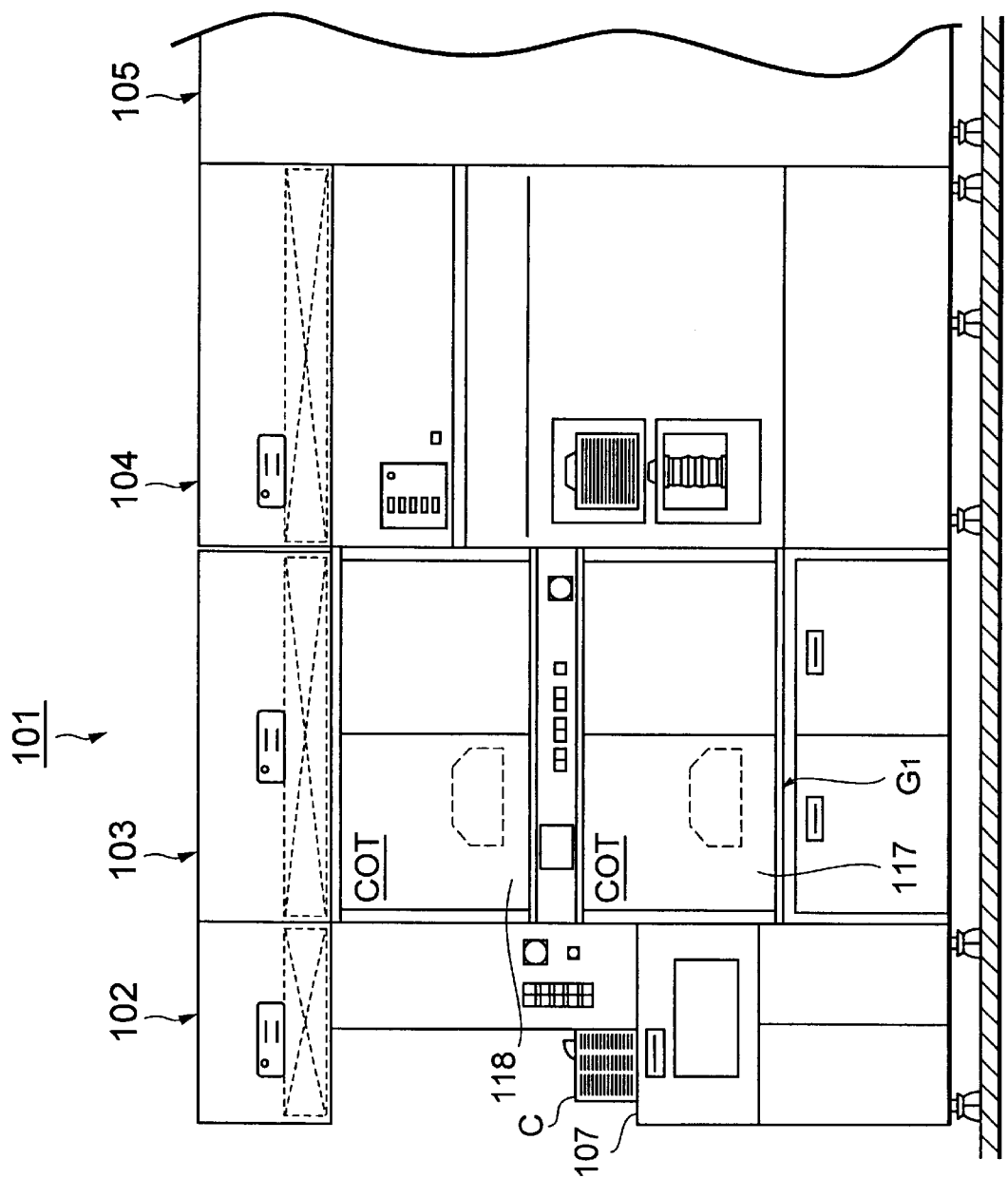
FIG. 8 is a front view of the coating and developing processing system in FIG. 7.

FIG. 7 is a plane view of a coating and developing processing system 101 according to the second embodiment, and FIG. 8 is a front view of the coating and developing processing system 101.

The coating and developing processing system 101, as shown in FIG. 7, has a structure in which a cassette station 102 for carrying, for example, 25 wafers W in a cassette into/out of the coating and developing processing system 101 from/to the outside and carrying the wafer W into/out of a cassette C, a processing station 103 as a processing section, in which various processing units are disposed in multiple tiers for performing predetermined processing for the wafers W one by one in a process of the coating and developing processing, and an interface section 104 for receiveing and sending the wafer W from/to an aligner 105 provided next to the coating and developing processing system 101 are integrally connected in its casing 101a.

In the cassette station 102, a plurality of cassettes C are freely mounted in the X-direction (in a top and bottom direction in FIG. 7) in a line at predetermined positions on a cassette mounting table 106 as a mounting section. Further, a wafer carrier 107 which can be transported in the direction of arrangement of the cassettes (the X-direction) and the direction of arrangement of wafers W housed in the cassette C (the Z-direction; a vertical direction) is provided to be movable along a transfer path 108, and can get access selectively to the respective cassettes C.

The wafer carrier 107 has an alignment function of performing alignment of the wafer W. This wafer carrier 107 is also structured to be able to get access to an extension unit 132 and an adhesion unit 131 which belong to a third processing unit group G3 of the processing station 103, as will be described later.

In the processing station 103, a main transfer device 113 as a substrate transfer device is provided on the interface section 104 side, and on the cassette station 102 side, three processing unit groups G1, G2, and G3 are disposed. In each of the processing unit groups G1, G2, and G3, various processing units are disposed in multiple tiers. A first processing unit group G1 is disposed on the front side of the coating and developing processing system 101, and a second processing unit group G2 is disposed on the rear side of the coating and developing processing system 101, with a third processing unit group G3 therebetween. The main transfer device 113 can carry the wafer W into/out of various processing units which are disposed in the processing unit groups G1, G2, and G3 and will be described later, and can also carry the wafer W into/out of processing unit groups G4, G5 which are disposed in the interface section and will be described later.

Figure 9:
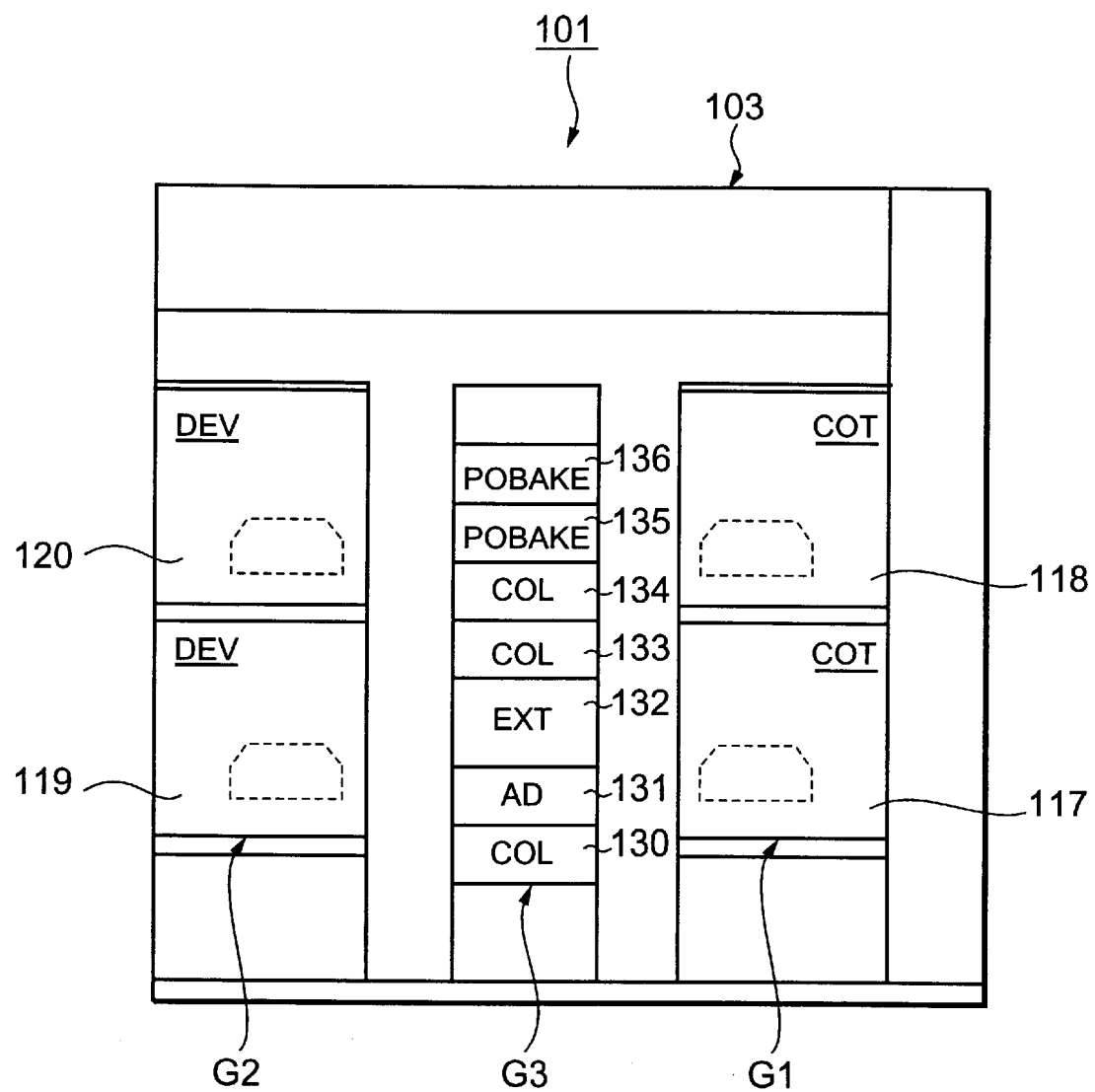
FIG. 9 is an explanatory view of a vertical section of a processing station.

In the first processing unit group G1, for example as shown in FIG. 8 and FIG. 9, resist coating units 117 and 118 for coating the wafer W with a resist solution are two-tiered from the bottom in order. In the second processing unit group G2, developing processing units 119 and 120 for performing developing processing for the wafer W after exposure processing are two-tiered from the bottom in order. In the third processing unit group G3, a cooling unit 130 for performing a cooling processing for the wafer W, the adhesion unit 131 for enhancing adhesion properties of the resist solution and the wafer W, the extension unit 132 for making the wafer W wait, cooling units 133 and 134 for cooling the wafer W after the developing processing, post-baking units 135 and 136 for performing heating processing for the wafer W after the developing processing and the like are, for example, seven-tiered from the bottom in order.

The interface section 104 includes an area S1 before exposure in which the fourth processing unit group G4 having a first thermal processing unit and a first wafer carrier 140 as a first transfer device are disposed, and an area S2 after exposure in which the fifth processing unit group G5 having a second thermal processing unit and a second wafer carrier 141 as a second transfer device are disposed. Further, an atmosphere in the area S1 before exposure and an atmosphere in the area S2 after exposure are shut off by a partition plate 142 so that the atmospheres in the area S1 before exposure and the area S2 after exposure are made to be different from each other.

In the fourth processing unit group G4, for example, a cooling unit 150, extension units 151 and 152 for mounting the wafer W before exposure processing and temporarily making it wait, heating/cooling processing units 153, 154, 155, and 156 (PREBAKE/COL in FIG. 9) for heating the wafer W before exposure processing in order to vaporize a solvent in the resist solution and thereafter cooling it to a predetermined temperature, and the like are, for example, seven-tiered from the bottom in order.

Figure 11:
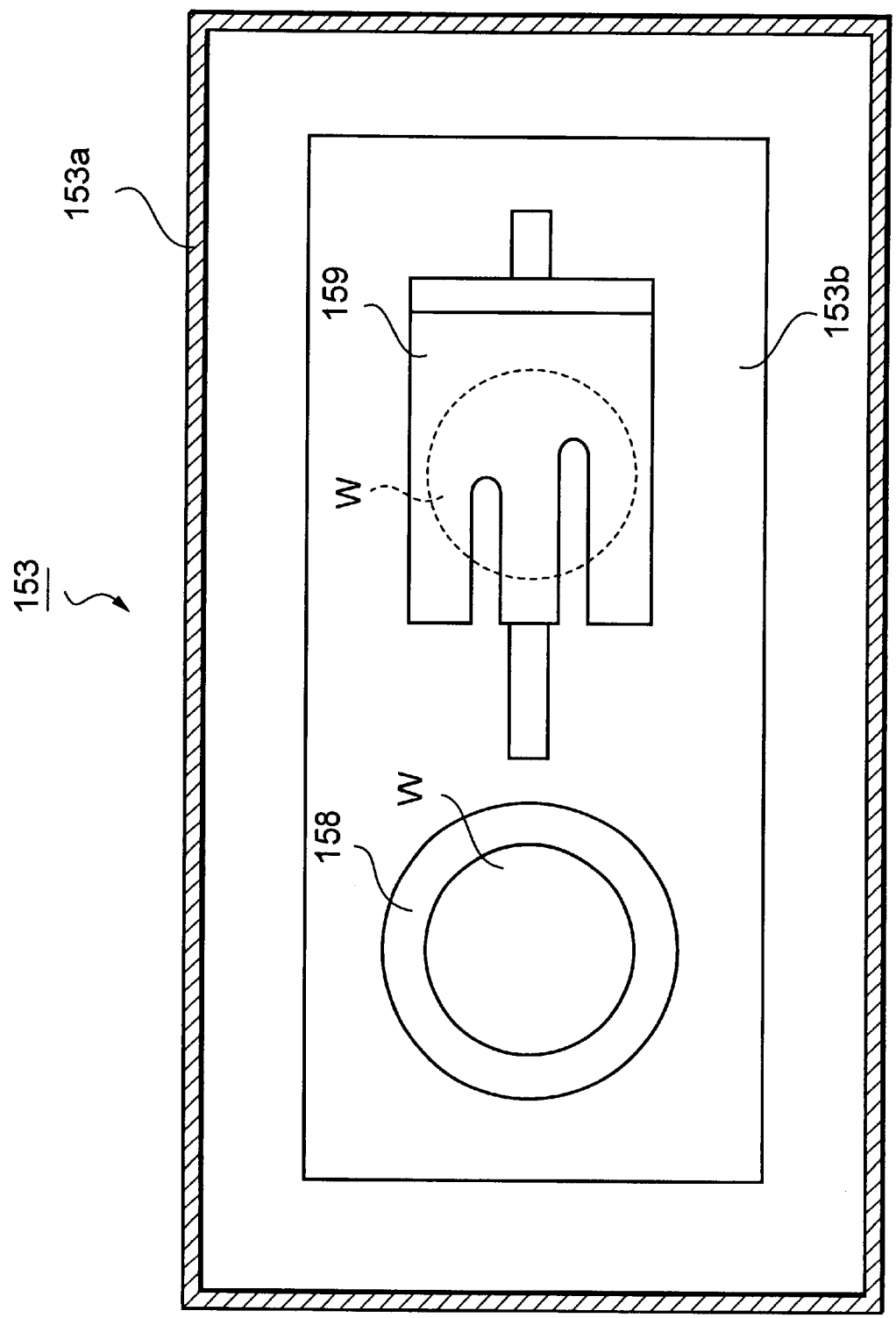
FIG. 11 is a horizontal sectional view showing an outline of a heating/cooling processing unit in the coating and developing processing system in FIG. 7.
Figure 12:
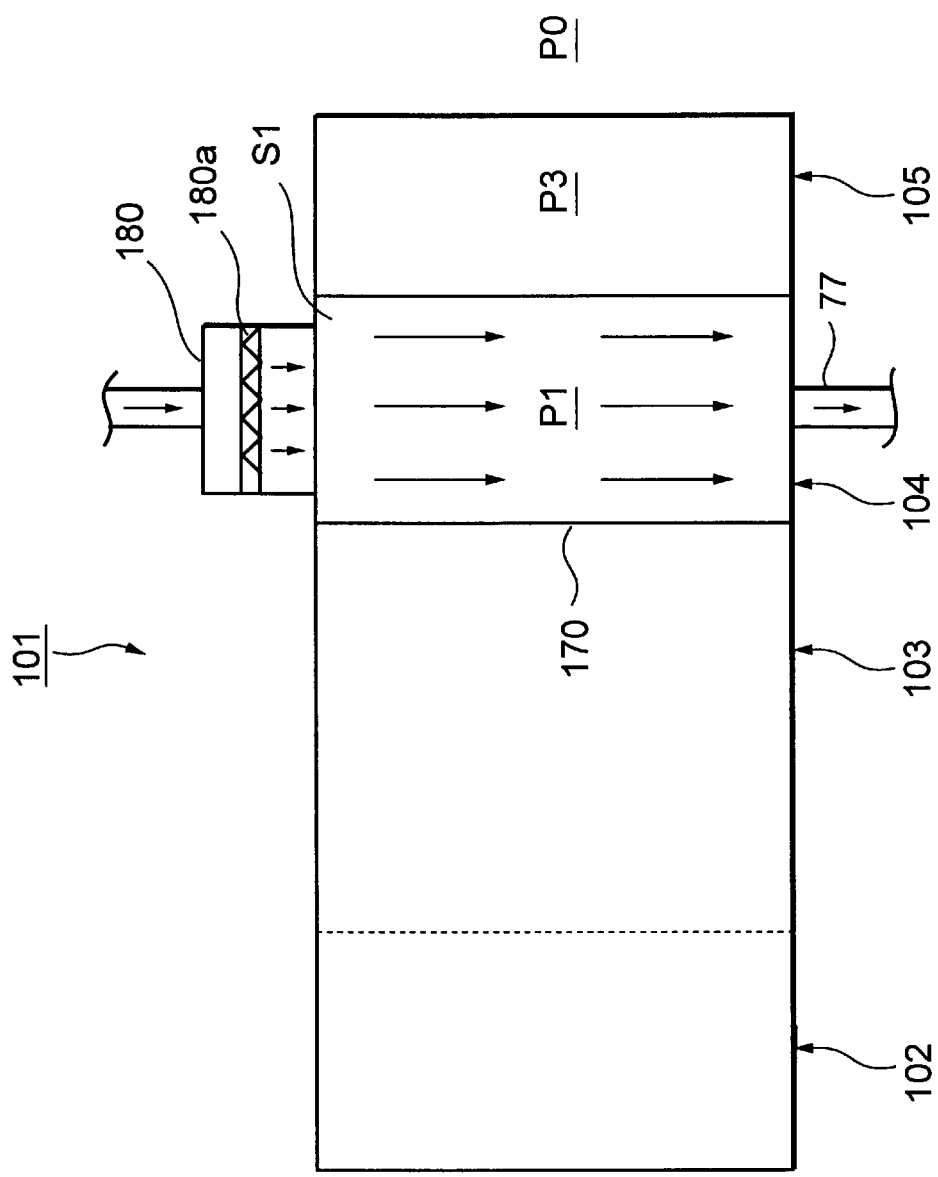
FIG. 12 is an explanatory view of a case in which the flow of an inert gas supplied to the interface section is seen from the side of the coating and developing processing system.
Figure 13:
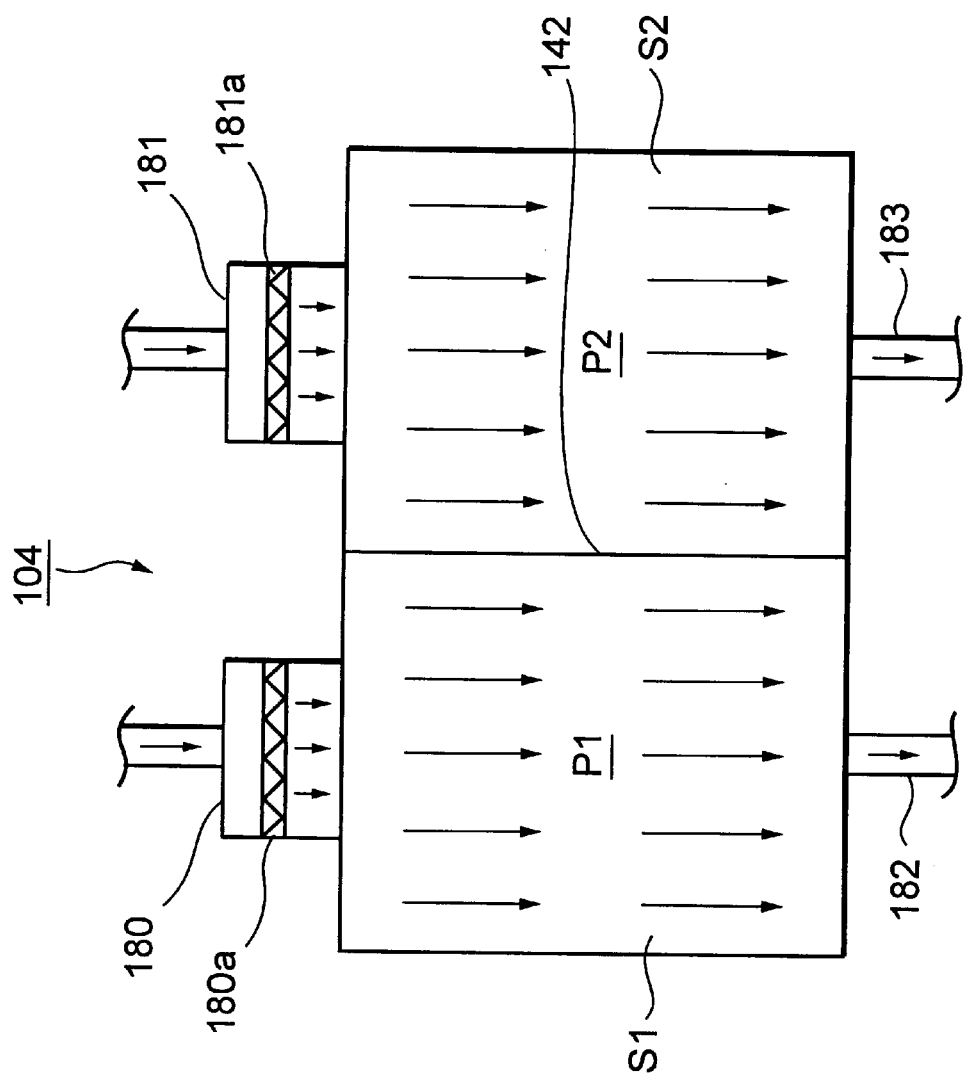
FIG. 13 is an explanatory view of a vertical section showing the flow of the inert gas supplied to the interface section.

The aforesaid heating/cooling processing unit 153 includes, as shown in FIG. 11, a disc-shaped hot plate 158 for heating the wafer W and a chill plate 159 which moves to a position above the hot plate 158 and receives the wafer W from above the hot plate 158 to cool it on a base table 153b inside its casing 153a. The wafer W undergoes heating/cooling processing in the same unit continuously, to thereby keep a thermal budget which is given to the wafer W by the heating constant. Incidentally, the structures of the other heating/cooling processing units 154 to 156 are the same.

The first wafer carrier 140 is structured to be movable in the X- and the Y-direction (in the top and bottom direction and a right and left direction in FIG. 7) and the Z-direction (the vertical direction), and to be rotatable in the θ-direction (a rotating direction around a Z-axis), and to be able to get access to the various processing units which belong to the fourth processing unit group G4, a peripheral exposure unit 157 and the aligner 105, and to carry the wafer W to each of them.

In the fifth processing unit group G5, for example, a cooling unit 160, extension units 161 and 162 for mounting the wafer W after exposure processing and temporarily making it wait, heating/cooling processing units 163, 164, 165, and 166 (PEB/COL in FIG. 3) for heating the wafer W after the exposure processing and thereafter cooling it to a predetermined temperature, and the like are, for example, seven-tiered from the bottom in order.

The heating/cooling processing units 163 to 166 have the same structures with that of the aforesaid heating/cooling processing unit 153. The second wafer carrier 141 is structured similarly to the aforesaid first wafer carrier 140, which is structured to be able to get access to the various processing units which belong to the fifth processing unit group G5 and the aligner 105, and to carry the wafer W to each of them.

Between the processing station 103 and the interface section 104, a partition plate 170 is provided. By this partition plate 170, an atmosphere of the processing station 103 and an atmosphere of the interface section 104 are shut off from each other. Further, a first transit opening 171 is provided in the partition plate 170 at a position opposite to the extension units 151 and 152 which belong to the fourth processing unit group G4 so that the main transfer device 113 gets access to the extension units 151 and 152 to carry the wafer W into the area S1 before exposure from the processing station 103. Furthermore, a first shutter 172 for freely opening and closing the first transit opening 171 is provided in the first transit opening 171, and the first shatter 172 is opened only when the wafer W passes through the first transit opening 171 and closed at all other times.

A second transit opening 173 is provided in the partition plate 170 at a position opposite to the extension units 161 and 162 which belong to the fifth processing unit group G5 so that the main transfer device 113 gets access to the extension units 161 and 162 to carry the wafer W into the processing station 103 from the area S2 after exposure. Furthermore, a second shutter 174 for freely opening and closing the second transit opening 173 is provided in the second transit opening 173, and the second shatter 174 is opened only when the wafer W passes through the second transit opening 173 and closed at all other times.

The aligner 105 for subjecting the wafer W to exposure processing is provided next to the interface section 104. The aligner 105 is sealed by a casing 105a of the aligner 105, and is structured to be able to strictly control an atmosphere in the aligner 105. Further, a transit opening 175 for carrying the wafer W from the interface section 104 into the aligner 105 is provided on the area S1 before exposure side of the interface section 104 of the casing 105a, and a shutter 176 for freely opening and closing the transit opening 175 is provided in the transit opening 175. Furthermore, a transit opening 177 for carrying the wafer W from the aligner 105 into the interface section 104 is provided on the area S2 after exposure side of the interface section 104 of the casing 105a, and a shutter 178 for freely opening and closing the transit opening 177 is provided in the transit opening 177.

A first gas supply device 180 and a second gas supply device 181 are respectively provided above the area S1 before exposure of the interface section 104 and above the area S2 after the exposure thereof, so that the inert gas can be individually supplied from the first gas supply device 180 to the area S1 before exposure and from the second gas supply device 181 to the area S2 after exposure.

The gas supply devices 180 and 181 each include a function of regulating the inert gas supplied from a supply source not illustrated or the like to predetermined temperature and humidity, and ULPA filters 180a and 181a for removing fine particles in the inert gas, so that the inert gas which is cleaned and the temperature and humidity of which are regulated by each area can be supplied to the area S1 before exposure and the area S2 after exposure of the interface section 104. Particularly, the second gas supply device 181 is set to supply the inert gas with a temperature lower than the temperature of the inert gas supplied from the gas supply device 180 before exposure, and hence there is a temperature difference between the atmospheres in the area S1 before exposure and the area S2 after exposure.

A first exhaust pipe 182 and a second exhaust pipe 183 are respectively provided underneath the area S1 before exposure and underneath the area S2 after exposure, and each of them is structured to be able to exhaust the atmosphere in each area. Therefore, the inert gas which is supplied from the respective gas supply devices 180 and 181 into the respective areas passes each area to be exhausted from the respective exhaust pipes 182 and 183, and impurities such as oxygen, basic substrates, vapor, and so on in the respective areas are removed to be able to keep the atmospheres in the respective areas clean. Further, the pressure in the area S1 before exposure is controlled by regulating the supply amount of the inert gas from the first gas supply device 180, and the pressure in the area S2 after exposure is controlled by regulating the supply amount of the inert gas from the second gas supply device 181 at predetermined pressures, respectively.

Next, a process of photolithography which is performed in the coating and developing processing system 101 structured above will be explained.

Before starting the processing of the wafer W, the inert gas which is regulated at predetermined temperature and humidity, for example, at 23° C. and 45% and is rid of fine particles is supplied into the area S1 before exposure of the interface section 104 by the first gas supply device 180. Further, the inert gas which is regulated at, for example, 15° C. and 50% and is rid of fine particles is supplied into the area S2 after exposure of the interface section 104 by the second gas supply device 181. Then, an atmosphere in each area is replaced with a clean atmosphere not containing impurities such as fine particles, oxygen, basic substrates and so on, and the temperature inside the area S2 after exposure is made lower than that of the area S1 before exposure, and this state is maintained thereafter. Here, a pressure P1 in the area S1 before exposure, a pressure P2 in the area S2 after exposure, and a pressure P3 in the aligner 105 are set so that these have a relationship of P3>P1=P2, thereby preventing the atmosphere inside the interface section 104 from flowing into the aligner 105. Further, a pressure P0 in a clean room in which the coating and developing processing system 101 is disposed is set to be lower than the pressure P1 in the area S1 before exposure, the pressure P2 in the area S2 after exposure, the pressure P3 in the aligner 105, a pressure inside the cassette station 102, and a pressure inside the processing station 103, thereby preventing the atmosphere in the clean room which contains impurities and fine particles from flowing into the coating and developing processing system 101 directly.

Then, the processing of the wafer W is started, and in the cassette station 102, the wafer carrier 7 first removes one unprocessed wafer W from the cassette C and carries it into the adhesion unit 131 of the processing station 103.

The wafer W, coated with an adhesion reinforcing agent such as HMDS for enhancing an adhesion property with the resist solution in the adhesion unit 131, is carried into the cooling unit 130 by the main transfer device 113 to be cooled to a predetermined temperature. Thereafter, the wafer W is carried into the resist coating unit 117 or 118 to undergo a resist coating processing. Then, the wafer W on which the resist film is formed is carried into the extension unit 151 or 152 by the main transfer device 113. At this time, the first shutter 172 is temporarily opened to carry the wafer W into the extension unit 151 or 152, and the first shutter 172 is closed again.

Figure 10:
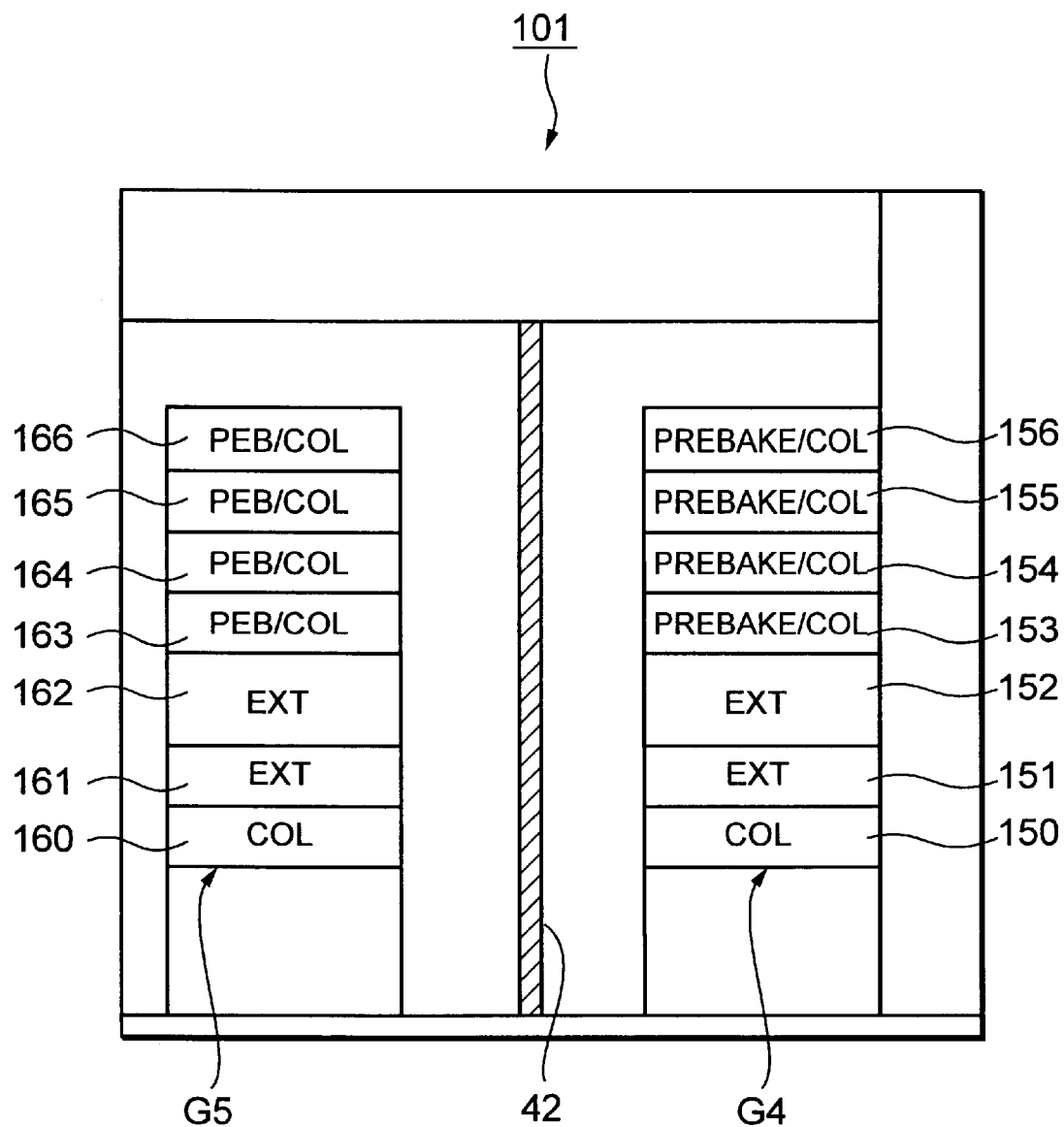
FIG. 10 is an explanatory view of a vertical section of an interface section.

In the area S1 before exposure in which the atmosphere is kept clean, the wafer W is carried from the extension unit 151 or 152 into the heating/cooling processing unit 153, 154, 155, or 156 (PREBAKE/COL in FIG. 10). In the heating/cooling processing unit 153, 154, 155, or 156, the heating and the cooling processing is performed. Here, heating processing and cooling processing are not performed in the respective units provided individually, but the heating processing and the cooling processing are performed in the single unit such as the heating/cooling processing unit 153 or the like so that the time required from the heating processing to the cooling processing for the wafer W can be kept constant at all times, which makes it possible to make the thermal budget which is given to the wafer W by heating the same between the respective wafers W.

Subsequently, the wafer W is carried from the heating/cooling processing unit 153, 154, 155, or 156 into the peripheral exposure unit 157 by the first wafer carrier 140. After a peripheral portion of the wafer W is exposed in the peripheral exposure unit 157, the wafer W is transferred to the aligner 105 through the transit opening 175. On this occasion, the shutter 176 is opened and when the wafer W is carried into the aligner 105, the shutter 176 is closed again.

Figure 14:
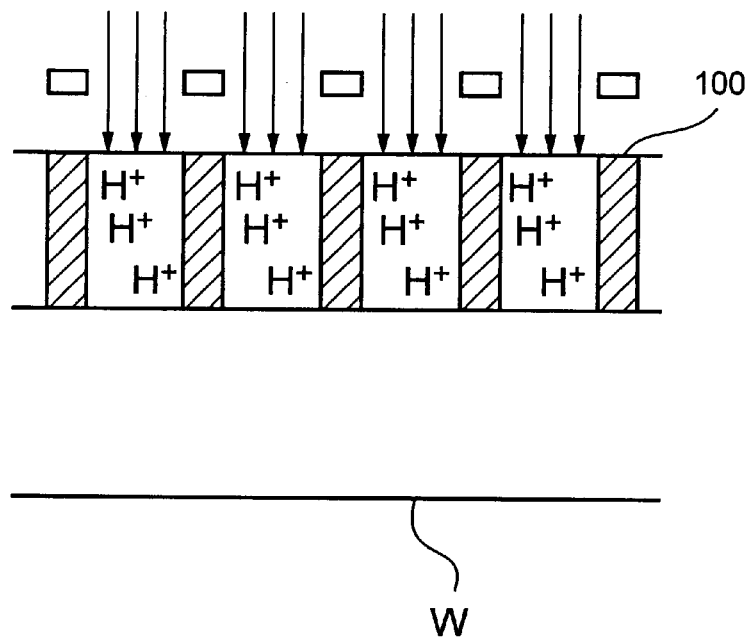
FIG. 14 is an explanatory view showing the state of a resist film in which a circuit pattern is exposed.

Next, in the aligner 105, a resist film on the wafer W is exposed according to a predetermined pattern. A chemically amplified resist is used for the resist film, and the chemically amplified resist contains a basic polymer which is insoluble in an alkaline developing solution used in the following developing processing and an acid generator. As shown in FIG. 14, in an exposed portion of a resist film 100, an acid (H+) is generated to cause a catalytic reaction. The wafer W after the exposure is carried out of the aligner 105 through the transit opening 177 by the second wafer carrier 141. At this time, the shutter 178 is opened and when the wafer W is carried out of the aligner 105, the shutter 178 is closed again.

In the area S2 after exposure in which the temperature is maintained low and the atmosphere is maintained clean, the wafer W is carried into the heating/cooling processing unit 163, 164, 165 or 166 (PEB/COL in FIG. 10) to undergo heating and cooling processing after the exposure processing in due order. In PEB which is heating after the exposure processing, the acid is thermally diffused to stimulate the catalytic reaction in the exposed portion and a protective group for protecting a hydroxyl group of the basic polymer is cleaved. Thereby, the exposed portion becomes soluble in the alkaline developing solution, and an unexposed portion remains insoluble in the alkaline developing solution. Here, a typical reaction model of the chemically amplified resist when, for example, its basic polymer is a polyvinyl phenol is shown as in the following.

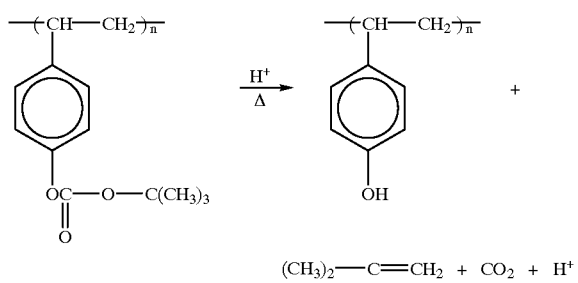

Subsequently, the wafer W is carried from the heating/cooling processing unit 163, 164, 165, or 166 into the extension unit 161 or 162 by the second wafer carrier 141. Thereafter, the wafer W is carried out of the extension unit 161 or 162 by the main transfer device 113. On this occasion, the second shutter 174 is opened and the wafer W is carried out of the aligner 105, and then the second shutter 174 is closed again.

Figure 15:
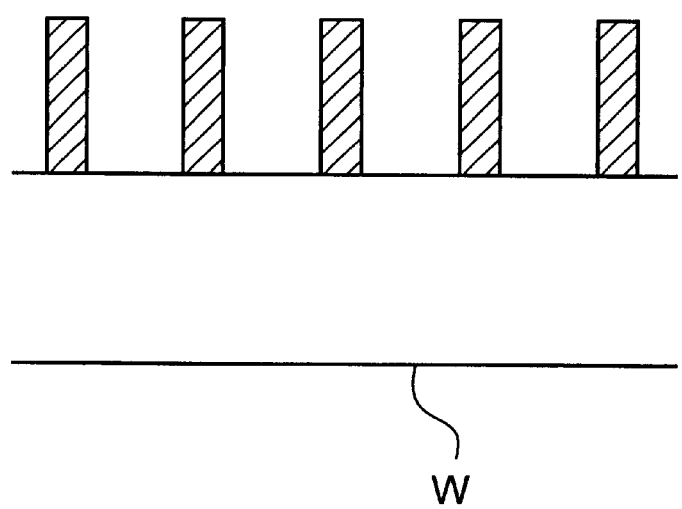
FIG. 15 is an explanatory view showing the state of the resist film after developing.

Thereafter, the wafer W is transferred to the developing processing unit 119 or 120 to undergo developing processing and, as shown in FIG. 15, the exposed portion is removed to form a predetermined circuit pattern. The wafer W after the developing processing is transferred to the post-baking unit 135 or 136 to be heated, and subsequently, transferred to the cooling unit 133 or 134 to be cooled to a predetermined temperature. Then, the wafer W is carried into the extension unit 132 of the third processing unit group and returned to the cassette C in the cassette station 102 by the wafer carrier 107. The above process completes a successive photolithography process.

According to the embodiment described above, the inert gas is supplied to the area S1 before exposure by the first gas supply device 180, and the atmosphere in the area S1 before exposure is exhausted by the first exhaust means 182, whereby the impurities such as oxygen, vapor, and the like in the area S1 before exposure are removed and the area S1 before exposure can be maintained in a clean condition. Therefore, from the heating processing (PREBAKE) immediately before the exposure processing until the exposure processing, the wafer W can be transferred in the clean atmosphere, thereby preventing the impurities from adhering thereto.

Especially, after the heating processing of the wafer W on which the resist film is formed, the impurities are likely to adhere onto the wafer W, and if the impurities adhere to the wafer W in the exposure processing, there arises the possibility that the exposure processing is not preferably performed because the impurities absorb energy of a laser beam or the like which is used in the exposure. However, by keeping the area S1 before exposure of the interface section 104 through which the wafer W passes immediately before the exposure processing in a clean condition as described above, the exposure processing of the wafer W can be suitably performed, which contributes to the yield of the wafer W to a great extent. Further, as the wavelength of the laser beam used in the aligner 105 is shorter, an influence due to the impurities becomes more significant, and hence the laser beam with the shorter wavelength, for example, 157 nm is more effectively used.

Moreover, the inert gas is supplied to the area S2 after exposure by the second gas supply device 181, and the atmosphere in the area S2 after exposure is exhausted by the second exhaust pipe 183 so that the atmosphere in the area S2 after exposure can be maintained in a clean condition, similarly to the area S1 before exposure.

Especially, when the chemically amplified resist for forming the circuit pattern by the catalytic reaction of the acid is used on the wafer W, the acid is deactivated if the impurities (such as basic substrates) adhere to the wafer W after exposure processing. However, by keeping the area S2 after exposure of the interface section 104 through which the wafer W passes immediately after the exposure processing in a clean condition as described above, the deactivation of the acid can be prevented and the following developing processing can be preferably performed.

Moreover, the inert gas is supplied to the respective areas by the individual gas supply devices and the area S1 before exposure and the area S2 after exposure are shut off from each other by the partition plate 142, so that the mutual interference of the atmospheres in the respective areas can be prevented, and atmospheres peculiar to the respective areas can be maintained in the area S1 before exposure and the area S2 after exposure. Therefore, the atmospheres in the wafer route before exposure and the wafer route after exposure in the interface section can be controlled individually.

Especially, the second gas supply device 181 supplies the inert gas the temperature of which is lower than an ordinary temperature, and hence the area S2 after exposure can be maintained in a low-temperature condition. When the aforesaid chemically amplified resist has such a property that the protective group thereof for protecting the hydroxyl group of the basic polymer initiates an elimination reaction even at the ordinary temperature, the elimination reaction of the protective group progresses on the wafer W during the transfer of the wafer W in the area S2 after exposure when the temperature of the atmosphere in the area S2 after exposure is higher than the ordinary temperature, but the elimination reaction of the protective group during the transfer of the wafer W can be inhibited by maintaining the area S2 after exposure in a low-temperature condition. For example, in heating processing after exposure (PEB), it is possible that the catalytic reaction of the acid is accelerated abruptly to make the elimination reaction of the protective group progress properly, whereby polarity changes in the exposed portion and the unexposed portion thereof can be completed. Therefore, the circuit pattern can be satisfactorily formed and the subsequent developing processing can be suitably performed.

Both of the first gas supply device 180 and the second gas supply device 181 have a function of regulating the temperature, and hence the area S1 before exposure and the area S2 after exposure can be respectively maintained at predetermined temperatures.

The pressure P1 in the area S1 before exposure and the pressure P2 in the area S2 after exposure are set to be lower than the pressure P3 in the aligner 105, so that the atmospheres in the area S1 before exposure and in the area S2 after exposure can be prevented from flowing into the aligner 105 in which the atmosphere is strictly controlled.

It should be noted that an example of the embodiment according to the present invention has been explained, but the present invention is not limited to the above example and can take various forms. It is suitable to provide the gas supply devices on top of the cassette station 102 and the processing station 102 respectively, and to provide the exhaust pipes at the bottom thereof respectively so that the interiors of the cassette station 102 and the processing station 103 can be maintained in the clean condition. Thereby, the entire coating and developing processing system 101 can be maintained in the clean condition and a successive photolithography process can be suitably performed.

Further, in order to save the supply amount of the inert gas, for example, it is suitable that the inert gas exhausted from the respective areas is collected partially or entirely, subsequently cleaned, and reused as the inert gas by sending it to each of the gas supply devices 180 and 181.

Incidentally, the embodiment explained above is about the coating and developing processing system of the wafer W in the process of photolithography in a fabricating process of a semiconductor wafer device, but the present invention is also applicable to a coating and developing processing system of substrates other than the semiconductor wafer, such as an LCD substrate.

As described above, according to the present invention, the inert gas is supplied into the coating and developing processing system to prevent the impurities at molecular level such as oxygen, basic substrates, ozone, organic substances, and the like from adhering to the substrate, whereby the substrate is suitably processed without being influenced by the impurities, which makes it possible to enhance yield. Further, the atmospheres in the substrate route before exposure and the substrate route after exposure in the interface section can be controlled individually.

Especially, when the chemically amplified resist is used, it is possible to prevent the acid generated in the exposure from being deactivated by the reaction with basic substances in the air. Further, the area after exposure can be maintained at the low temperature so that the elimination reaction of the protective group during the transfer of the wafer W can be inhibited. Therefore, the following developing processing can be suitably performed.

Moreover, according to the present invention, the clean atmospheres peculiar to the respective areas are maintained in the area before exposure and the area after exposure, and the respective areas can be maintained at predetermined temperatures. Further, the atmospheres in the area before exposure and the area after exposure can be prevented from flowing into the aligner in which the atmosphere is strictly controlled.

(Third Embodiment)

Next, the third embodiment of the present invention will be explained.

Figure 16:
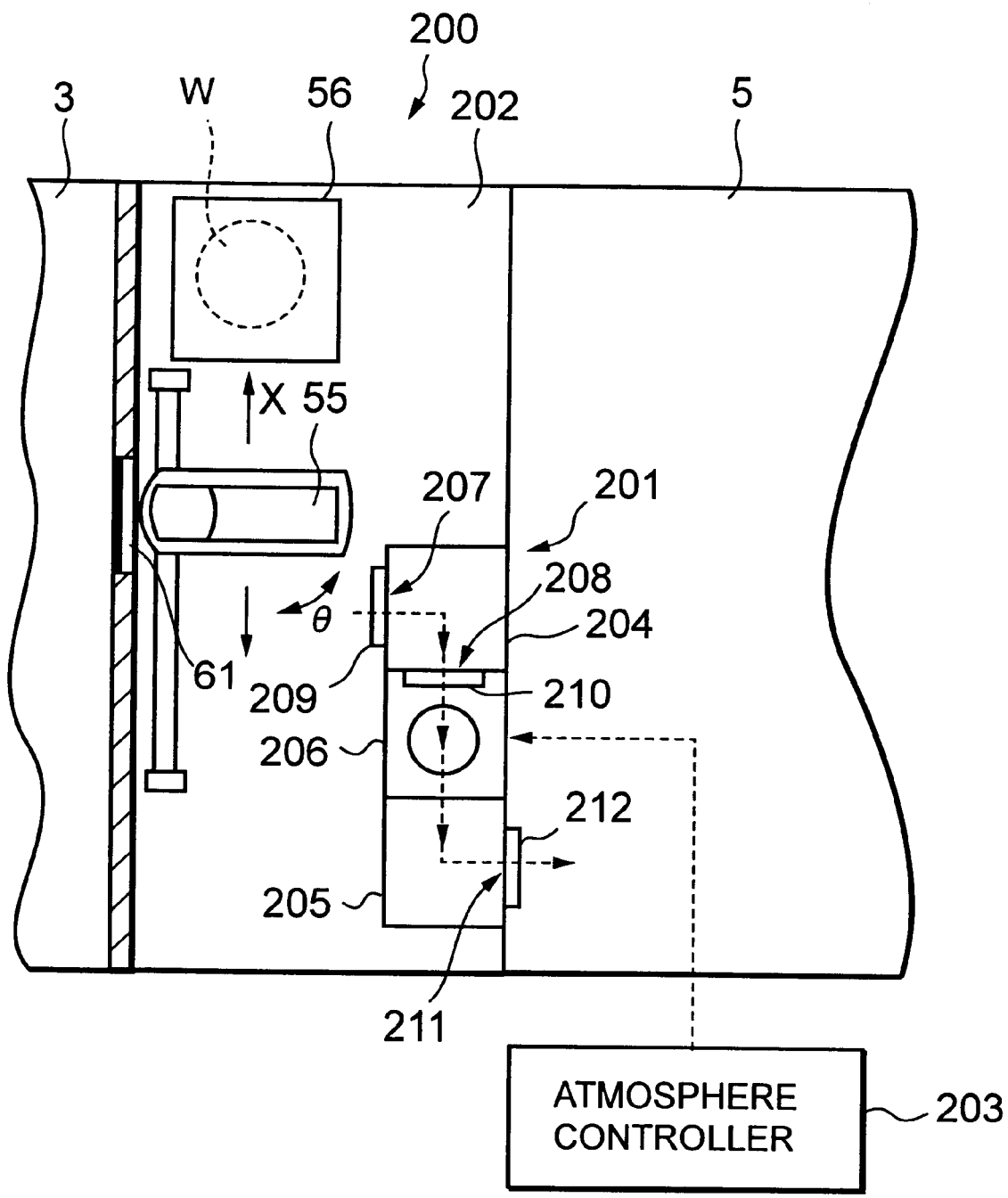
FIG. 16 is a plan view of a substrate processing apparatus according to a third embodiment of the present invention.

FIG. 16 is a plane view of a substrate processing apparatus according to this embodiment.

An apparatus 200 in FIG. 16 includes an interface section 202 in which a chamber 201 for temporarily holding the wafer W delivered from a processing station 3 and to be transferred to the aligner 5, in the interface section 4 in the system as shown in FIG. 1, for example.

An atmosphere inside the chamber 201 is controlled by an atmosphere controller 203.

For example, the atmosphere controller 203 reduces the pressure inside the chamber 201. Incidentally, the atmosphere controller 203 may be structured to supply an inert gas into the chamber 201 and to supply dry air into the chamber 201.

Further, the chamber 201 includes a purge room 204 which temporarily holds the wafer W introduced into the chamber to purge it, a buffer room 205 which holds the wafer W, and a transfer device 206 which is disposed between the purge room 204 and the buffer room 205 for transferring the wafer W from the purge room 204 to the buffer room 205. The purge room 204 and the buffer room 205 are made to receive the wafer W in multiple tiers.

In the purge room 204, a transit opening 207 for carrying the wafer W from the wafer carrier 55 into the purge room 204 and a transit opening 208 for carrying the wafer W from the purge room 204 to the transfer device 206 are provided. Shutters 209 and 210 for opening and closing the transit openings 207 and 208 are respectively provided in the transit openings 207 and 208.

In the buffer room 205, a transit opening 211 for directly carrying the wafer W out to, for example, an in-stage (an illustration of which is omitted) of the aligner 5 is provided. A shutter 212 for opening and closing the transit opening 211 is also provided in the transit opening 211.

When the wafer W is carried into the purge room 204 from the wafer carrier 55, it is first purged in the purge room 204 under a reduced pressure. The aforesaid provision of the purge room 204 can prevent the contamination of atmospheres in the transfer device 206 and the buffer room 205.

Next, the wafer W is delivered from the purge room 204 to the buffer room 205 by the transfer device 206, and the wafer W in the buffer room 205 is carried from the buffer room 205 into the aligner 5.

Thus, according to this embodiment, such a structure that the wafer W delivered from the processing station 3 and to be transferred to the aligner 5 is temporarily held in the chamber 201 in which the atmosphere is controlled is given, which makes it possible to suppress the variation with time of a resist before exposure and to prevent a change in a property of the resist. As a result, the uniformity of line width can be improved.

(Fourth Embodiment)

Next, the fourth embodiment in which the present invention is applied to a substrate coating and developing system will be explained.

Figure 28:
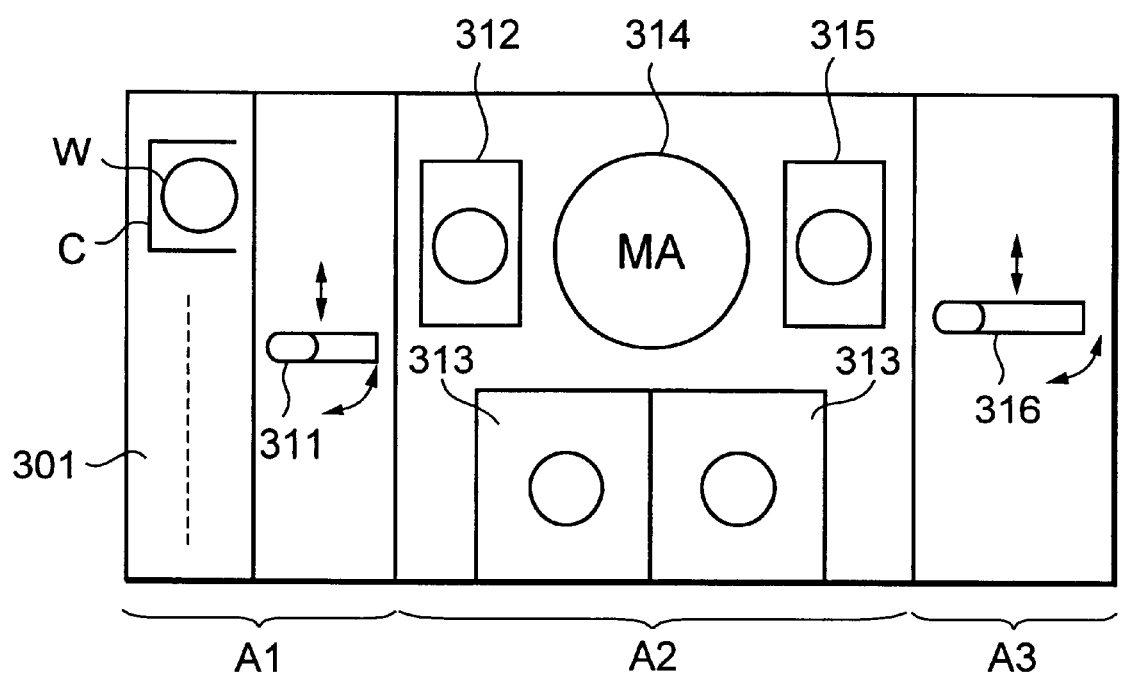
FIG. 28 is a schematic plan view showing a conventional coating and developing system.

First, a conventional example will be explained with reference to FIG. 28. As shown in FIG. 28, a cassette C housing 25 substrates, for example, semiconductor wafers W is carried into a cassette stage 301 of a cassette station A1. A processing station A2 is connected to the cassette station A1, and further, an aligner not illustrated is connected to the processing station A2 via an interface station A3.

The wafer W inside the cassette C on the cassette stage 301 is taken out by a delivery arm 311 and sent to a coating unit 313 through a delivery section of a shelf unit 312 to be coated with the resist. Subsequently, the wafer W is transferred by the route of a wafer transfer means 314→a delivery section of a shelf unit 315→the interface station A3→the aligner to be exposed. The wafer W subjected to the exposure is transferred to the processing station A2 by the reverse route, developed in a developing unit provided in the lower tier of the coating unit 313 but not illustrated, and then transferred by the route of the wafer transfer means 314→the delivery section of the shelf unit 312 the cassette C.

It should be noted that each shelf of the shelf units 312 and 315 is structured as a heating section, a cooling section, the delivery section of the wafer W, a hydrophobic processing section or the like, and before the aforesaid resist coating and developing processing, heating processing and cooling processing are performed in this order in the shelf units 312 and 315 in order to perform the resist coating or the like at a predetermined temperature. Incidentally, the numeral 316 denotes the delivery arm for delivering the wafer W between the processing station A2 and the aligner.

Further, a processing area composed of the coating unit 313 and the developing unit and a transfer area in which the wafer transfer means 314 is disposed are partitioned off in the processing station A2, and an atmosphere in a clean room is taken in and the air the temperature and the humidity of which are adjusted at predetermined temperature and humidity is sent into the processing area, whereby the area have, so to speak, an atmosphere which is adjusted with high accuracy.

It should be noted that a chemically amplified resist forms an acid by being exposed, and the acid is diffused by heating processing to act as a catalyst which decomposes a basic resin as a main component of a resist material and changes its molecular structure to its molecular structure to make the basic resin soluble in a developing solution. Therefore, when this kind of resist is used, the wafer W after the exposure is heated to a predetermined temperature, for example, in the heating section of the shelf unit 315, and subsequently, cooled to a predetermined temperature in the cooling section of the same shelf unit 315 in order to inhibit a solubilization reaction (a resolution reaction of the resist) to the developing solution due to the acid, and then, coated with the developing solution in the developing unit.

However, in the chemically amplified resist, since the resolution reaction of the resist progresses at a temperature around room temperature, changes in the temperature of the transfer area and in the transfer time influence developing line width significantly when the wafer W is transferred by the route of the aligner→the heating section, which causes the disadvantage that the developing line width changes due to these changes, which is noticeable particularly in an acetal-series chemically amplified resist.

Thereby, the transfer time of the aligner→the heating section is controlled to make the progress of the resolution reaction of the resist during the transfer uniform so that the uniformity of the developing line width can be secured, but still, there are variations in developing line width.

The fourth embodiment is to deal with the aforesaid disadvantages.

Figure 17:
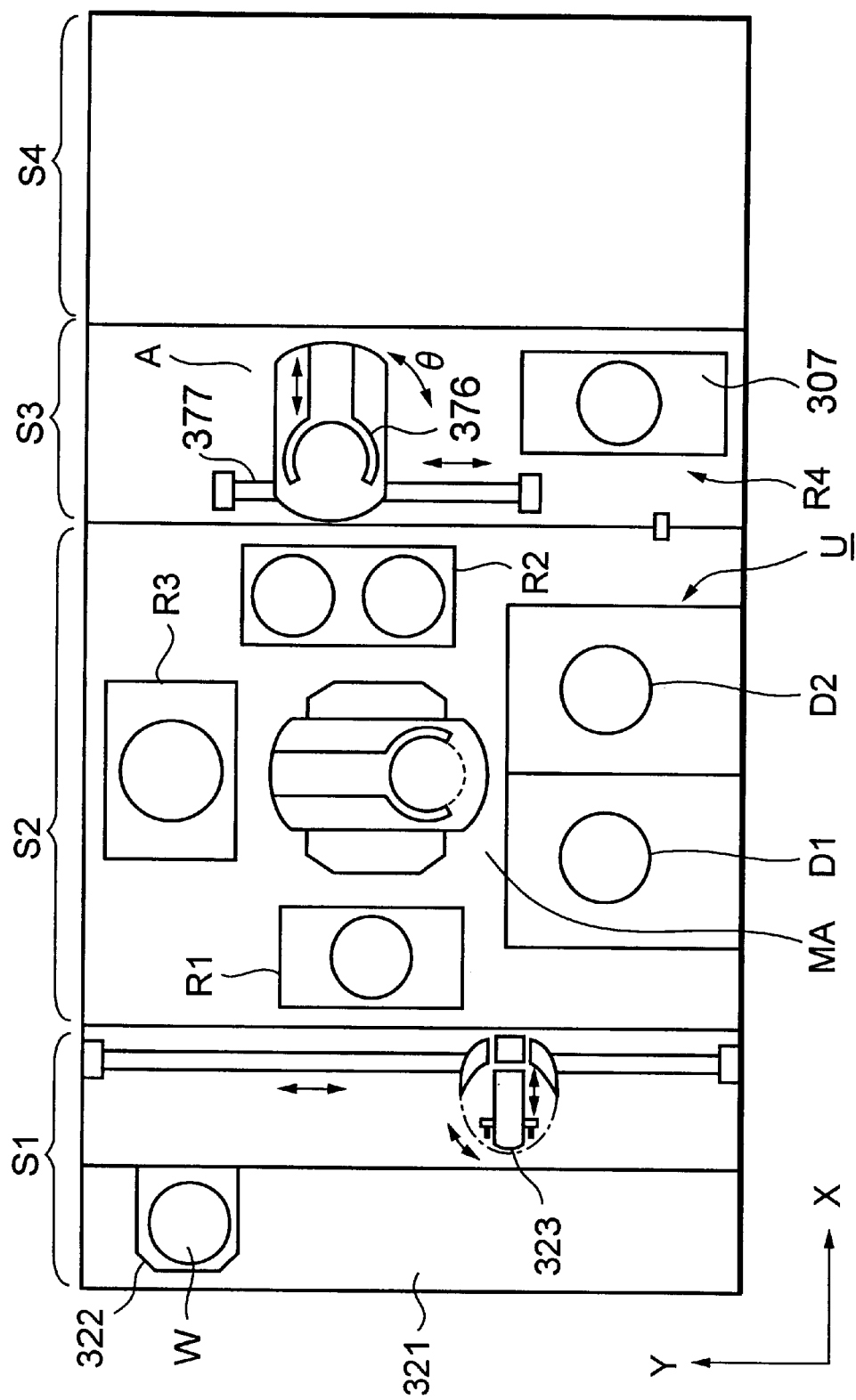
FIG. 17 is a schematic plan view showing a coating and developing system according to a fourth embodiment of the present invention.
Figure 18:
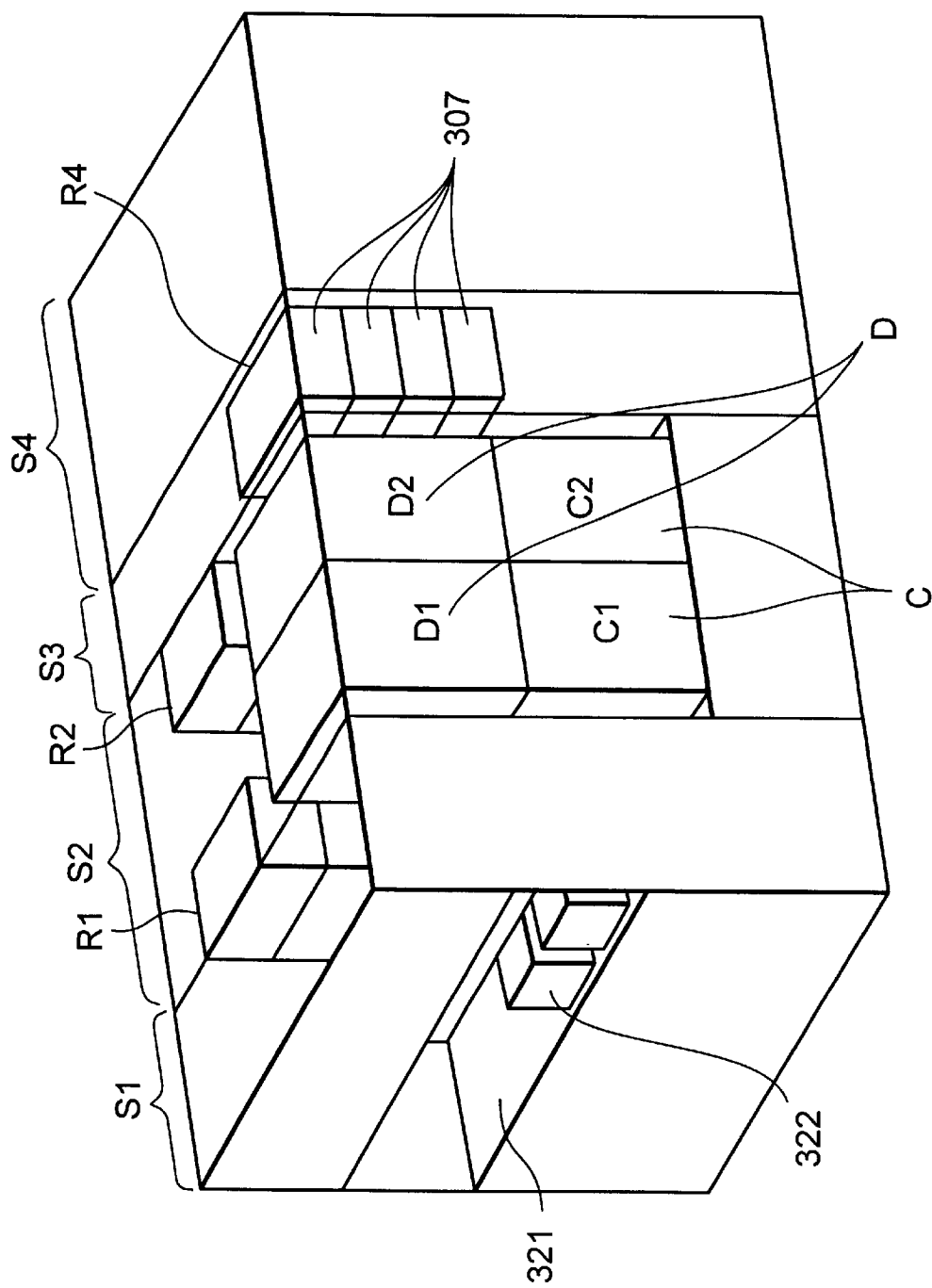
FIG. 18 is a schematic perspective view showing the coating and developing system.

FIG. 17 is a schematic plane view of this embodiment, and FIG. 18 is a perspective view showing an interior seen through, in which S1 is a cassette station, S2 is a processing station for performing coating processing of a resist, developing processing, and the like for the wafer W, S3 is an interface station, and S4 is an aligner.

The cassette station S1 includes a cassette stage 321 as a mounting section on which a wafer cassette (hereinafter referred to as a "cassette") 322 such as four substrate cassettes housing a plurality of substrates, for example, 25 wafers W is mounted, and a delivery arm 323 as a delivery means for delivering the wafer W between the cassette 322 on the cassette stage 321 and the processing station S2. The delivery arm 323 is structured to be ascendable and descendable, movable in the X-direction and the Y-direction, and rotatable around a vertical axis.

Further, the processing station S2 includes, for example, two developing units D (D1, D2), two coating units C (C1, C2), for example, three shelf units R (R1, R2, R3) and, for example, one substrate transfer means MA, and is structured to deliver the wafer W between the cassette station S1 and the interface station S3, and in the station S2, to perform processing of coating the substrate with a resist solution, processing of developing the wafer W, and processing of heating and cooling the wafer W to predetermined temperatures before and after such processing.

In explanation of an example of a layout of the processing station S2 like this, processing units U including the developing unit D, the coating unit C and so on are provided in two tiers on the back side of the aforesaid delivery arm 323, for example, on the right side when, for example, the back side is seen from the cassette station S1. That is, two developing units D1 and D2 as two developing processing sections are disposed side by side in a direction almost perpendicular to the direction of arrangement of the cassettes on the cassette stage 321 with the developing unit D1 on the front side, and at the lower tiers of these developing units D1 and D2, two coating units C1 and C2 are disposed side by side with the coating unit C1 on the front side. Incidentally, in the following explanation, the cassette station S1 side is referred to as the front side and the aligner S4 side is referred to as the back side.

Moreover, on the left side of the processing units U as seen from the cassette station S1, the substrate transfer means MA which is structured, for example, to be ascendable and descendable, movable right and left and back and forth, and rotatable around a vertical axis is provided to deliver the wafer W among the coating units C, the developing units D and the shelf units R. Further, the shelf unit R1 is disposed on the front side of the substrate transfer means MA as seen from the cassette station S1 side, the shelf unit R2 is disposed on the back side thereof, and the shelf unit R3 is disposed on the left side thereof, respectively. It should be noted that in FIG. 18, the shelf unit R3 and the substrate transfer means MA are omitted for convenience.

Figure 19:
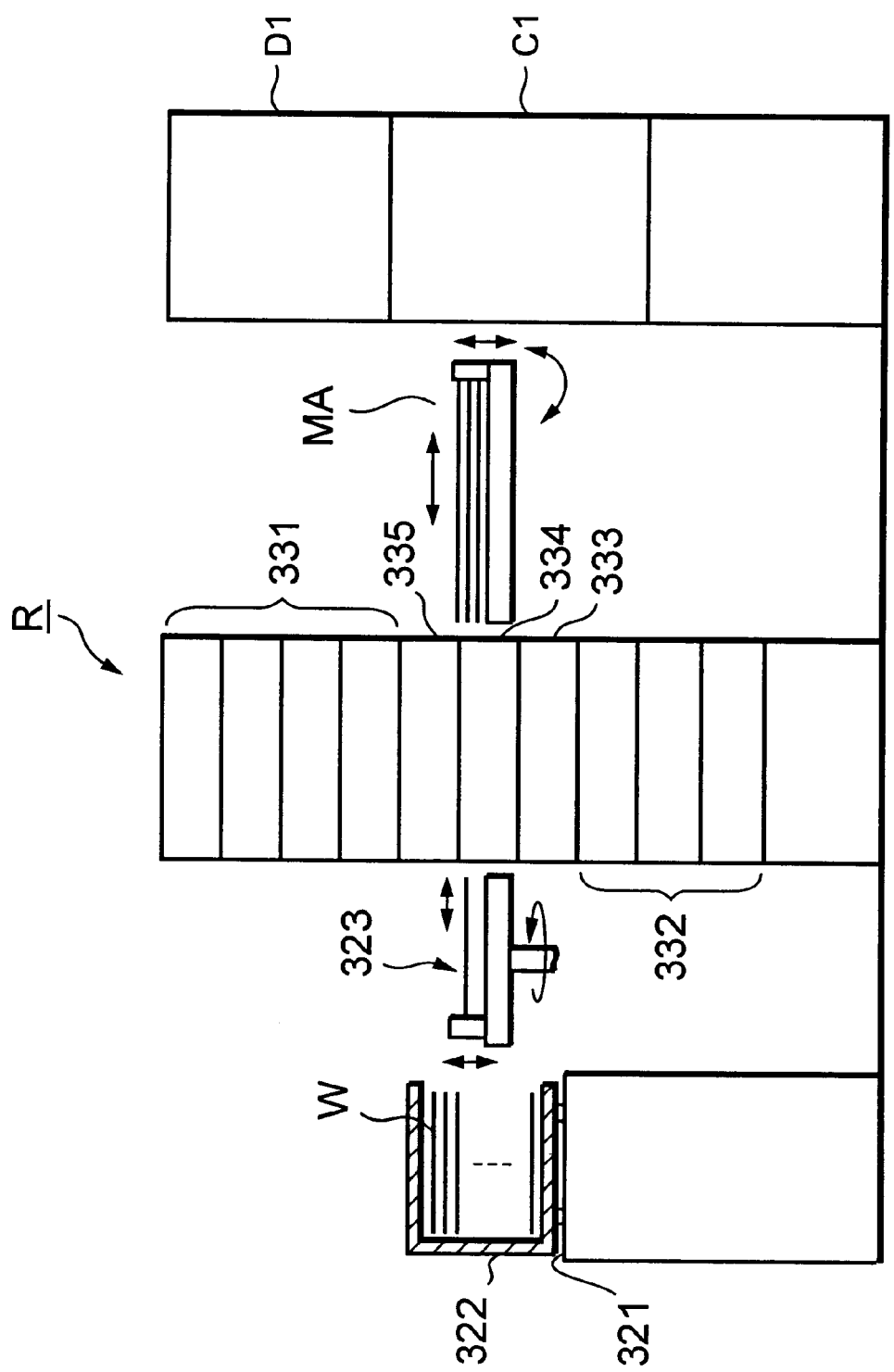
FIG. 19 is a side view showing an example of a shelf unit and a developing unit of the coating and developing system.

In the aforesaid shelf units R1 and R3, as shown with the shelf unit R1 as a representative in FIG. 19, heating sections 331 for heating the wafer W, cooling sections 332 for cooling the wafer W, a hydrophobic section 333 for making a surface of the wafer W hydrophobic, a delivery section 334 including a delivery table for delivering the wafer W between the delivery arm 323 of the cassette station S1 and the substrate transfer means MA in the shelf unit R1, and an alignment section 335 for performing alignment of the wafer W in the shelf unit R1 are vertically arranged.

The aforesaid heating section 331 is structured so that the wafer W is heated to a predetermined temperature by mounting the wafer W on a surface of a hot plate in which, for example, a heater is embedded, and the aforesaid cooling section 332 is structured so that the wafer W is cooled to a predetermined temperature by mounting the wafer W on a surface of a chill plate in which, for example, a thermo module is embedded.

Figure 20:
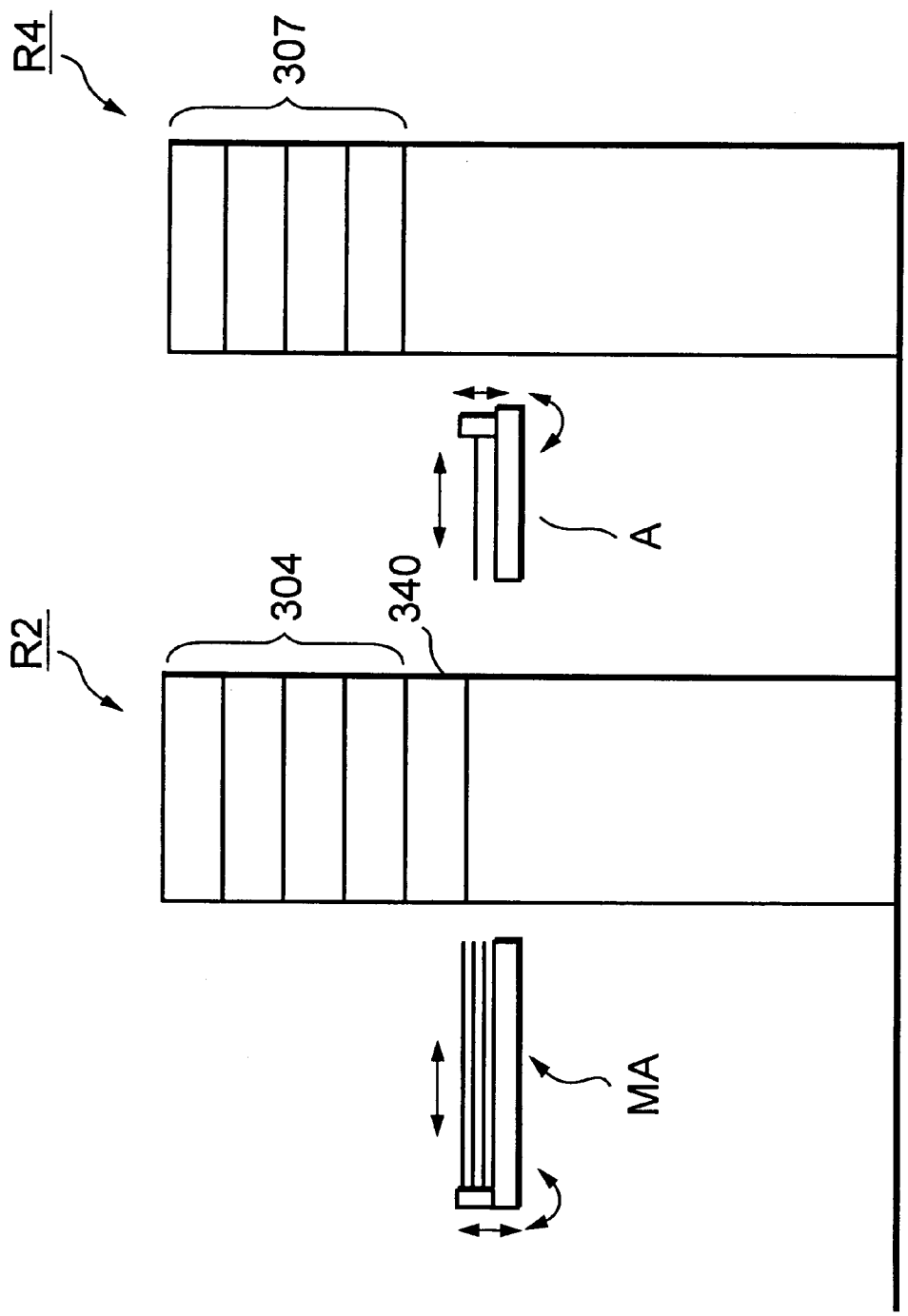
FIG. 20 is a side view showing an example of the shelf unit of the coating and developing system.

Further, in the aforesaid shelf unit R2, as shown in FIG. 20, CHP processing stations (Chilling Hot Plate Processing station) for heating and subsequently cooling the wafer W and a delivery section 340 including a delivery table for delivering the wafer W between a transfer arm A which will be described later of the interface station S3 and the substrate transfer means MA are vertically arranged.

Figure 21A:
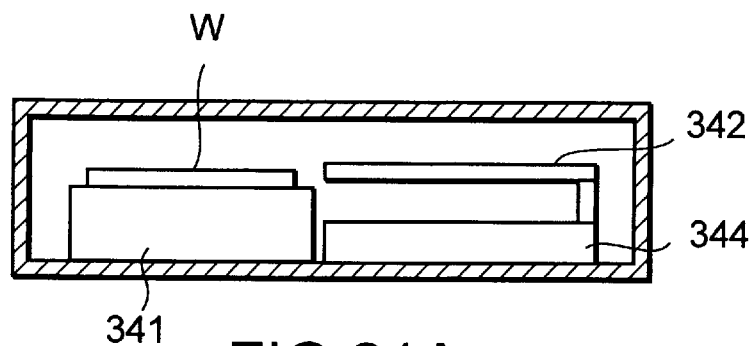
FIG. 21A to FIG. 21D are sectional views each showing a CHP process station provided in the shelf unit.
Figure 21B:
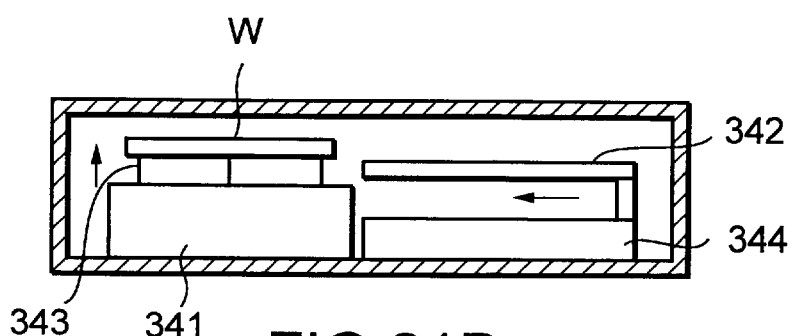
Figure 21C:
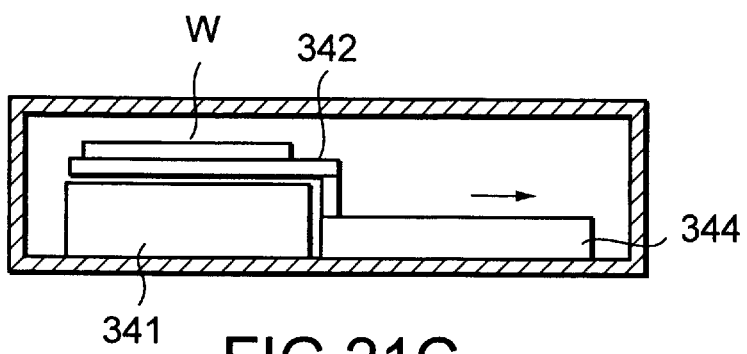
Figure 21D:
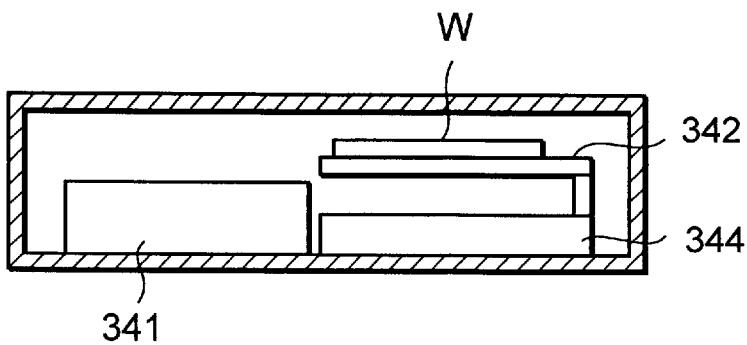

The aforesaid CHP station 304 includes, for example as shown in FIG. 21A to FIG. 21D, a hot plate 341 as a heating section for heating the wafer W and a chill plate 342 for cooling the wafer W, in which the wafer W is first mounted on the hot plate 341 to be heated to a predetermined temperature (refer to FIG. 21), subsequently, the wafer W is lifted from, for example, the hot plate 341 by, for example, a projecting pin 343 and the chill plate 342 is moved to a position below the wafer W by a transfer means 344 to deliver the wafer W to the chill plate 342 (refer to FIG. 21B and FIG. 21C), and thereafter, the chill plate 342 is moved to a position by the side of the hot plate 341 with the wafer W mounted thereon to cool the wafer W to a predetermined temperature (FIG. 21D). Thus, the heating time is controlled by the delivery of the wafer W between the hot plate 341 and the chill plate 342 in this process station, thereby preventing an over-bake.

Figure 22:
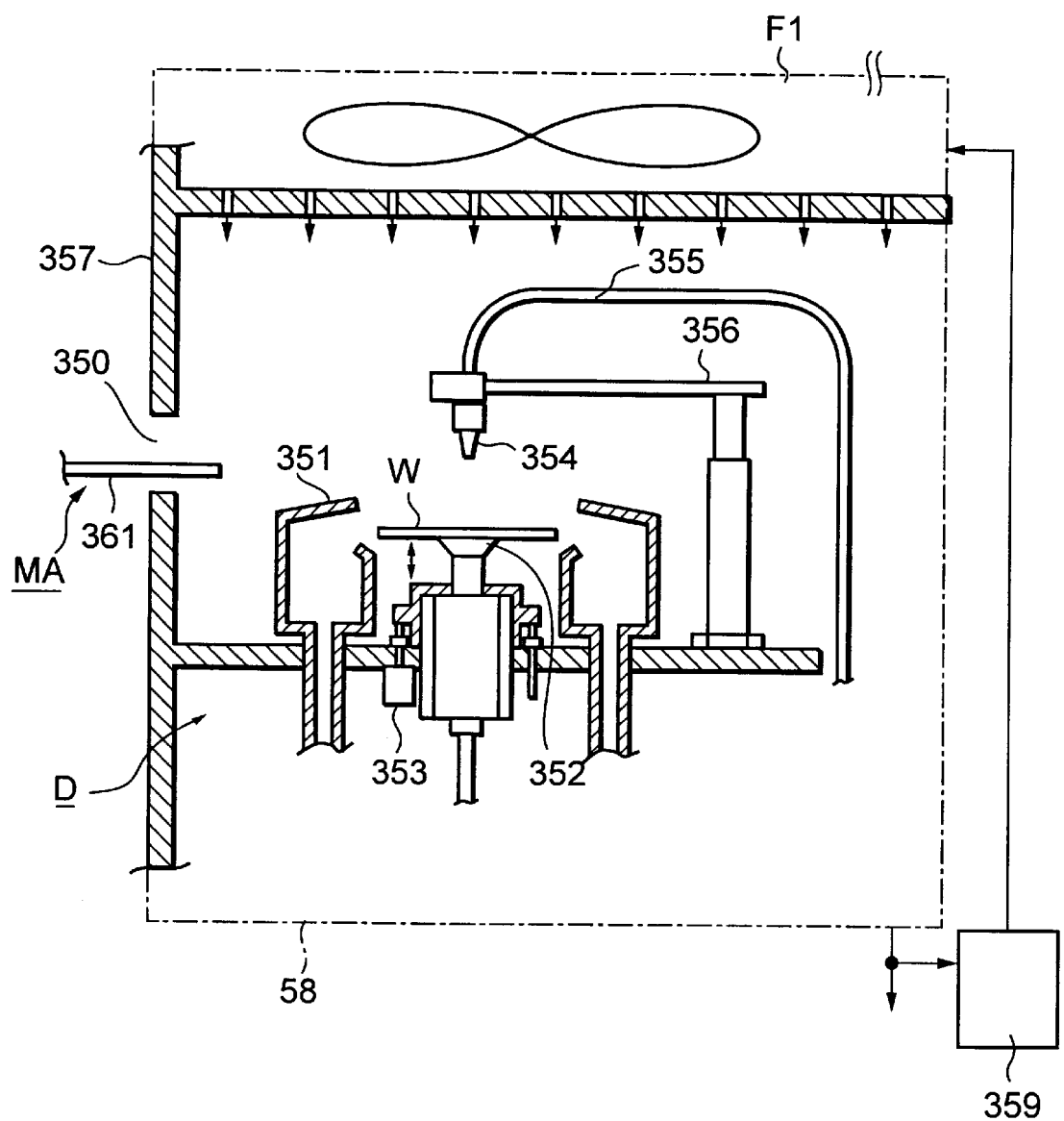
FIG. 22 is a sectional view showing an example of the developing unit.

Next, in explanation of the developing unit D based on, for example, FIG. 22, the numeral 351 denotes a cup, and a spin chuck 352 which has a function of vacuum suction is provided rotatably inside the cup 351. The spin chuck 352 is structured to be ascendable and descendable by a raising and lowering mechanism 353, and when it is positioned above the cup 351, the wafer W is delivered to an arm 361 which will be described later of the substrate transfer means MA.

Regarding the delivery of the wafer W, the wafer W on the arm 361 is delivered to the spin chuck 352 on the upper side of the cup 351, to which it is relatively raised from its lower side, and delivered from the spin chuck 352 side to the arm 361 by the reverse operational sequences. The numeral 354 denotes a discharge nozzle of a processing solution, the numeral 355 denotes a processing solution supply pipe, and the numeral 356 denotes a supporting arm for moving the nozzle horizontally.

The discharge nozzle 354 is structured to include a plurality of supply holes which are arranged, for example, in a diameter direction of the wafer W, and the developing solution is discharged onto the surface of the wafer W on the spin chuck 352 from the discharge nozzle 354, and the developing solution is heaped up on the wafer W by half rotating the spin chuck 352 so that a solution film of the developing solution is formed.

Further, the coating unit C has almost the same structure as the developing unit D, whereas in the coating unit C, the discharge nozzle 354 is structured to supply the processing solution onto, for example, a point almost close to the center of the wafer W, and the resist solution as the processing solution is dropped onto the surface of the wafer W on the spin chuck 352 from the discharge nozzle 354, and the resist solution is spread over to coat the wafer W by rotating the spin chuck 352.

Moreover, the processing units U are spatially closed. Namely, as shown in FIG. 22, the developing unit D or the like is partitioned off from other areas by a wall portion 357 and a partition wall 358 partitions respective sections such as the developing unit D1 and the coating unit C1, and a delivery port 350 is formed in the wall portion at a position corresponding to the arm 361 of the substrate transfer means MA in the respective sections such as the developing unit D1.

Furthermore, the air which is rid of impurities, adjusted at a predetermined temperature, for example, at 23° C. as a coating temperature of the developing solution and at a predetermined humidity is sent into respective sections partitioned off by the wall portion 357 and the partition wall 358, whereby these areas have, so to speak, atmospheres which are adjusted with high accuracy.

Namely, for example, in the partitioned processing unit U, for example as shown in FIG. 22, a filter unit F1 is provided to cover the upper side thereof, and an atmosphere collected from the lower side of the processing unit U is exhausted to a plant exhaust system, while a part thereof is introduced to a filter device 359, and air cleaned by the filter device 359 is blown out as a down-flowing air through the aforesaid filter unit F1 into each section.

The aforesaid filter unit F1 includes, for example, a filter for cleaning the air, and includes a chemical filter to which an acidic component for removing alkali components in the air such as an ammoniacal component and amine is added, a suction fan, and so on when a chemically amplified resist is used. Further, the aforesaid filter device 359 includes an impurity removing section for removing the impurities, a heating mechanism, a humidifying mechanism, a feeding section for feeding the air and so on.

When the chemically amplified resist, for example, is used as the resist solution, it is necessary to remove an alkali component because a catalytic reaction due to an acid which will be described later is inhibited if the alkali component such as a trace of ammonia included in the air and the amine generated from a wall coating touches the acid on the resist surface to deteriorate a shape of a pattern. Therefore, it is necessary to prevent the alkali component from getting into the developing processing atmosphere, and hence the processing unit is spatially closed to prevent an entrance of the alkali component from the outside by using the chemical filter.

Figure 23:
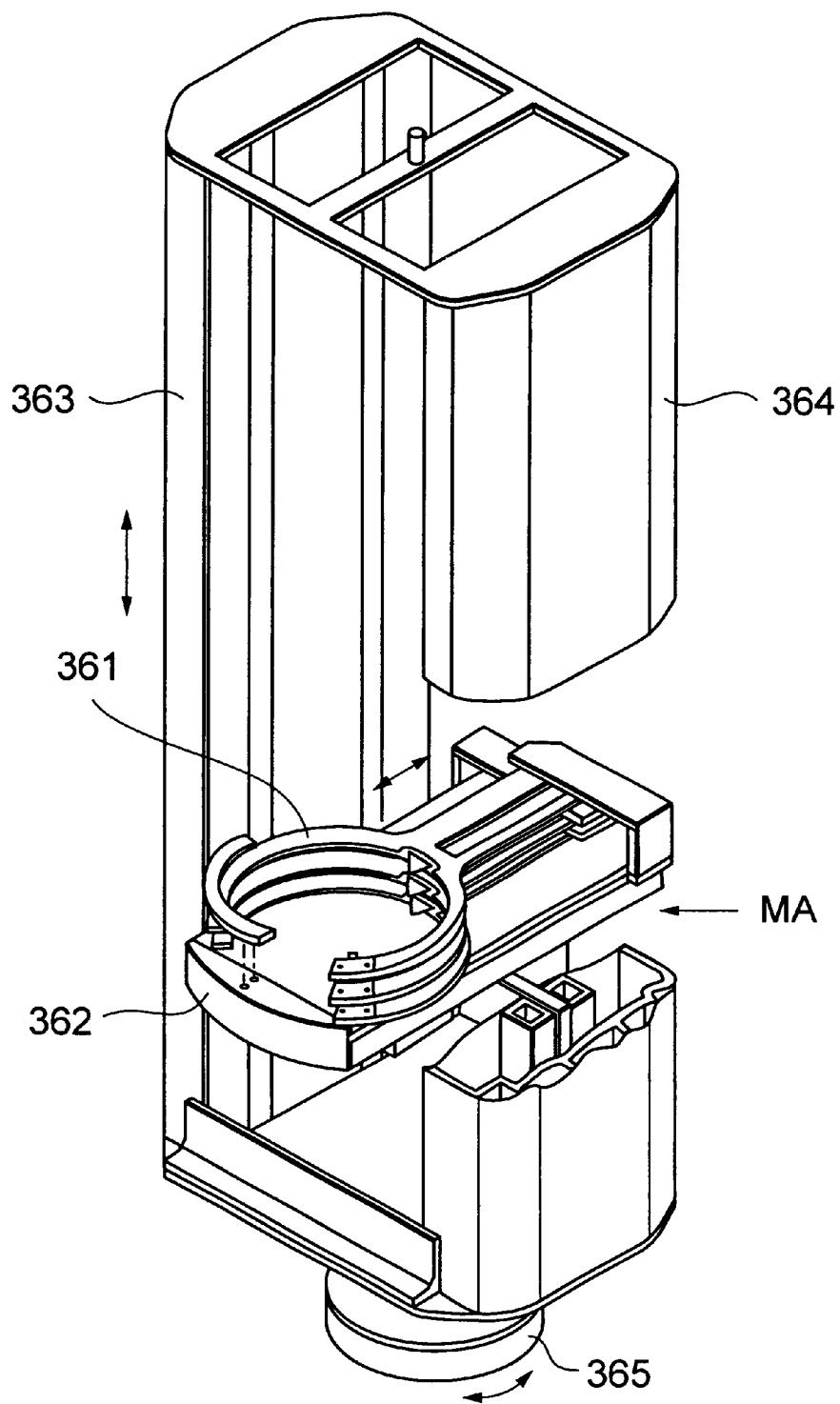
FIG. 23 is a sectional view showing a substrate transfer means.

The aforesaid substrate transfer means MA includes, for example as shown in FIG. 23, the three arms 361 for holding the wafer W, a base table 362 for supporting the arm 361 to be movable back and forth, a pair of guide rails 363 and 364 for supporting the base table 362 to be ascendable and descendable, and it is structured to be movable back and forth, ascendable and descendable, and rotatable around a vertical axis by rotating these guide rails 363, 364 by a rotating drive section 365.

The interface station S3 is connected next to the processing station S2, and the aligner S4 for exposing the wafer W on which a resist film is formed is connected to the back side of the interface station S3. The interface station S3 includes a shelf unit R4 in which reaction inhibiting sections 307 for performing processing of inhibiting the progress of a resolution reaction of a resist for the wafer W and the transfer arm A for delivering the wafer W among the processing station S2, the aligner S4 and the shelf unit R4, and is structured to deliver the wafer W between the processing station S2 and the aligner S4 and to perform reaction retarding processing for the wafer W after exposure in the station S3.

In explanation of an example of a layout of the interface station S3 like this, the shelf unit R4 is provided, for example, on the right side when, for example, the back side is seen from the cassette station S1 side, and on the left side thereof, the transfer arm A which is structured, for example, to be ascendable and descendable, movable right and left and back and forth, and rotatable around a vertical axis is provided to deliver the wafer W between the shelf unit R2 of the processing station S2, the shelf unit R4, and the aligner S4.

Figure 24:
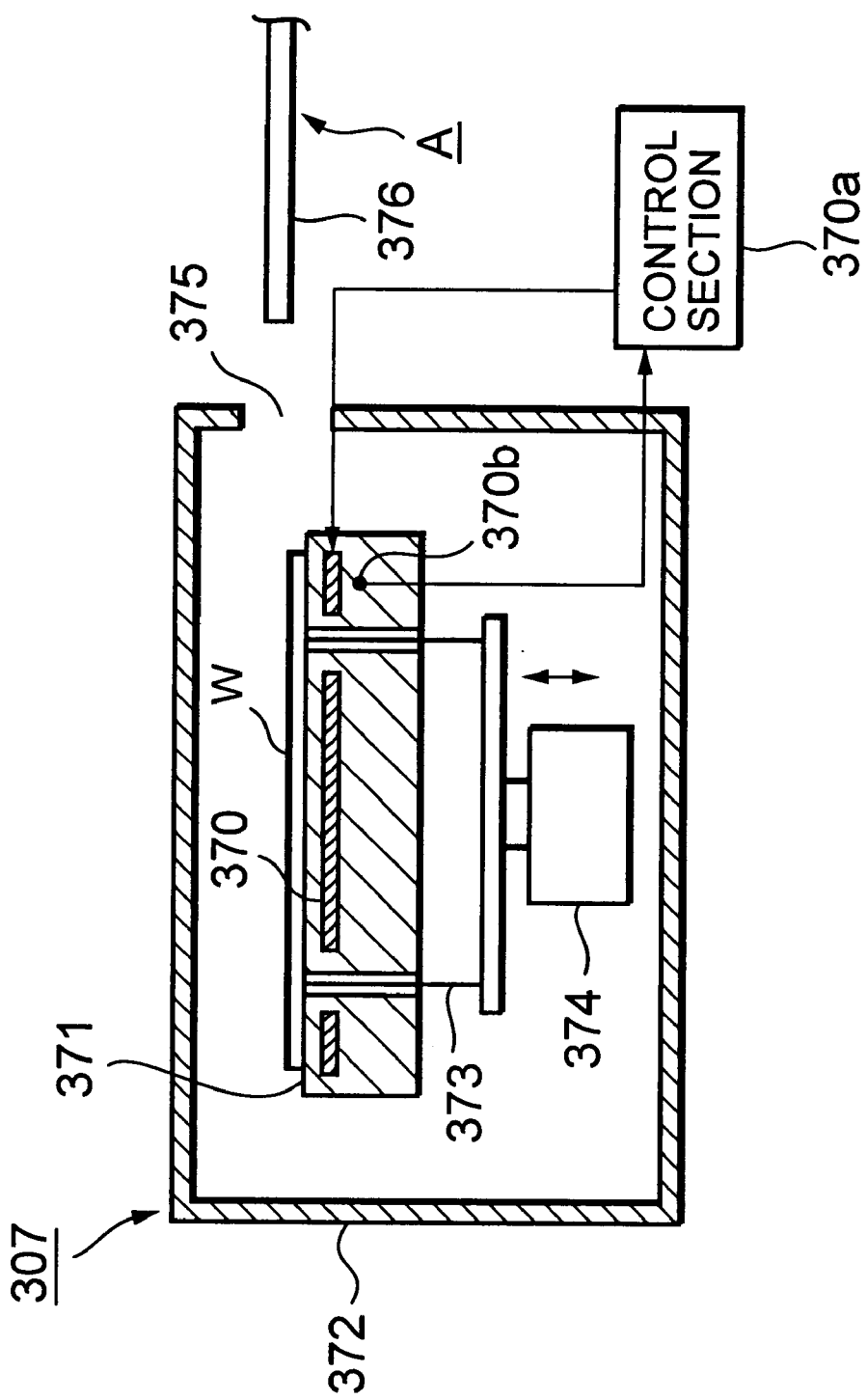
FIG. 24 is a sectional view showing an example of a reaction inhibiting section.

The aforesaid reaction inhibiting section 307 inhibits the progress of the resolution reaction of the resist by cooling the wafer W to such an extent that dew formation does not occure, and, for example, by mounting the wafer W on a surface of a chill plate 371 in which, for example, a thermo module 370 is embedded as shown in FIG. 24, the wafer W is cooled to a predetermined temperature, for example, to such a temperature that the resolution reaction of the resist does not progress and the dew formation does not occur, for example, to about 10° C. to 15° C. The chill plate 371 is housed in a case 372 in which a delivery port 375 of the wafer W is formed at, for example, a position corresponding to the arm of the transfer arm A, and further, a raising and lowering pin 373 which is raised and lowered by a raising and lowering mechanism 374 is provided to deliver the wafer W to the plate 371 in the chill plate 371.

The thermo module 370 of the aforesaid chill plate 371 is a semiconductor device which can transfer heat from a heat absorbing side to a heat radiating side by the passage of direct current, and since a calorific value can be controlled by changing the amount of the passing current, the temperature of the wafer W is thereby adjusted with high accuracy in the reaction inhibiting section 307. In this example, a temperature/humidity indicator 370b detects the temperature and the humidity in, for example, the interface station S3 and a dew point is calculated based on this temperature/humidity, whereby the temperature setting of the chill plate 371 is controlled by a controlling section 370a so that the temperature is not lower than the dew point.

The structure of the transfer arm A is the same as that of the aforesaid substrate transfer means MA except that an arm 376 for holding the wafer W is one and that the arm 376 is structured to be movable in the direction of arrangement of cassettes (the Y-direction) of the cassette station S1. For example, in the transfer arm A, the rotating drive section 365 is movable along a guide rail 377 which is provided in the Y-direction, and thus the arm 376 is structured to be movable in the X- and the Y-direction, to be ascendable and descendable, and rotatable around the vertical axis.

Figure 25:
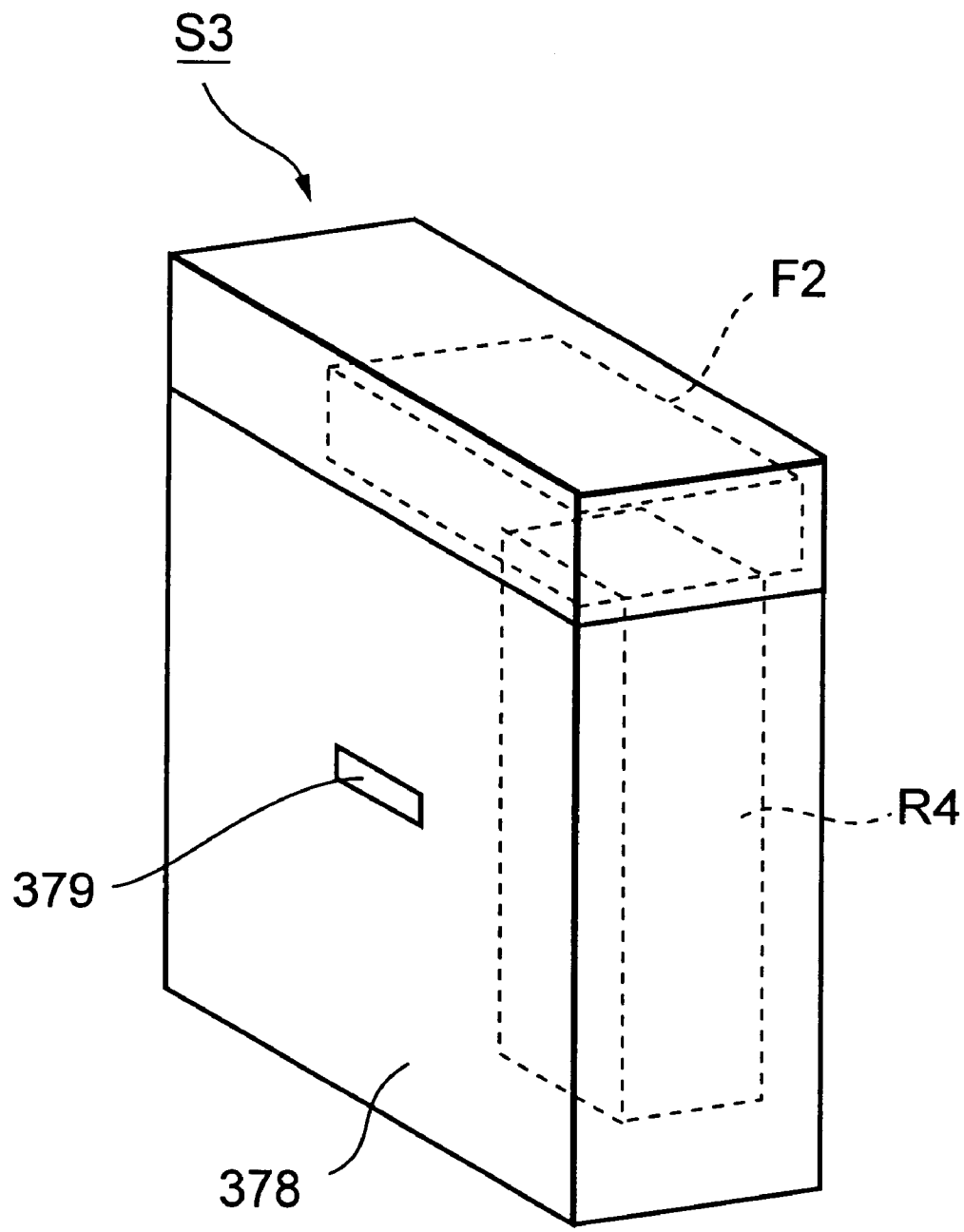
FIG. 25 is a perspective view showing an example of an interface station.

Moreover, the interface station S3 is spatially closed. Namely, for example, as in FIG. 25, it is partitioned off from other areas by a wall portion 378, and the delivery port 379 is formed in the wall portion 378 at a position corresponding to the arm 376 of the transfer arm A.

Further, in the interface station S3, a filter unit F2 which includes, for example, a filter for cleaning air, and when the chemically amplified resist is used, includes the chemical filter to which the acidic component for removing alkali components in the air such as the ammoniacal component and the amine is added, the suction fan, and so on is provided to cover the upper side thereof, and the cleaned air is blown out as down-flowing air through the filter unit F2.

Next, the operational sequence of the above-described embodiment will be explained. First, an automatic transfer robot (or an operator) carries the cassette 322 housing, for example, the 25 wafers W onto the cassette stage 321, and the wafer W is taken our of the cassette 322 by the delivery arm 323 to be placed in the delivery section 334 of the shelf unit R1 of the processing station S2.

The wafer W is transferred by the route of the substrate transfer means MA→the hydrophobic section 333 of the shelf units R1, R3→the substrate transfer means MA→the cooling section 332 of the shelf units R1, R3→the substrate transfer means MA→the coating unit C, and after the surface of the wafer is made hydrophobic, it is cooled to a predetermined temperature to be subjected to temperature adjustment, and coated with the resist solution at a predetermined temperature, for example, at 23° C. in the coating unit C.

The wafer W thus coated with the resist solution is transferred by the route of the substrate transfer means MA→the heating section 331 of the shelf units R1, R3→the substrate transfer means MA→the cooling section 332 of the shelf units R1, R3 to be subjected to temperature adjustment, and subsequently transferred by the route of the substrate transfer means MA→the delivery section 340 of the shelf unit R2 the transfer arm A of the interface station S3 the aligner S4 to be exposed.

The wafer W after the exposure is transferred by the route of the aligner S4 the transfer arm A of the interface station S3 the reaction inhibiting section 307 of the shelf unit R4, and in this reaction inhibiting section 307, the wafer W is delivered onto the surface of the chill plate 371 by the joint action of the raising and lowering pin 373 and the transfer arm A to be mounted on the chill plate 371 which is previously set to a predetermined temperature for more than a predetermined time, so that the wafer W undergoes cooling processing to such a temperature as inhibits the progress of the resolution reaction of the resist does and does not cause dew formation, for example, to about 10° C. to 15° C.

Figure 26A:
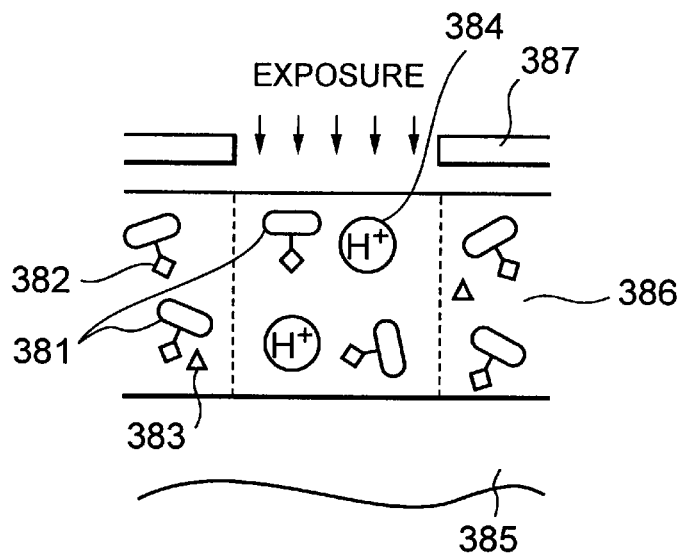
FIG. 26A to FIG. 26C are explanatory views showing a resolution reaction of a chemically amplified resist.
Figure 26B:
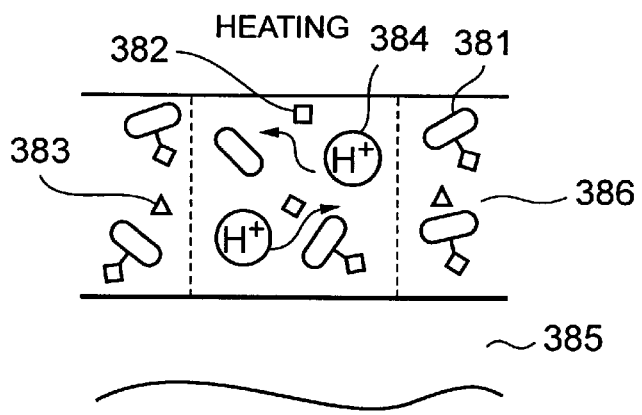
Figure 26C:
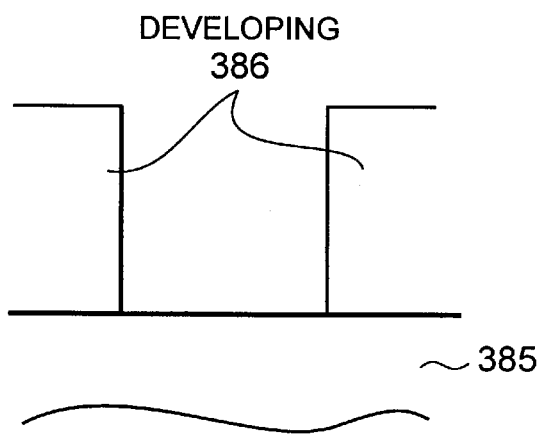

In explanation of the chemically amplified resist, as shown in FIG. 26A to FIG. 26C, this resist includes a basic resin 381 as a main component, a protective group 382 for suppressing dissolution of the basic resin 381 in the developing solution, and a photoacid generator 383, and has a property that the entire area to be exposed is exposed with a small amount of an exposing energy.

With this kind of resist, for example as shown in FIG. 26A, an acid 384 is generated from the photoacid generator 383 by exposure, and thereafter, as shown in FIG. 26B, the acid 383 cleaves the protective group 382 from the basic resin 381 to make it soluble in the alkaline solution by using thermal energy by heating processing. Next, the acid 384 cleaves another protective group 382, and hence this reaction occurs like a chain reaction. Subsequently, this chain reaction is stopped by cooling processing, and thereafter, as shown in FIG. 26C, a predetermined pattern is formed in developing processing by removing an area which becomes soluble in the alkaline solution by the chain reaction. In FIG. 26A to FIG. 26C, the numeral 385 is a substrate, the numeral 386 is a resist and the numeral 387 is a mask on which the predetermined pattern is formed.

In the resist like this, since the acid 384 which is generated by exposure acts as a catalyst, the resolution reaction of the resist (the reaction of cleaving the protective group 382 from the basic resin 381) progresses immediately after the exposure, although the progress is slow. However, the progressing speed of the resolution reaction depends on the temperature, and the progressing speed becomes considerably slow at the temperature which is lower than room temperature and is in such an extent that dew formation does not occur, for example, about 10° C. to 15° C., which makes it possible to inhibit the progress of the resolution reaction. Therefore, by cooling the wafer W after the exposure to about 10° C. to 15° C. in the reaction inhibiting section 307, the progress of the resolution reaction of the resist can be inhibited. Incidentally, the reason why a cooling temperature of the wafer W in the reaction inhibiting section 307 is set so as not to cause dew formation is to prevent ununiform resolution progress and developing line width due to the acid 384 at the interface with the resist (the acid 384 near the surface thereof) being absorbed into the resist solution if dew water adheres to the surface of the wafer W.

The wafer W which is thus cooled to a predetermined temperature is transferred by the route of the transfer arm A in the interface station S3→the delivery section 340 of the shelf unit R2 of the processing station S2→the substrate transfer means MA the CHP process station 304 of the shelf unit R2→the substrate transfer means MA→the developing unit D to be subjected to temperature adjustment by being heated to a predetermined temperature by the hot plate 341 and then cooled to a predetermined temperature by the chill plate 342 of the CHP process station 304, and then the wafer W undergoes developing processing in the developing unit D at a predetermined temperature, for example, at 23° C. which is the coating temperature of the developing solution.

Here, in this example, the heating processing is performed by cleaving the protective group 382 from the resin 381 by the acid 384 on the hot plate 341 of the CHP process station 304 to make it soluble in the alkaline solution, and the cooling processing is performed to stop the chain reaction on the chill plate 342.

Subsequently, the wafer W is transferred by the route of the substrate transfer means MA→the heating section 331 of the shelf units R1, R3→the substrate transfer means MA→the cooling section 332 of the shelf units R→the substrate transfer means MA→the delivery section 334 in the shelf units R→the delivery arm 323, and the wafer W which is heated to a predetermined temperature and then cooled to a predetermined temperature is returned back, for example, into the original cassette 322 through the delivery section 334.

In the processing station S2, the wafer W is successively sent to the delivery section 334 of the shelf unit R1, and then transferred by the route of the vacant hydrophobic section 333→the vacant cooling section 332 in the shelf units R1, R3→the vacant coating unit C→the vacant heating section 331 in the shelf units R1, R3→the vacant cooling section 332 in the shelf units R1, R3→the interface station S3, and the wafer W after the exposure should be transferred by the route of the vacant reaction inhibiting section 307 of the shelf unit R4 in the interface station S3 the vacant CHP process station 304 of the shelf unit R2 in the processing station S2 the vacant developing unit the vacant heating section 331 of the shelf units R1, R3 the vacant cooling section 332 of the shelf units R1, R3 the delivery section 334 of the shelf unit R1.

According to the above embodiment, the wafer W is cooled to such a temperature as does not cause dew formation in the reaction inhibiting section 307 after the exposure, which makes it possible to enhance the uniformity of the developing line width. That is, the wafer W exposed in the aligner S4 is cooled to a predetermined temperature in the reaction inhibiting section 307, but the transfer time of the aligner S4 the reaction inhibiting section 307 is constant, and hence the resolution reaction of the resist progresses to the almost same extent during the transfer.

Further, since the wafer W is cooled to such an extent that the dew formation does not occur and the progress of the resolution reaction of the resist is inhibited in the reaction inhibiting section 307, the progress of the resolution reaction of the wafer W therein is almost inhibited. Therefore, when the wafer W is made to wait in the reaction inhibiting section 307 for the transfer to the CHP process station 304 which is a next process, the extent of the progress of the resolution reaction becomes almost the same when the wafer W is transferred to the CHP process station 304. Thus, heating processing is performed for the wafer W of the same condition at all times on the hot plate 341 of the unit 304 so that the extent of the progress of the resolution reaction is made to be almost the same also in the hot plate 341, which makes it possible to prevent an occurrence of variations in developing line width and to enhance the uniformity of the developing line width.

Figure 27:
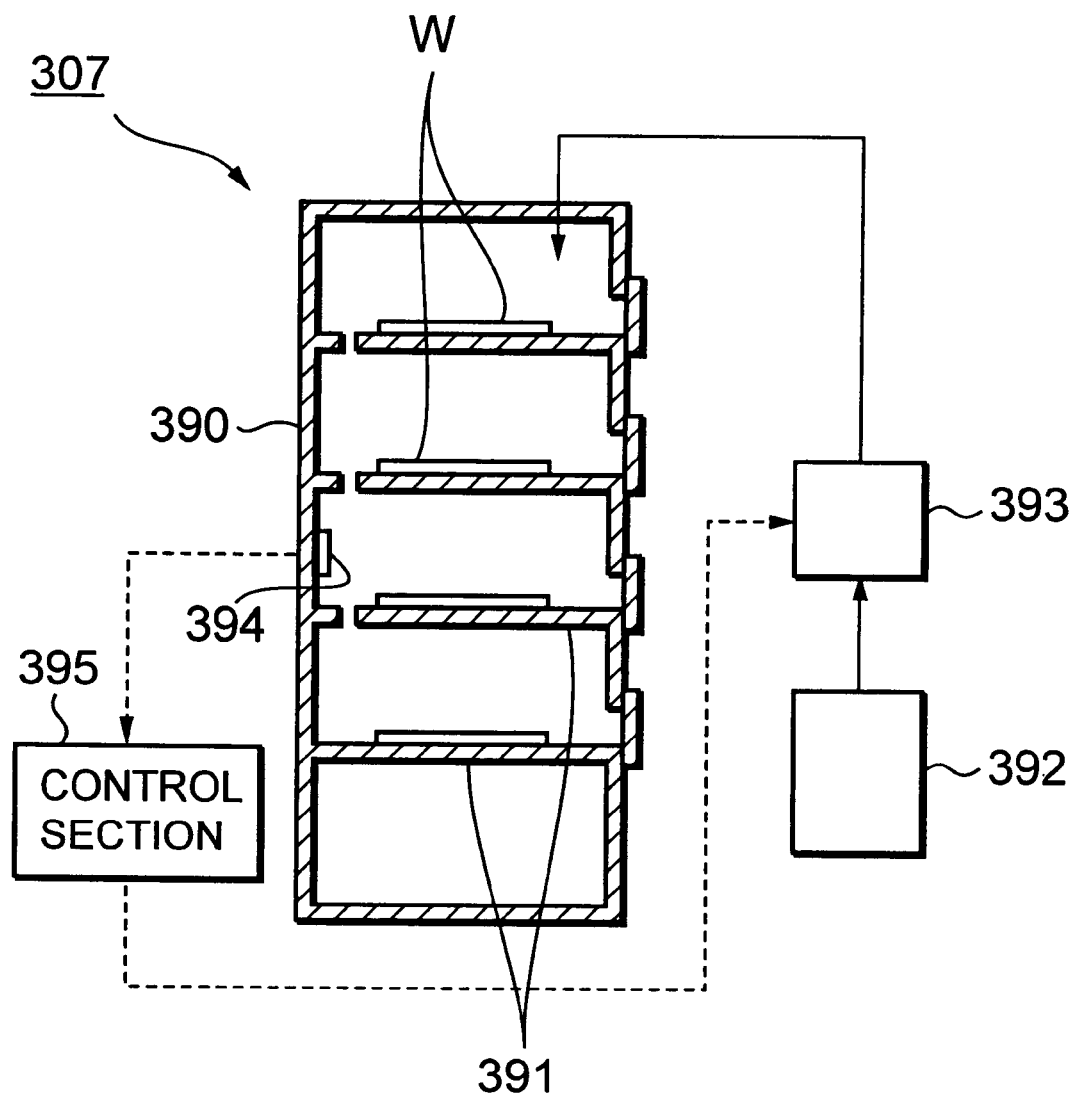
FIG. 27 is a sectional view showing another example of the reaction inhibiting section.

In the above-described embodiment, the reaction inhibiting section 307 may be structured to cool the wafer W by circulating a refrigerant in the chill plate 371, or may be structured, for example, as shown in FIG. 27. In this example, shelves 391 for mounting the wafer W in multiple tiers are provided in a processing room 390 which is partitioned from the surroundings and sealed, and a gas having a predetermined temperature is supplied into the processing room 390, to thereby adjust the temperature to such an extent that the progress of the resolution reaction of the resist is inhibited and that dew formation does not occur.

In FIG. 27, the numeral 392 denotes a storage tank of the gas to be supplied into the processing room 390, and the numeral 393 denotes an adjusting section for adjusting the gas from the storage tank 392 to a predetermined temperature and thereafter sending it into the processing room 390. In this example, the temperature of the gas adjusted in the adjusting section 393 is controlled by a controlling section 395 based on the temperature in the processing room 390 detected by a temperature detecting section 394. Further, as the gas to be supplied into the processing room 390, air, an inert gas such as nitrogen, a mixed gas of the air and the inert gas or the like and so on can be used.

Moreover, in the above example, the reaction inhibiting section 307 controls the temperature of the wafer W, but the progress of the resolution reaction of the resist can be inhibited by controlling the moisture amount adhering to the wafer W. Namely, the acetal-series chemically amplified resist has a property that it requires a humidity of about 45% in the resolution reaction of the resist, and the resolution reaction hardly occurs when the humidity is not enough. Therefore, by lowering the humidity inside the reaction inhibiting section 307 to, for example, about 20% or less to obtain a low humidity condition, and by making the wafer W wait therein for more than a predetermined time, the moisture amount adhering to the wafer W is made smaller than the moisture amount adhering to the wafer W when it is transferred into the reaction inhibiting section 307 so that the progress of the resolution reaction of the resist can be inhibited considerably.

In concrete, in the reaction inhibiting section 307 shown in FIG. 24, it can be structured so that the gas the humidity of which is adjusted in the adjusting section is supplied from the storage tank into the case, and that the temperature of the gas which is adjusted in the adjusting section is controlled by the controlling section based on the humidity in the case. As the gas supplied into the case, air, an inert gas such as nitrogen, a mixed gas of the air and the inert gas or the like and so on can be used. Further, in the reaction inhibiting section 307 shown in FIG. 27, it can be structured so that the humidity of the gas which is adjusted in the adjusting section 393 is controlled by the controlling section 395 based on the humidity in the processing room 390 detected by the humidity detecting section.

Moreover, in the reaction inhibiting section, the temperature control of the wafer W and the control of the adherent moisture amount can be performed in combination, in which case the higher uniformity of developing line width can be secured because the progress of the resolution reaction of the resist can be further inhibited.

The reaction inhibiting section 307 can be installed not only in the interface station S3, but also inside the processing station S2, but when the temperature and the humidity in the transfer area between the aligner S4 and the reaction inhibiting section 307 are easy to change, the resolution reaction of the resist during the transfer progresses similarly when the transfer time is shorter, and hence it is preferable to install the reaction inhibiting section 307 in the interface station S3, and it is more preferable to install it near the aligner S4.

Furthermore, the temperature setting of the chill plate 371 of the reaction inhibiting section 307 may be set by the controlling section so that the temperature higher by a predetermined temperature range, for example, 1° C. to 3° C., than the dew point which is calculated by the detected temperature and humidity may be set as an optimum value, in which case the predetermined temperature range can be changed based on the type of the resist. Further, the cooling temperature may be calculated based on the temperature and humidity in the atmosphere so that a relative humidity (value determined by the cooling temperature with respect to the moisture amount in the atmosphere) becomes 85%±5%, and based on this temperature, the temperature of the chill plate 371 may be controlled by the predetermined temperature range. Furthermore, a controlling temperature range of the chill plate 371 may be previously set, and when this temperature range does not fall within the predetermined temperature range calculated by the dew point and the relative humidity, the controlling temperature range of the chill plate 371 may be controlled to correct it.

In the present invention described above, an anti-reflection film may be formed on the surface of the wafer W before coating the resist, instead of the hydrophobic processing. In this case, since the wafer W is cooled to a predetermined temperature before the processing of forming the anti-reflection film, for example, a unit for forming the anti-reflection film is added to the processing unit U, and when the wafer W is transferred to the unit for forming the anti-reflection film based on the temperature of the transfer area, the temperature of the cooling section 304 is controlled based on the temperature of the transfer area so that the temperature of the wafer W reaches a temperature for performing the processing.

Figure 29:
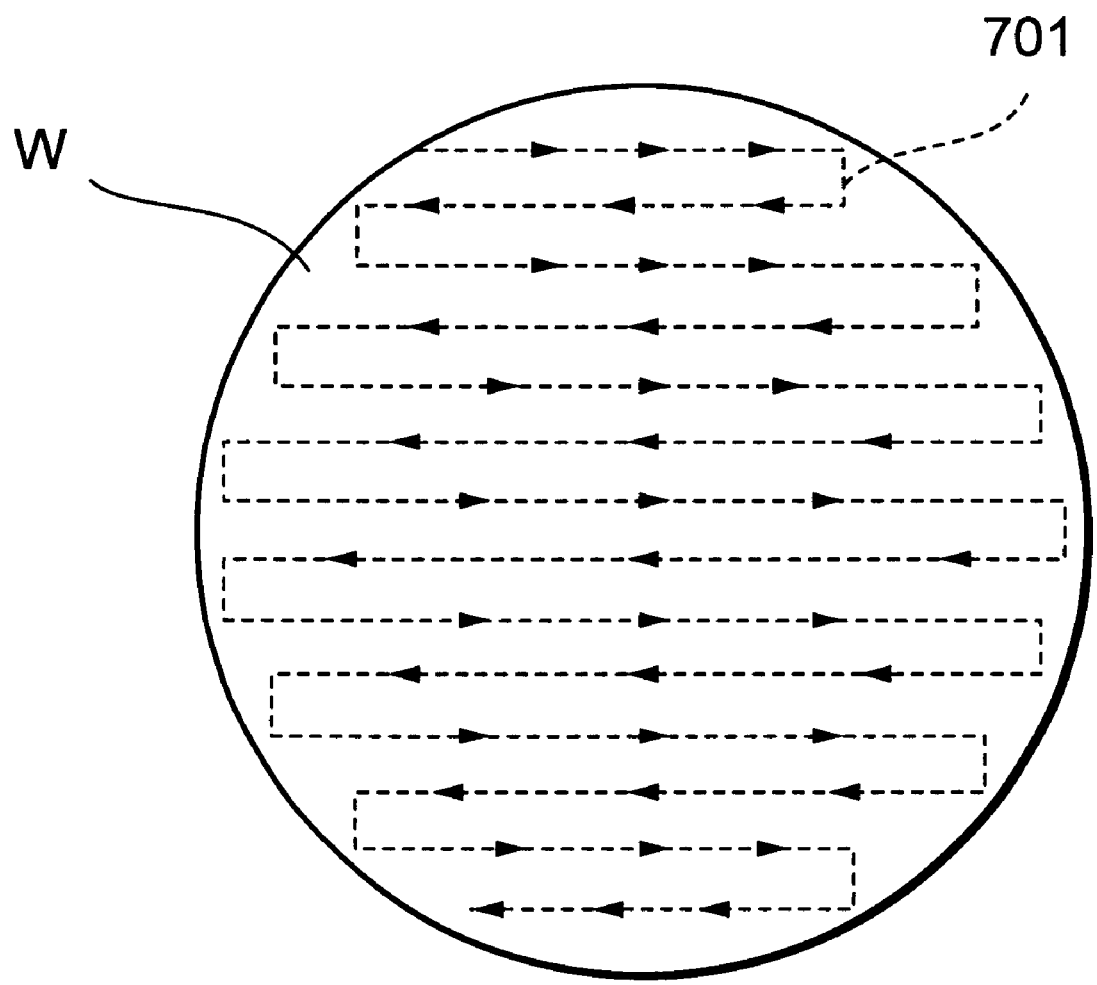
FIG. 29 is a view for explaining an applied example of the fourth embodiment.
Figure 30:
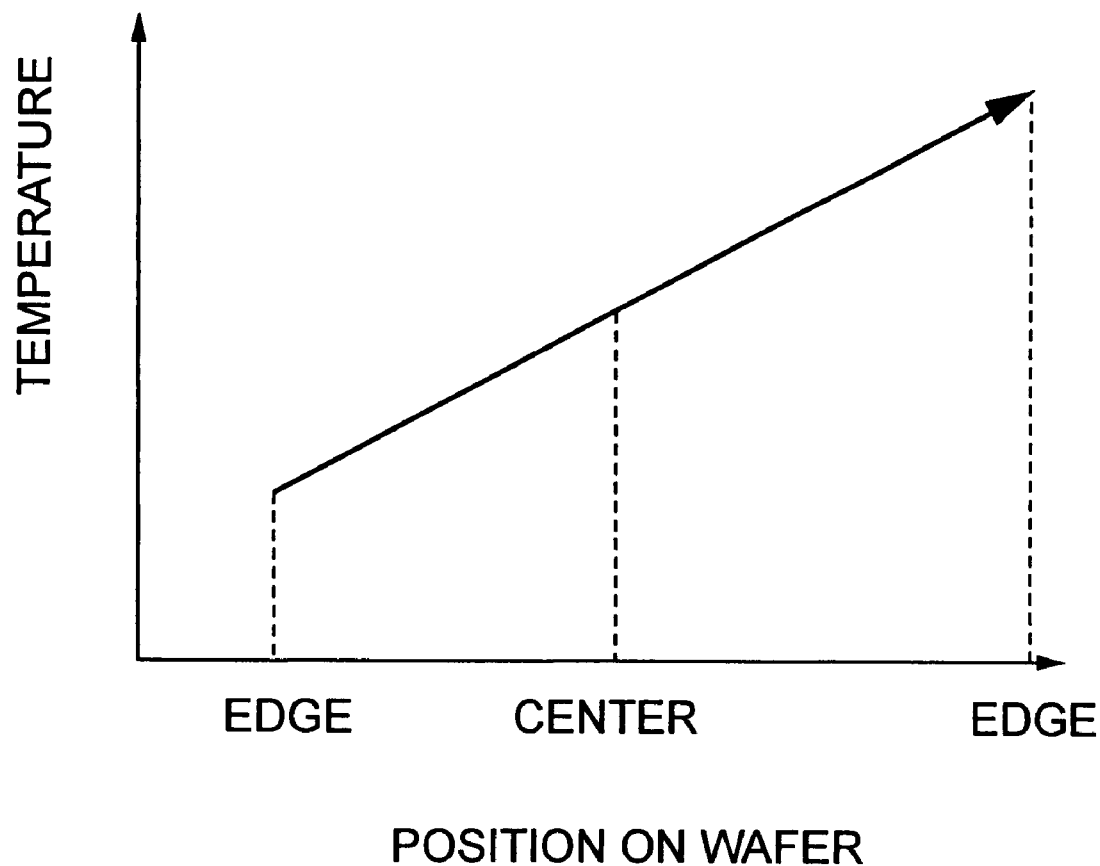
FIG. 30 is a view for explaining an applied example of the fourth embodiment.

Further, as shown in FIG. 29, a beam 701 scans on the wafer W in due order in the aligner S4. Therefore, a time lag occurs in a reaction depending on the area of the wafer W. In the reaction inhibiting section 307, as shown in FIG. 30, the aforesaid time lag can be avoided when the cooling extent is changed according to the area of the wafer W. More specifically, for example, the area where the beam 701 is emitted earlier in time in the aligner S4 may be cooled to a lower temperature. Further, the aforesaid time lag can be also avoided when the timing of the cooling is changed according to the area of the wafer W. In concrete, for example, the area where the beam 701 is emitted earlier in time in the aligner S4 may be cooled earlier.

Incidentally, the anti-reflection film is formed to prevent the reflection which occurs at the lower side of the resist in exposure when the chemically amplified resist is used. Further, in the present invention, the substrate is not limited to the wafer, and may be a glass substrate for a liquid crystal display.

As described above, according to the present invention, the substrate is transferred from the aligner to the heating section with the resolution reaction of the resist being inhibited, which makes it possible to enhance the uniformity of the developing line width.

(Fifth Embodiment)

Next, the fifth embodiment in which the present invention is applied to a substrate coating and developing system will be explained.

Figure 31:
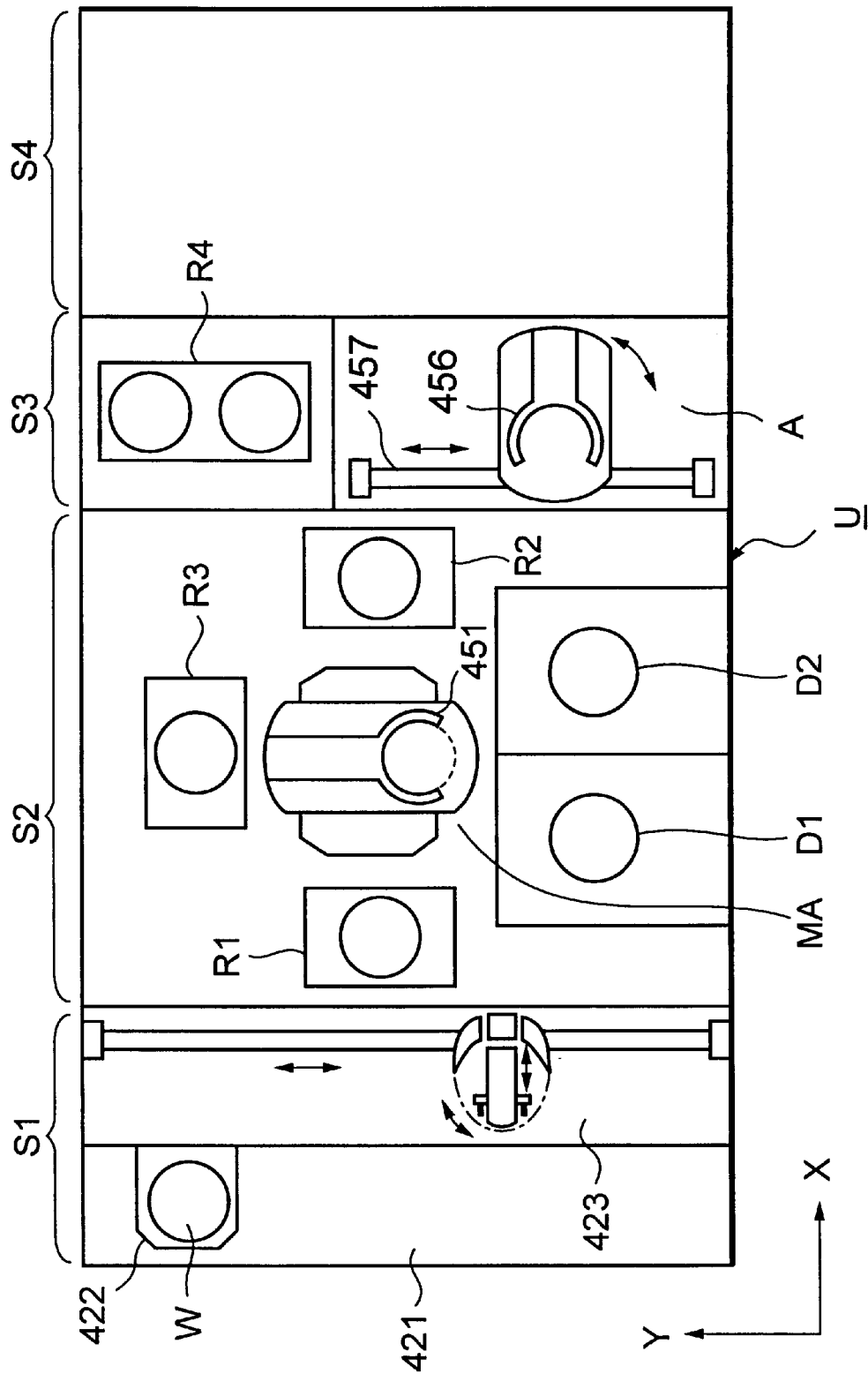
FIG. 31 is a schematic plan view showing a coating and developing system according to a fifth embodiment of the present invention.
Figure 32:
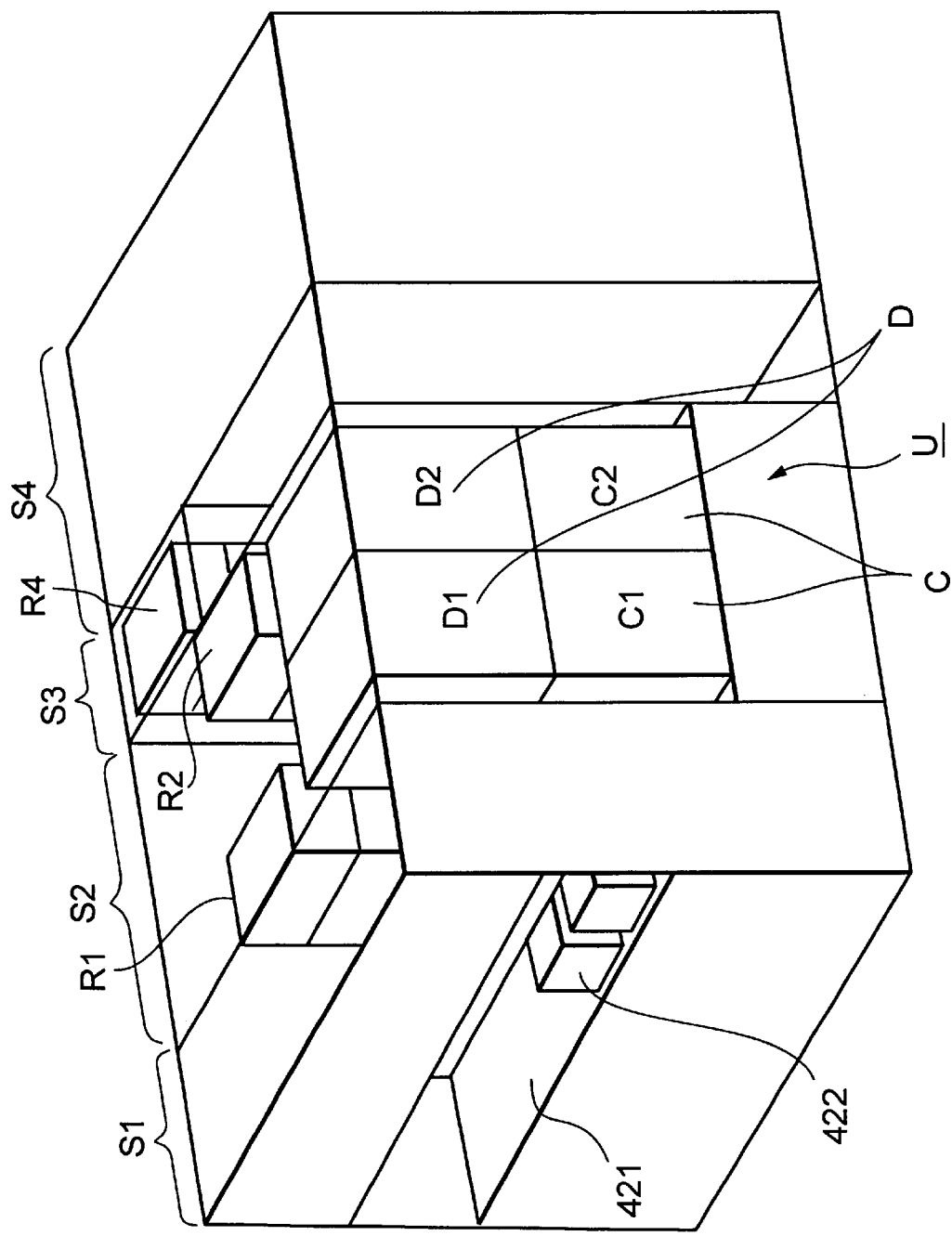
FIG. 32 is a schematic perspective view showing the coating and developing system.

FIG. 31 is a schematic plane view of this embodiment, FIG. 32 is a perspective view showing an interior seen through, in which S1 is a cassette station, S2 is a processing station for performing a coating processing of a resist, a developing processing, and the like for the wafer W, S3 is an interface station, and S4 is an aligner.

The cassette station S1 includes a cassette stage 421 as a mounting section on which a wafer cassette (hereinafter referred to as a "cassette") 422 such as four substrate cassettes housing a plurality of substrates, for example, 25 wafers W is amounted, and a delivery arm 423 as a delivery means for delivering the wafer W between the cassette 422 on the cassette stage 421 and the processing station S2. The delivery arm 423 is structured to be ascendable and descendable, movable in the X-direction and the Y-direction, and rotatable around a vertical axis.

Further, the processing station S2 includes, for example, two developing units D (D1, D2) as two developing processing sections, two coating units C (C1, C2) and, for example, three shelf units R (R1, R2, R3), for example, one substrate transfer means MA, and is structured to deliver the wafer W between the cassette station S1 and the interface station S3, and in the station S2, to perform processing of coating the wafer W with a resist solution, processing of developing the wafer W, and processing of heating and then cooling the wafer W to a predetermined temperature before and after these processing.

In explanation of an example of a layout of the processing station S2 like this, processing units U including the developing unit D, the coating unit C and so on are provided with two tiers on the back side of the aforesaid delivery arm 423, for example, on the right side when, for example, the back side is seen from the cassette station S1. That is, two developing units D1, D2 are disposed side by side in a direction almost perpendicular to the direction of arrangement of the cassettes on the cassette stage 421 with the developing unit D1 on the front side, and in the lower tiers of these developing units D1 and D2, two coating units C1 and C2 are provided side by side with the coating unit C1 on the front side. Incidentally, in the following explanation, the cassette station S1 side is referred to as the front side and the aligner S4 side is referred to as the back side.

Moreover, on the left side of the processing units U as seen from the cassette station S1, the substrate transfer means MA which is structured, for example, to be ascendable and descendable, movable right and left and back and forth, and rotatable around a vertical axis is provided to deliver the wafer W among the coating units C, the developing units D, and the shelf units R. Further, the shelf unit R1 is disposed on the front side of the substrate transfer means MA as seen from the cassette station S1 side, the shelf unit R2 is disposed on the back side thereof, and the shelf unit R3 is disposed on the left side thereof, respectively.

It should be noted that in FIG. 32, the shelf unit R3 and the substrate transfer means MA are omitted for convenience.

Figure 33:
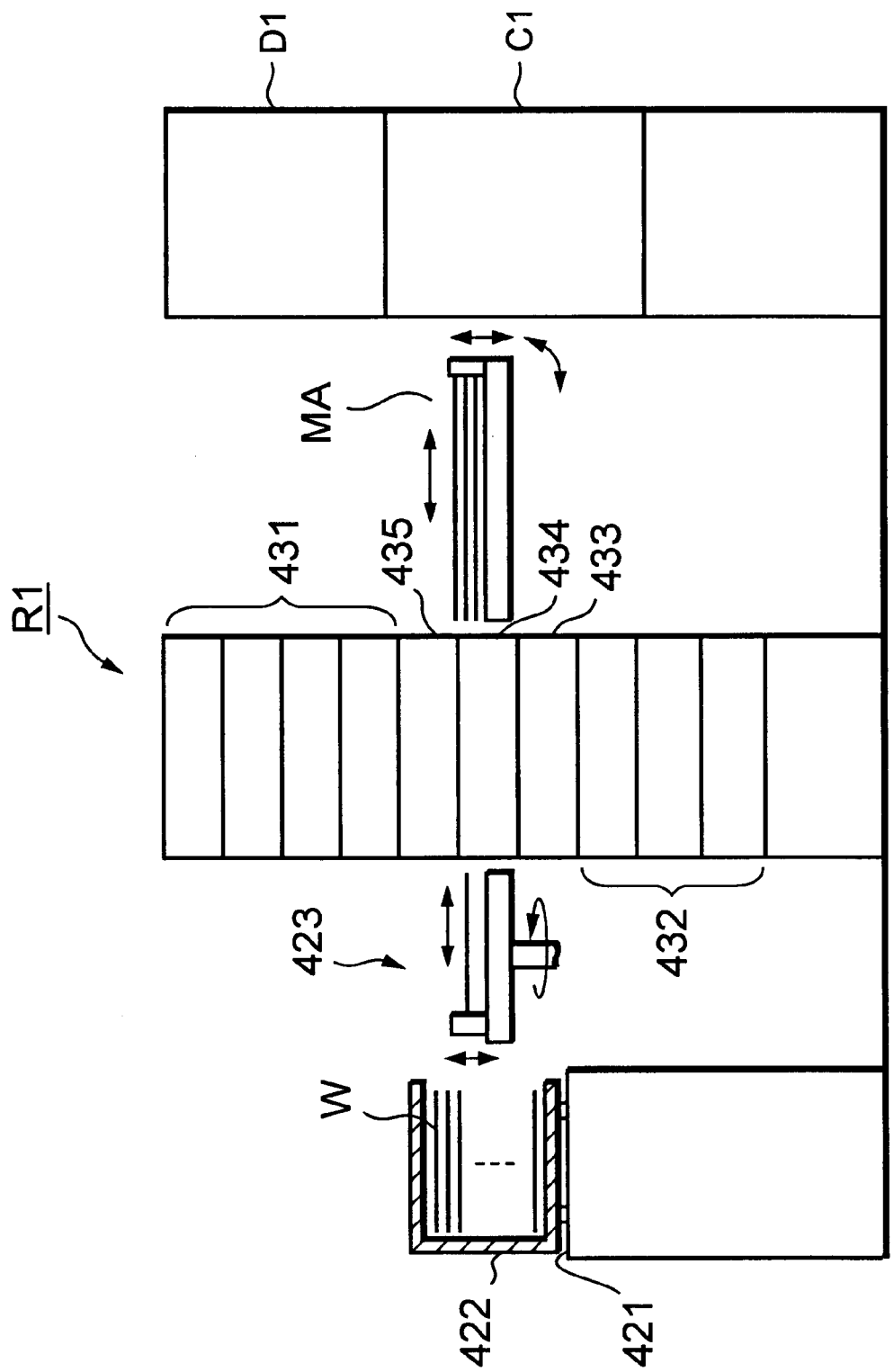
FIG. 33 is a side view showing an example of a shelf unit and a developing unit of the coating and developing system.
Figure 34:
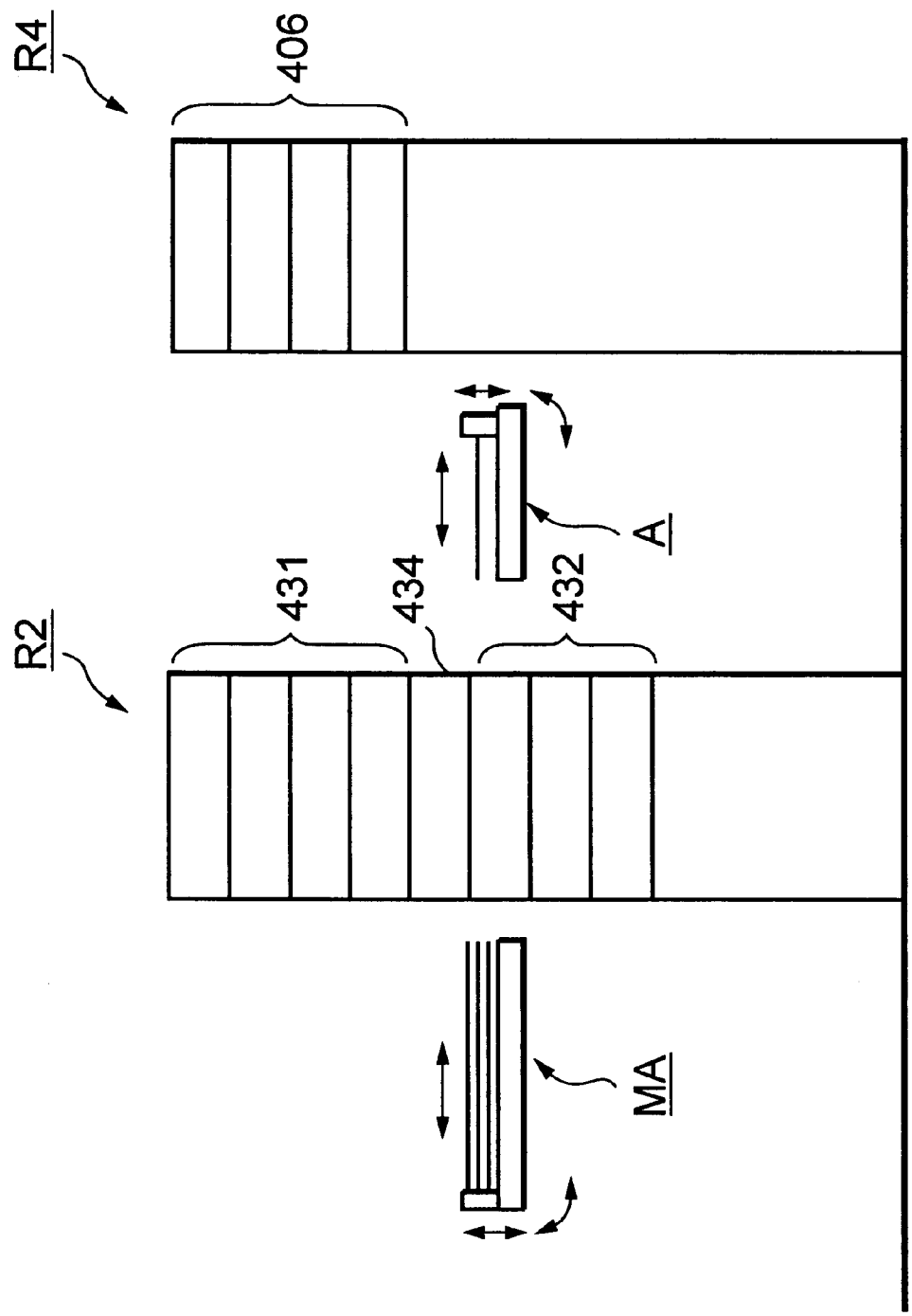
FIG. 34 is a side view showing an example of the shelf unit of the coating and developing system.

As shown with the shelf unit R1 in FIG. 33 and the shelf unit R2 in FIG. 34, heating sections 431 for heating the wafer W, cooling sections 432 for cooling the wafer W, a hydrophobic section 433 for making the surface of the wafer W hydrophobic in the shelf units R1 and R3, a delivery section 434 including a delivery table for delivering the wafer W between the delivery arm 423 of the cassette station S1 and the substrate transfer means MA in the shelf unit R1, and for delivering the wafer W between the transfer arm A of the interface station S3 which will be described later and the substrate transfer means MA in the shelf unit R2, and an alignment section 435 for performing alignment of the wafer W in the shelf unit R1 are vertically arranged in the aforesaid shelf units R (R1, R2, R3).

The aforesaid heating section 431 is structured so that the wafer W is heated to a predetermined temperature by mounting the wafer W on a surface of a hot plate in which, for example, a heater is embedded, and the aforesaid cooling section 432 is structured so that the wafer W is cooled to a predetermined temperature by mounting the wafer W on a surface of a chill plate in which, for example, a thermo module is embedded.

Figure 35:
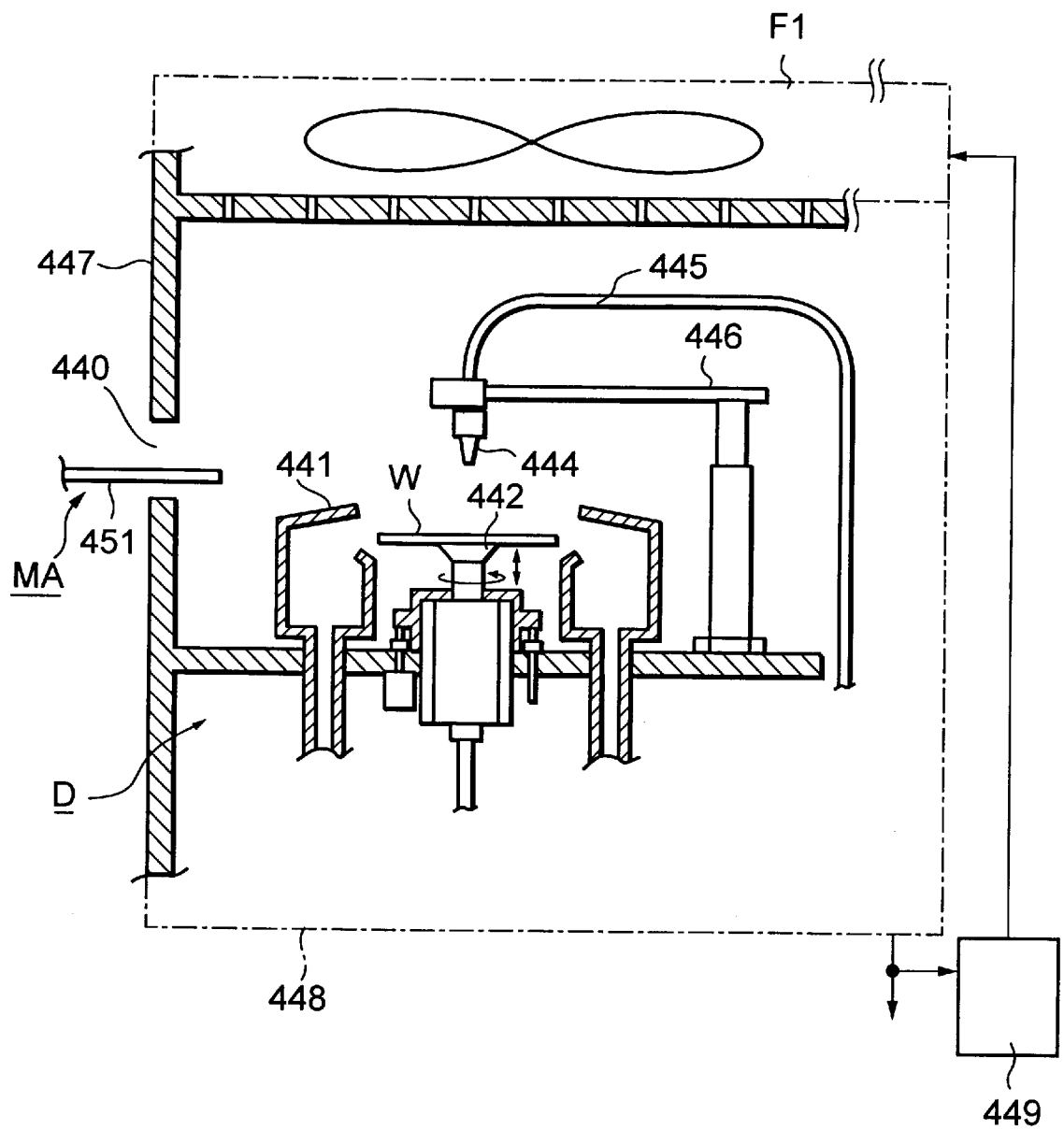
FIG. 35 is a sectional view showing an example of the developing unit.

In explanation of the aforesaid developing unit D based on, for example, FIG. 35, in which the numeral 441 denotes a cup, and a spin chuck 442 which has a function of vacuum suction is provided rotatably inside the cup 441. The spin chuck 442 is structured to be ascendable and descendable by a raising and lowering mechanism 443, and when it is positioned above the cup 441, the wafer W is delivered to an arm 451 which will be described later of the aforesaid substrate transfer means MA.

Regarding the delivery of the wafer W, the wafer W on the arm 451 is delivered to the spin chuck 442 on the upper side of the cup 441, to which it is relatively raised from its lower side, and delivered from the spin chuck 442 side to the arm 451 by the reverse operational sequences. The numeral 444 denotes a discharge nozzle of a processing solution, for example, a developing solution, the numeral 445 denotes a processing solution supply pipe, and the numeral 446 denotes a supporting arm for moving the nozzle horizontally.

The aforesaid discharge nozzle 444 is structured to include a plurality of supply holes which are arranged, for example, in a diameter direction of the wafer W, and the developing solution is discharged onto the surface of the wafer W on the spin chuck 442 from the discharge nozzle 444, and the developing solution is heaped up on the wafer W by half rotating the spin chuck 442 so that a solution film of the developing solution is formed.

Further, the coating unit C has almost the same structure as the developing unit D, whereas in the coating unit C, the discharge nozzle 444 is structured to supply the developing solution onto, for example, a point almost close to the center of the wafer W, and the resist solution is dropped onto the surface of the wafer W on the spin chuck 442 from the discharge nozzle 444, and the resist solution is spread over to coat the wafer W by rotating the spin chuck 442.

Moreover, the processing units U are spatially closed. Namely, as shown in FIG. 35, the developing unit D or the like is partitioned off from other areas by a wall portion 447 and a partition wall 448 partitions respective sections such as the developing unit D1 and the coating unit C1, and a delivery port 440 is formed in the wall portion 447 of each section such as the developing unit D1 at a position corresponding to the arm 451 of the substrate transfer means MA.

Furthermore, air which is rid of impurities, adjusted at a predetermined temperature, for example, at 23° C. as a coating temperature of the developing solution and at a predetermined humidity is sent into respective sections which are partitioned off by the wall portion 447 and the partition wall 448, whereby these areas have, so to speak, the atmosphere which is adjusted with high accuracy.

Namely, for example, in the partitioned processing unit U, for example as shown in FIG. 35, a filter unit F1 is provided to cover the upper side thereof, and the atmosphere collected from the lower side of the processing unit U is exhausted to a plant exhaust system, while a part thereof is introduced to a filter device 449, and the air cleaned by the filter device 449 is blown out as down-flowing air through the aforesaid filter unit F1 into each section.

The aforesaid filter unit F1 includes, for example, a filter for cleaning air, and when a chemically amplified resist is used, includes a chemical filter to which an acidic component for removing alkali components in the air such as an ammoniacal component and an amine is added, a suction fan, and so on.

Further, the aforesaid filter device 449 includes an impurity removing section for removing impurities, a heating mechanism, a humidifying mechanism, a feeding section for feeding the air, and so on.

When the chemically amplified resist, for example, is used as the resist solution, it is necessary to remove the alkali component because a catalytic reaction due to an acid which will be described later is inhibited if the alkali component such as a trace of ammonia included in the air and the amine generated from a wall coating touches the acid on the resist surface to deteriorate a shape of a pattern. Therefore, it is necessary to prevent the alkali component from getting into the developing processing atmosphere, and hence the processing unit is spatially closed to prevent an entrance of the alkali component from the outside by using the chemical filter.

The aforesaid substrate transfer means MA is the same as the one shown in, for example, FIG. 23.

The interface station S3 is connected next to the processing station S2, and the aligner S4 as an exposure section for exposing the wafer W on which a resist film is formed is connected to the back side of the interface station S3. The interface station S3 includes a shelf unit R4 in which CHP process stations (Chilling Hot Plate Processing station) 406 for heating and thereafter cooling the wafer W are provided in multiple tiers and the transfer arm A for delivering the wafer W among the shelf unit R4, the shelf unit R2 of the processing station S2, and the aligner S4, and is structured to deliver the wafer W between the processing station S2 and the aligner S4 and in the station S3, to transfer the wafer W after exposure to the CHP process station 406 with a resolution reaction of the resist being inhibited, where heating processing for facilitating the resolution of the resist and the cooling processing for stopping the resolution reaction of the resist are performed.

In explanation of an example of a layout of the interface station S3 like this, the shelf unit R4 is provided, for example, on the left side when, for example, the back side is seen from the cassette station S1, and on the right side thereof, the transfer arm A which is structured, for example, to be ascendable and descendable, movable right and left and back and forth, and rotatable around a vertical axis is provided.

Figure 36A:
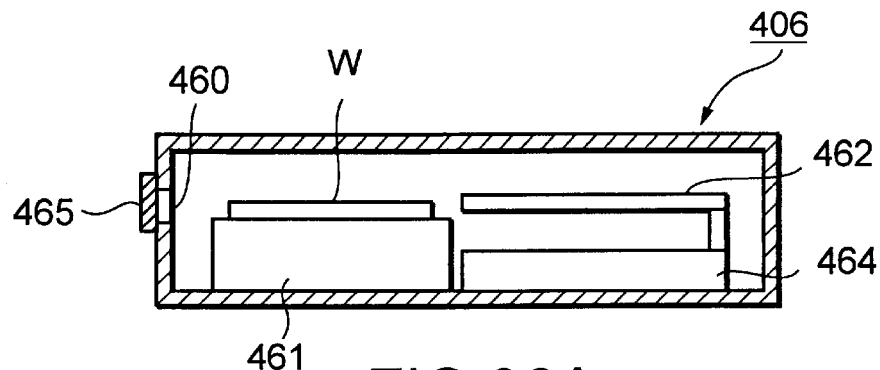
FIG. 36A to FIG. 36D are sectional views each showing a CHP process station provided in the shelf unit.
Figure 36B:
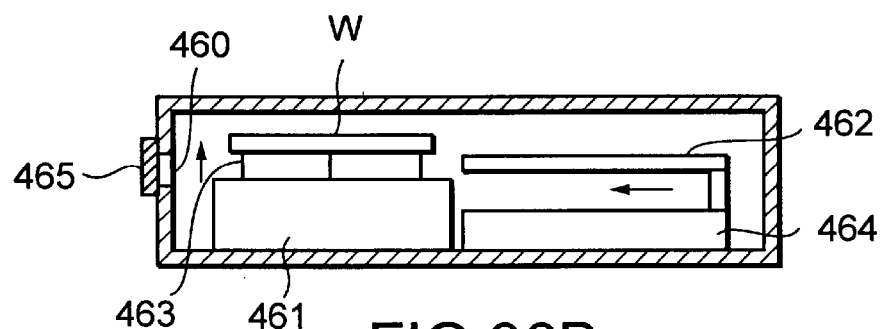
Figure 36C:
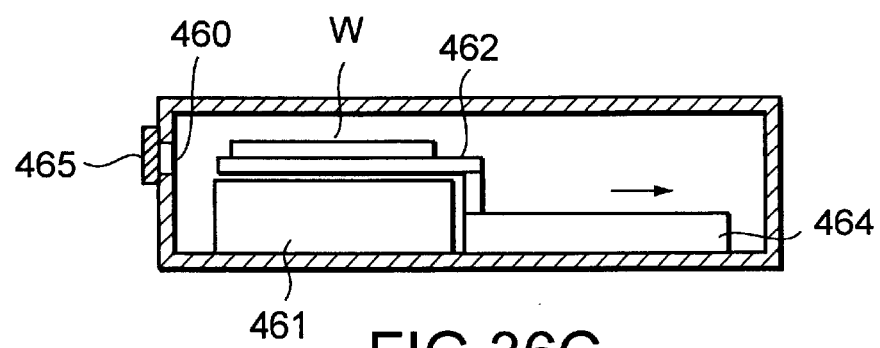
Figure 36D:
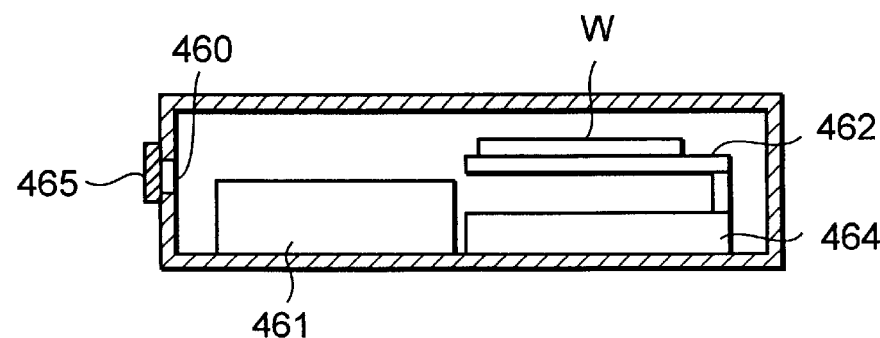

The aforesaid CHP process station 406 includes, for example as shown in FIG. 36A to FIG. 36D, a hot plate 461 as a heating section for heating the wafer W and a chill plate 462 as a cooling section for cooling the wafer W in a processing room with a carrying in/out port 460 formed therein, in which the wafer W is first mounted on the hot plate 461 to be heated to a predetermined temperature (FIG. 36A), then, the wafer W is lifted from the hot plate 461 by, for example, a projecting pin 463 and the chill plate 462 is moved to a position on the lower side of the wafer W by a transfer means 464 to deliver the wafer W to the chill plate 462 (FIG. 36B, FIG. 36C), and thereafter, the chill plate 462 is moved to a side position of the hot plate 461 with the wafer W mounted thereon to cool the wafer W to a predetermined temperature (FIG. 36D). Thus, the heating time is controlled by the delivery of the wafer W between the hot plate 461 and the chill plate 462 in this unit, thereby preventing an over-bake.

The structure of the transfer arm A is the same as that of the substrate transfer means MA except that an arm 456 for holding the wafer W is one and that the arm 456 is structured to be movable in the direction of arrangement of the cassettes (the Y-direction) of the cassette station S1. For example, in the transfer arm A, a rotating drive section 455 is movable along a guide rail 457 which is provided in the Y-direction, whereby the arm 456 is structured to be movable in the X- and the Y-direction, to be ascendable and descendable, and rotatable around the vertical axis.

Figure 37:
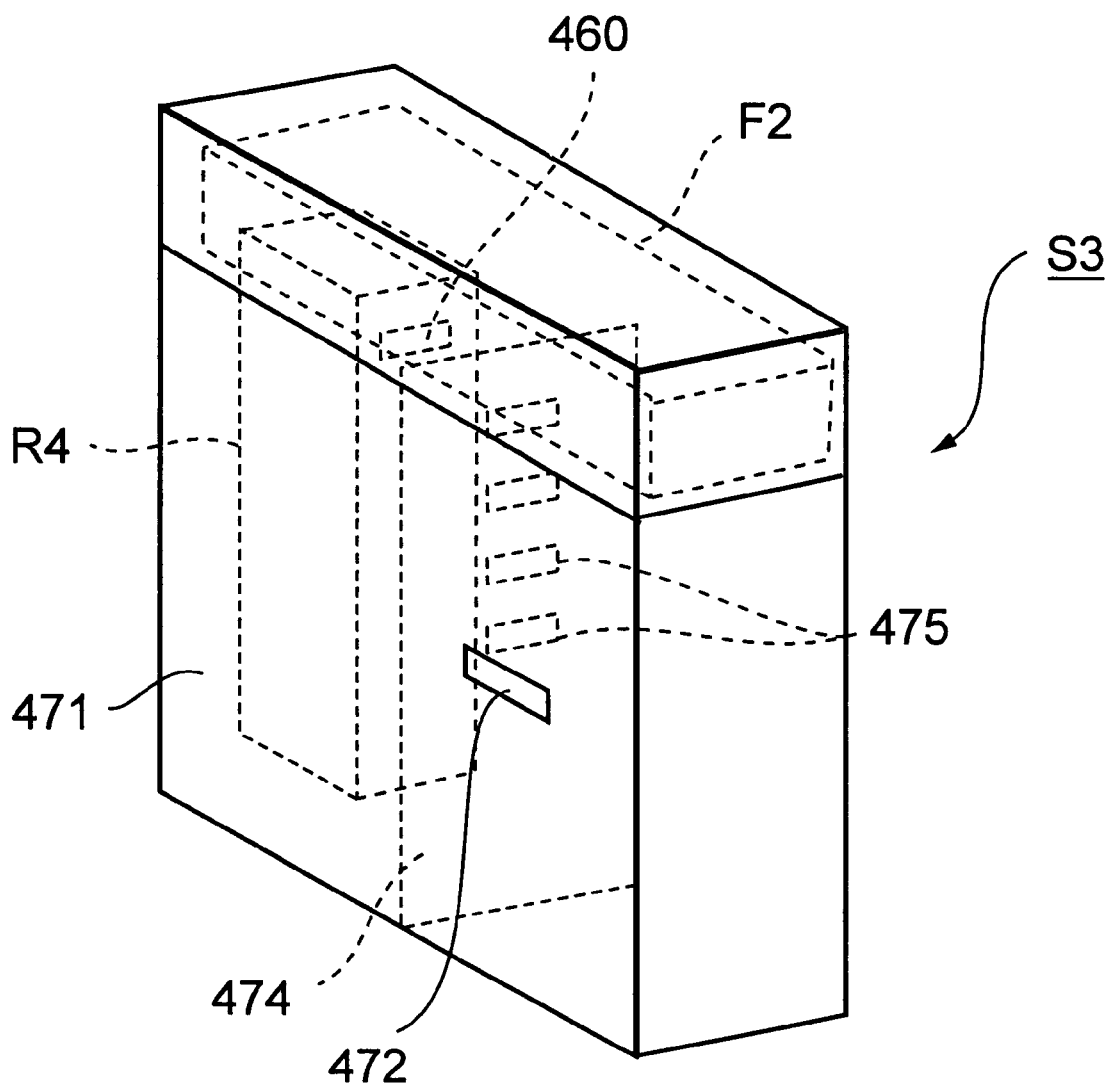
FIG. 37 is a perspective view showing an example of an interface station.
Figure 38:
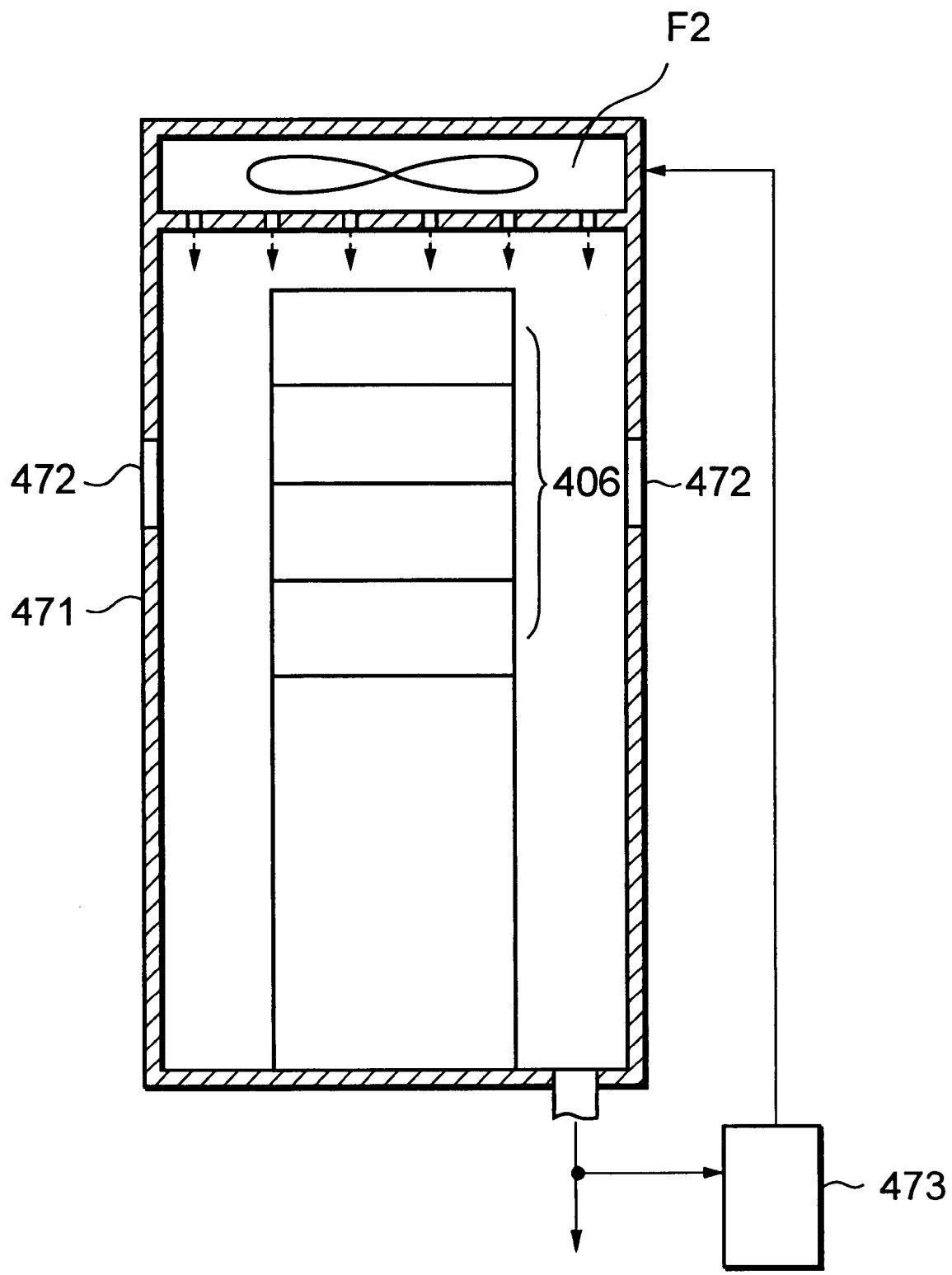
FIG. 38 is a sectional view showing an example of the interface station.
Figure 39:
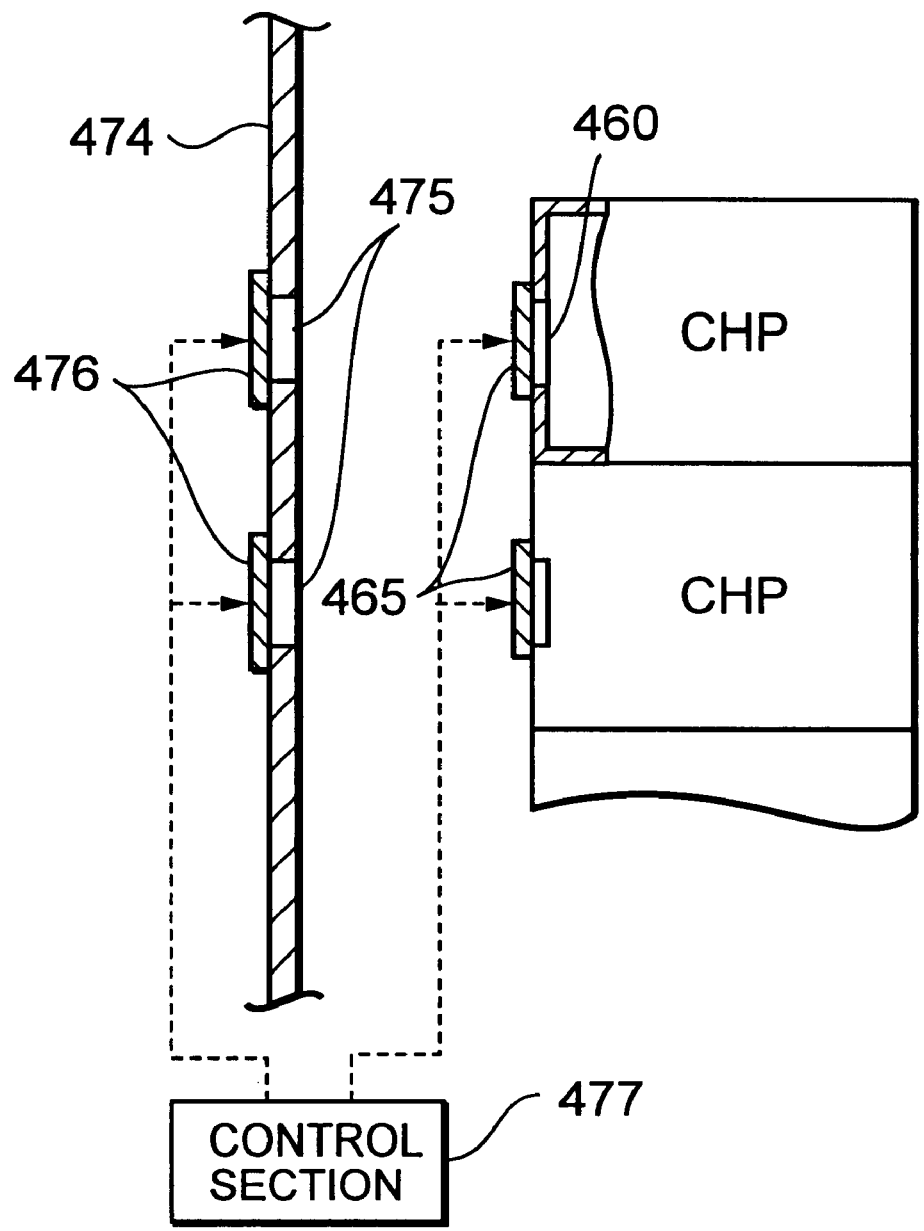
FIG. 39 is a side view showing an example of the CHP process station and a partition wall.

Moreover, the interface station S3 is spatially closed. Namely, as shown in FIG. 37 and FIG. 38, it is partitioned off from other areas by a wall portion 471, and a delivery port 472 is formed in the wall portion 471 at a position corresponding to the arm 456 of the transfer arm A.

In the interface station S3, the filter unit F2 which includes, for example, a filter for cleaning air, and when the chemically amplified resist is used, includes the chemical filter to which the acidic component for removing alkali components in the air such as the ammoniacal component and the amine is added, the suction fan and so on is provided to cover the upper side thereof, and similarly to the processing unit U, the atmosphere collected from the lower side of the interface station S3 is exhausted to the plant exhaust system, while a part thereof is introduced to a filter device 473, and the air cleaned by the filter device 473 is blown out as down-flowing air through the aforesaid filter unit F2 into each section.

The aforesaid filter device 473 includes an impurity removing section for removing the impurities, a heating mechanism, a humidifying mechanism, a feeding section for feeding air and so on, and thus the air which is rid of the impurities, adjusted at a predetermined temperature, for example, at such a temperature that the progress of the resolution reaction of the resist is inhibited and that dew formation does not occur, which is 10° C. to 15° C., and adjusted at a predetermined humidity is sent into the interface station S3.

Further, in the interface station S3, a partition wall 474 partitions an area in which the shelf unit R4 is provided from an area in which the transfer arm A is provided. In the partition wall 474, a delivery port 475 of the wafer W is formed at a position corresponding to each carrying in/out port 460 of the wafer W of the aforesaid CHP process stations 406, and in this example, the carrying in/out port 460 and the delivery port 475 are structured to be freely opened and closed by shutters 465 and 476, respectively, and the timing of the opening and closing of the shutters 465, 476 is controlled by a controlling section 477.

Next, the operational sequence of the above-described embodiment will be explained. First, an automatic transfer robot (or an operator) carries the cassette 422 housing, for example, the 25 wafers W onto the cassette stage 421 and the wafer W is taken out the cassette 422 by the delivery arm 423 to be placed in the delivery section 434 in the shelf unit R1 of the processing station S2.

The wafer W is transferred by the route of the substrate transfer means MA→the hydrophobic section 433 of the shelf units R→the substrate transfer means MA→the cooling section 432 of the shelf units R→the substrate transfer means MA→the coating unit C, and after the surface of the wafer is made hydrophobic, it is cooled to a predetermined temperature to be subjected to temperature adjustment, and coated with the resist solution at a predetermined temperature, for example, at 23° C. in the coating unit C.

The wafer W which is thus coated with the resist solution is transferred by the route of the substrate transfer means MA→the heating section 431 of the shelf units R→the substrate transfer means MA→the cooling section 432 of the shelf units R to be subjected to temperature adjustment, and subsequently transferred by the route of the substrate transfer means MA the delivery section 434 of the shelf unit R2→the transfer arm A of the interface station S3→the aligner S4 to be exposed.

The wafer w after the exposure is transferred by the route of the aligner S4 the transfer arm A of the interface station S3→the CHP process station 406 of the shelf unit R4, in which it is first heated to a predetermined temperature on the hot plate 461 of the CHP process station 406 and thereafter cooled to a predetermined temperature on the chill plate 462 to be subjected to temperature adjustment.

On this occasion, since the partition wall 474 partitions the transfer arm A from the CHP process station 406, the shutter 465 of the CHP process station 406 to which the wafer W is transferred and the shutter 476 of the delivery port 475 which corresponds thereto are first opened to transfer the wafer W to the hot plate 461 of the CHP process station 406, then these shutters 465 and 476 are closed, and subsequently, predetermined processing is performed on the hot plate 461 and the chill plate 462. Then, the shutter 465 of the CHP process station 406 and the shutter 476 of the partition wall 474 are opened again to deliver the wafer W to the transfer arm A, and thereafter, these shutters 465 and 476 are closed.

The present invention is characterized in that the temperature of the transfer area of the wafer W which is from the aligner S4 to the heating section (the hot plate 461) for performing facilitating processing of the resolution reaction of the resist is adjusted at such a temperature that the progress of the resolution reaction of the resist is inhibited and dew formation does not occur, for example, at about 10° C. to 15° C. Therefore, in this example, the temperature inside the interface station S3 is adjusted at 10° C. to 15° C., and the CHP process station 406 is provided inside the interface station S3.

Figure 40A:
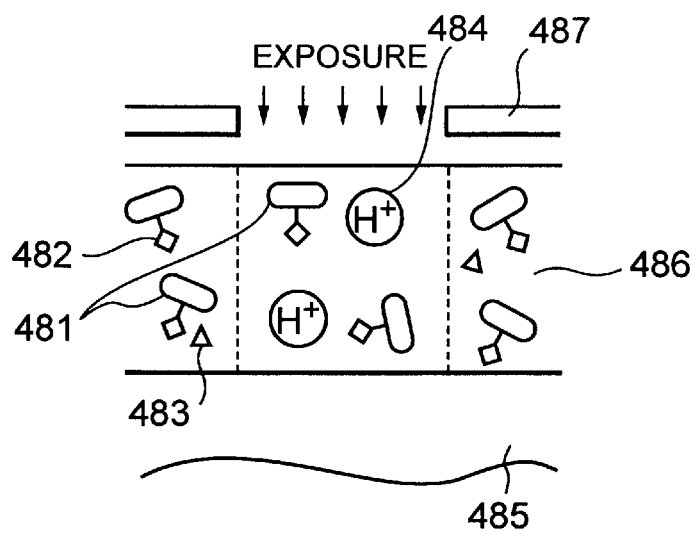
FIG. 40A to FIG. 40C are explanatory views showing a resolution reaction of a chemically amplified resist.
Figure 40B:
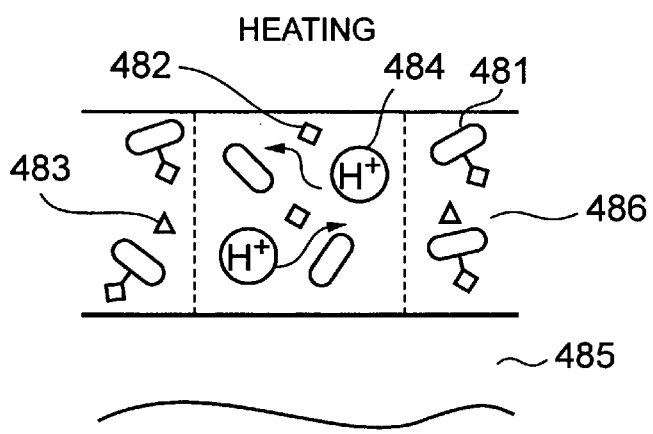
Figure 40C:
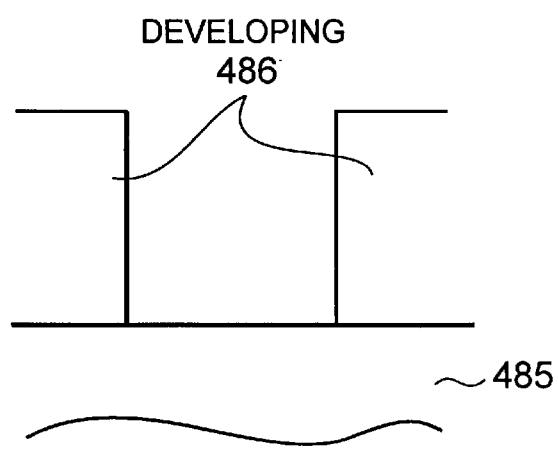

In explanation of the chemically amplified resist, as shown in FIG. 40A to FIG. 40C, this resist includes a basic resin 481 as a main component, a protective group 482 for suppressing dissolution of the basic resin 481 in the developing solution, and a photoacid generator 483, and has a property that the entire area to be exposed is exposed with a small amount of exposing energy.

With this kind of resist, for example as shown in FIG. 40A, an acid 484 is generated from the photoacid generator 483 by exposure, and thereafter, as shown in FIG. 40B, the acid 483 cleaves the protective group 482 from the basic resin 481 to make it soluble in the alkaline solution by using thermal energy by heating processing. Next, the acid 484 cleaves another protective group 482, and hence this reaction occurs like a chain reaction. Subsequently, this chain reaction is stopped by cooling processing, and thereafter, as shown in FIG. 40C, a predetermined pattern is formed in developing processing by removing an area which becomes soluble in the alkaline solution by the chain reaction. In FIG. 40A to FIG. 40C, the numeral 485 is a substrate, the numeral 486 is a resist, and the numeral 487 is a mask on which a predetermined pattern is formed.

In the resist like this, since the acid 484 which is generated by the exposure acts as a catalyst, the resolution reaction (the reaction of cleaving the protective group 482 from the basic resin 481) progresses immediately after the exposure, although the progress is slow. However, progressing speed of the resolution reaction depends on the temperature, and progressing speed becomes considerably slow at the temperature which is lower than room temperature and at such a temperature as does not cause dew formation, for example, about 10° C. to 15° C., which makes it possible to inhibit the progress of the resolution reaction.

Therefore, by transferring the wafer W after the exposure through the transfer area the temperature of which is adjusted at about 10° C. to 15° C., as described above, to the hot plate 461, the progress of the resolution reaction of the resist during the transfer can be inhibited. Incidentally, the reason why a cooling temperature of the wafer W in the transfer area is set so as not to cause dew formation is that ununiform resolution progress and developing line width occur due to the acid 484 at the interface with the resist (the acid near the surface thereof) being absorbed into the resist solution if dew water adheres to the surface of the wafer W.

Here, in this example, the heating processing is performed by cleaving the protective group 482 from the resin 481 by the acid 484 on the hot plate 461 of the CHP process station 406 to make it soluble in the alkaline solution, and the cooling processing is performed to stop the chain reaction on the chill plate 462.

The wafer W which is thus processed in a predetermined manner in the CHP process station 406 is transferred by the route of the transfer arm A of the interface station S3→the delivery section 434 of the shelf unit R2 of the processing station S2→the substrate transfer means MA→the developing unit D, and the wafer W undergoes developing processing in the developing unit D at a predetermined temperature, for example, at 23° C. as the coating temperature of the developing solution.

Subsequently, the wafer W is transferred by the route of the substrate transfer means MA→the heating section 431 of the shelf units R the substrate transfer means MA the cooling section 432 of the shelf units R the substrate transfer means MA the delivery section 434 of the shelf unit R1→the delivery arm 423, in which the wafer W which is temporarily heated to a predetermined temperature and then cooled to a predetermined temperature is returned back, for example, into the original cassette 422 through the delivery section 434.

In the processing station S2, the wafer W is successively sent to the delivery section 434 of the shelf unit R1, and then transferred by the route of the vacant hydrophobic section 433→the vacant cooling section 432 of the shelf units R1, R2, R3→the vacant coating unit C→the vacant heating section 431 of the shelf units R1, R2, R3→the vacant cooling section 432 of the shelf units R1, R2, R3→the interface station S3, and the wafer W after the exposure should be transferred by the route of the vacant CHP process station 406 of the shelf unit R4 in the interface station S3→the vacant developing unit D of the processing station S2→the vacant heating section 431 of the shelf units R1, R2, R3→the vacant cooling section 432 of the shelf units R1, R2, R3→the delivery section 434 of the shelf unit R1.

According to the above embodiment, the wafer W after the exposure is transferred to the heating section through the transfer area which is cooled to such an extent that dew formation does not occur, which makes it possible to enhance the uniformity of developing line width. That is, the wafer W which is exposed in the aligner S4 is transferred to the heating section through a predetermined transfer area, but the time required for the tranfer of the aligner S4→the heating section is constant, and hence the resolution reaction of the resist during the transfer progresses to the almost same extent.

On this occasion, the temperature of the transfer area is controlled to such an extent that dew formation does not occur on the wafer W, and since the progress of the resolution reaction of the resist is inhibited at the temperature like this, the progress of the aforesaid resolution reaction of the wafer W is almost inhibited in the transfer area. Therefore, when the wafer W after the exposure is transferred to the CHP process station 406 which is a next process in this situation, the resolution reaction of the wafer W when transferred to the CHP process station 406 progresses to the almost same extent. Thus, since heating processing is performed for the wafer W of the same condition at all times, the above resolution reaction progresses to the almost same extent also in the heating processing, so that variations in developing line width can be suppressed and the uniformity of developing line width can be enhanced.

Further, in this example, since the CHP process station 406 is provided in the interface station S3, the transfer area of the aligner S4 the heating section is inside the interface station S3. Here, a capacity of the interface station S3 is comparatively smaller than that of the processing station S2, and hence the transfer area of the aligner S4→the heating section becomes narrower, so that it is advantageous to fill this transfer area with an atmosphere adjusted with high accuracy the temperature and humidity of which are adjusted in terms of cost.

Moreover, in the interface station S3, since the partition wall 474 partitions off the CHP process station 406 and the transfer arm A from each other, the area in which the transfer arm A is provided is less influenced by the hot plate 461 of the CHP process station 406 in terms of temperature, which makes it possible to facilitate temperature and humidity adjustment in the interface station S3.

Figure 41:
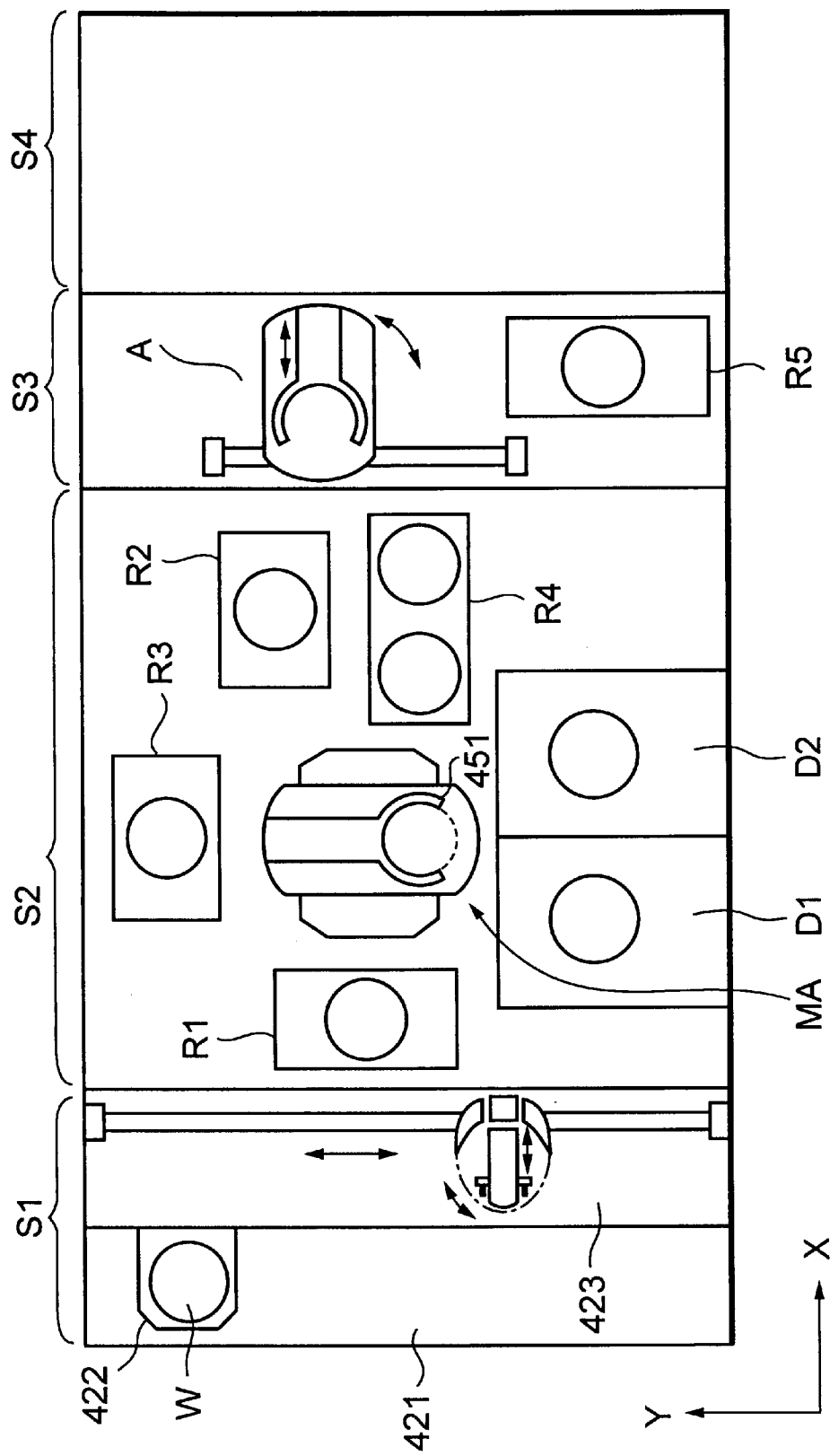
FIG. 41 is a sectional view showing another example of the coating and developing system.

In the present invention as described above, the shelf unit R4 which includes the CHP process stations 406 in multiple tiers may be provided in the processing station S2, as shown in FIG. 41. In this example, the aforesaid shelf unit R4 is provided on the right side of the back side of the substrate transfer means MA as seen from the cassette station S1, and the shelf unit R2 is provided on the left side thereof, and it is structured so that the wafer W is delivered by the substrate transfer means MA between the shelf units R2 and R4, and that the wafer W is delivered between the delivery section 434 of the shelf unit R2 and each CHP process station 406 of the shelf unit R4 by the transfer arm A of the interface station S3.

Figure 42:
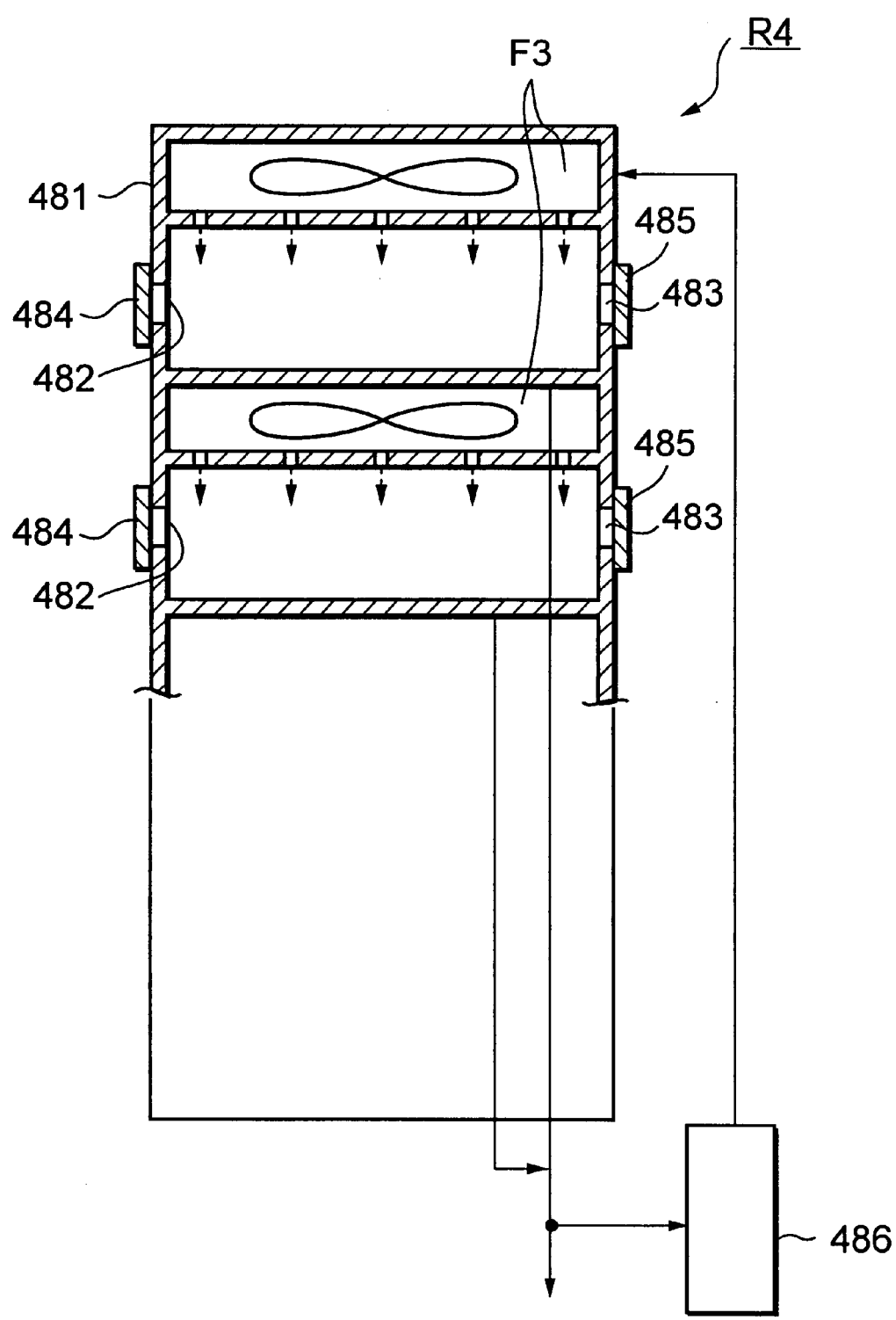
FIG. 42 is a sectional view showing another example of the shelf unit in which the CHP process station is provided.

The shelf unit R4 is, for example as shown in FIG. 42, partitioned off from other areas by the wall portion 481, and delivery ports 482 and 483 are formed in the wall portion 481 at a position corresponding to the arm 361 of the substrate transfer means MA and at a position corresponding to the arm 456 of the transfer arm A, and the delivery ports 482 and 483 are structured to be freely opened and closed by shutters 484 and 485, respectively.

In each CHP process station 406, the filter unit F3 which includes, for example, a filter for cleaning air, when the chemically amplified resist is used, includes the chemical filter to which the acidic component for removing alkali components in the air such as the ammoniacal component and the amine is added, the suction fan, or the like is provided to cover the upper side thereof, and the atmosphere collected from the lower side is exhausted, while a part thereof is introduced to a filter device 483, and the air cleaned by the filter device 483 is blown out as downflowing air through the aforesaid filter unit F3 into each section.

The aforesaid filter device 483 includes an impurity removing section for removing impurities, a heating mechanism, a humidifying mechanism, a feeding section for feeding the air and so on, and thus, the air which is rid of the impurities and adjusted at a predetermined temperature and a predetermined humidity is sent into the shelf unit R4, which makes it possible to prevent alkaline components from getting into this area.

Further, the shelf unit R5 in the interface station S3 includes shelf sections in multiple tiers for making the wafer W on standby when the wafer W is transferred from the aligner S4 to the CHP process station 406 of the shelf unit R4, and the shelf unit R5 is provided at a position which is accessible by the transfer arm A. Also in this example, the temperature in the interface station S3 is adjusted at such a temperature that the progress of the resolution reaction of the resist does is inhibited and that dew formation does not occur, for example, at about 10° C. to 15° C. The other structure is the same as that of the aforesaid substrate processing apparatus, and the structure of each of the shelf units R is the same as above.

In this example, the wafer W after exposure is transferred to, for example, the shelf section of the shelf unit R5 by the transfer arm A, where it waits for the transfer to the hot plate 461 of the CHP process station 406, and is transferred to a predetermined CHP process station 406 by the transfer arm A. Here, since the temperature in the interface station S3 is adjusted at about 10° C. to 15° C., the wafer W can be transferred from the aligner S4→the hot plate 461 with the resolution reaction of the resist being inhibited, thereby enhancing the uniformity of developing processing.

Next, another example of the present invention will be explained with reference to FIG. 43 and FIG. 44. In this embodiment, instead of adjusting the temperature inside the interface station S3, the wafer W is transferred from the aligner S4 to the hot plate 461 of the CHP process station 406 while a gas which is adjusted at a predetermined atmosphere is being supplied onto the wafer W in order to inhibit the resolution reaction of the resist.

Figure 43:
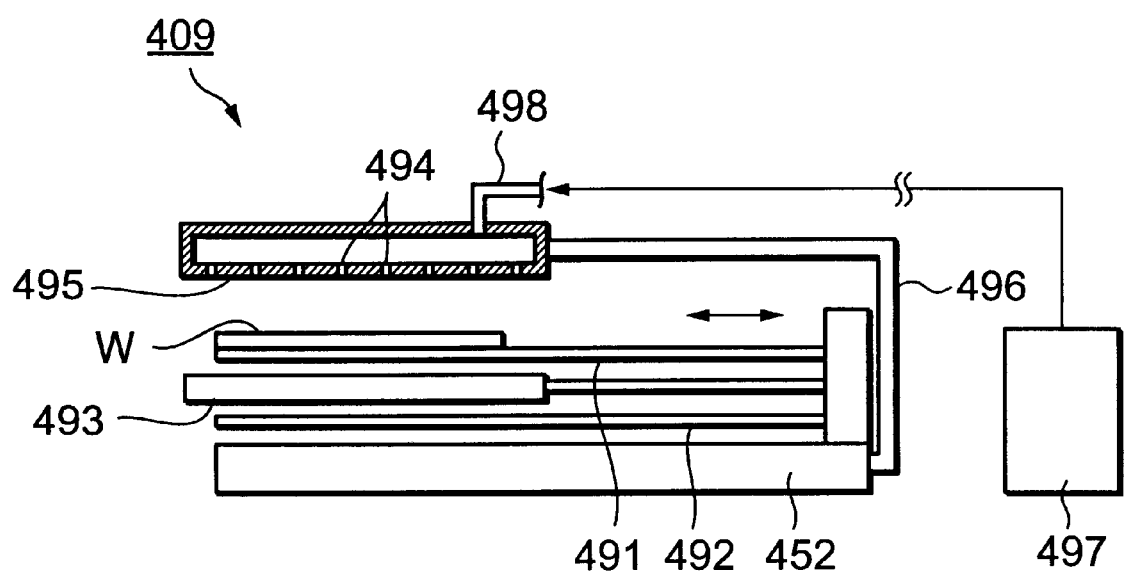
FIG. 43 is a sectional view showing still another example of the coating and developing system.
Figure 44:
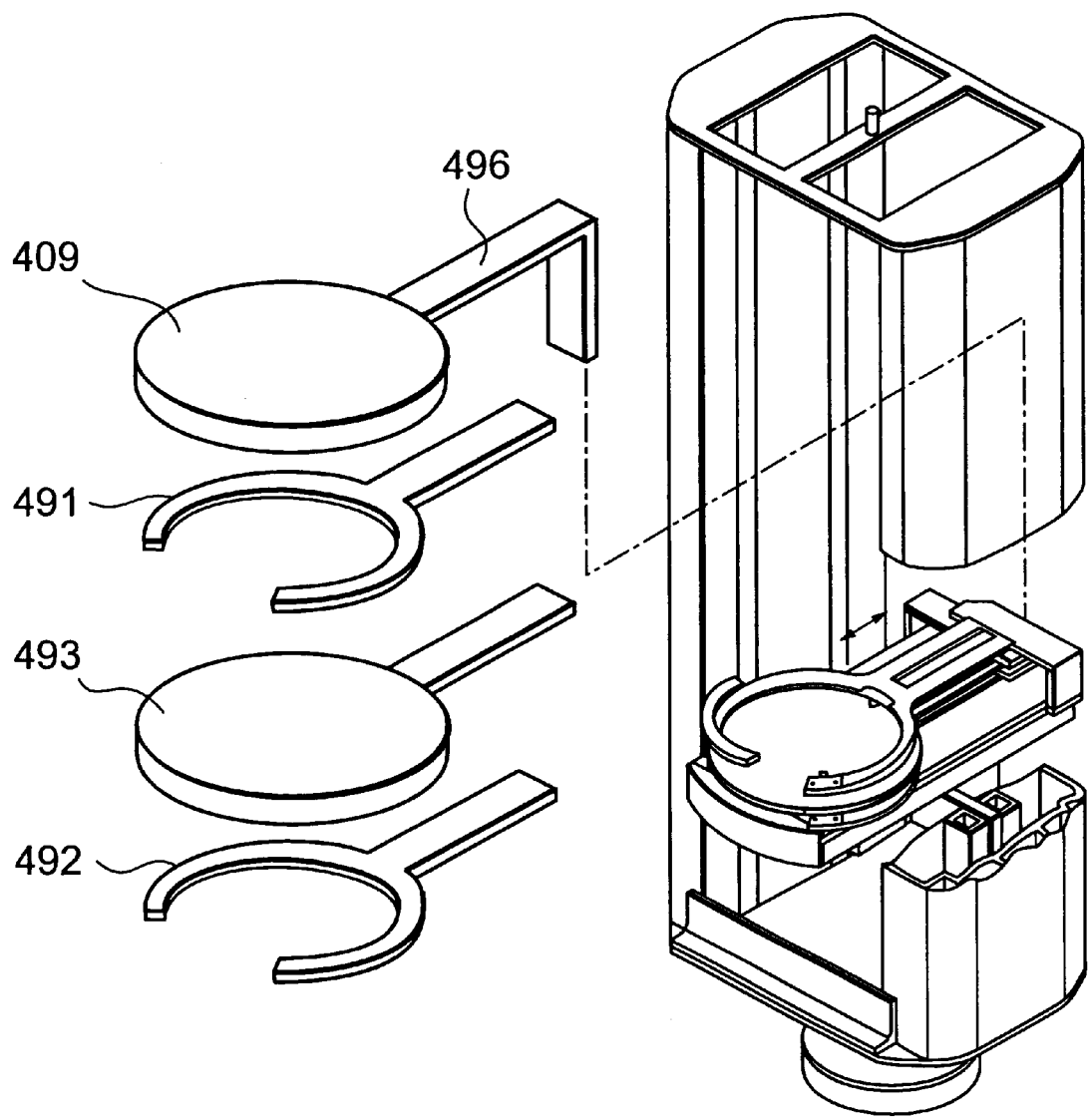
FIG. 44 is an exploded perspective view showing yet another example of the coating and developing system.

In this example, the transfer arm A which is provided in the interface station S3 for transferring the wafer W between the processing station S2 and the aligner S4 includes, for example shown in FIG. 43 and FIG. 44, two arms 491 and 492, and the upper arm 491 is structured to be an exclusive arm for transferring the wafer W after exposure to the CHP process station 406, and the lower arm 492 is structured to be an exclusive arm for transferring the wafer W before exposure from the processing station S2 to the aligner S4.

A gas supply section 409 for supplying the gas adjusted at a predetermined atmosphere onto the wafer W which is supported on the arm 491 is provided on the upper side of the upper arm 491, and a barrier plate 493 for preventing the gas adjusted at the predetermined atmosphere from flowing onto the wafer W supported on the lower arm 492 is provided under the upper arm 491.

The gas supply section 409 is in a shape of, for example, a flat cylinder, and attached to the back surface of a base table 452 (back surface of the arm 451 in a movement direction) by a supporting arm 496 so that a circular opening surface 495 provided with a plurality of gas supply holes 494 opposes the wafer W on the aforesaid arm 491. The opening surface 495 of the aforesaid gas supply section 409 is set to have a enough size capable of supplying air to the larger area than the wafer W supported on the arm 451.

In the gas supply section 409 like this, the gas, for example, air which is rid of impurities and adjusted at a predetermined temperature, for example, such a temperature that the progress of the resolution reaction of the resist is inhibited and that dew formation does not occur, for example, about 10° C. to 15° C. and at a predetermined humidity is supplied from a filter device 497 through a gas supply pipe 498, whereby the air is sent out onto the wafer W held on the arm 451 through the gas supply holes 494. The aforesaid filter device 497 includes an impurity removing section for removing the impurities, a heating mechanism, a humidifying mechanism, a feeding section for feeding the air and so on. Further, the aforesaid barrier plate 493 is set to have a enough size capable of covering the larger area than the wafer W supported on the arm 492 in order to prevent the gas supplied from the gas supply section from flowing onto the wafer W held on the lower arm 492.

In this kind of embodiment, the resolution reaction of the resist hardly progresses because the air which is adjusted at such a temperature that dew formation on the wafer W does not occur when the wafer W is transferred from the aligner S4 to the CHP process station 406 by the transfer arm A. Therefore, the wafer W can be transferred to the CHP process station 406 the progress of the resolution reaction of the resist being inhibited, which makes it possible to perform uniform processing while suppressing the occurrence of uneven developing.

In this example, as the gas supplied onto the wafer W, an inert gas such as nitrogen, a mixed gas of air and the inert gas and so on can be used besides air. Further, the arm 491 for transferring the wafer W after exposure may be provided on the lower side and the arm 492 for transferring the wafer W before exposure can be provided on the upper side, and the gas supply section 409 may be structured, not to be integrally attached to the transfer arm A, but to be separately provided to be able to supply the gas onto the wafer W held on the arm 491.

Further, this example in which the wafer W is transferred with the gas adjusted at a predetermined temperature being supplied thereon and the aforesaid example in which the temperature of the transfer area itself is controlled may be combined, in which case the wafer W after exposure can be transferred to the CHP process station 406 while further inhibiting the progress of the resolution reaction of the resist.

In the above example, the temperature in the transfer area or the like is controlled, but the progress of the resolution reaction of the resist may be inhibited by controlling the amount of moisture adhering to the wafer W. Namely, the acetal-based chemically amplified resist has a property that it requires a humidity of about 45% in the resolution reaction of the resist, and the resolution reaction hardly occurs when the humidity is not enough. Therefore, by lowering the humidity inside the transfer area to, for example, 20% or less to obtain a low humidity condition the humidity of which is lower than that of the air, and by making the wafer W wait therein for more than a predetermined time, the moisture amount adhering to the wafer W is made smaller than the moisture amount adhering to the wafer W when it is transferred into the interface station S3 after the exposure so that the progress of the resolution reaction of the resist can be inhibited considerably.

In concrete, it may be structured so that the gas the humidity of which is adjusted in the filter device 473 is supplied into the interface station S3 and the gas supply section 409. As the gas supplied into the interface station S3 or the like, air, an inert gas such as nitrogen, a mixed gas of the air and the inert gas and so on can be used.

Moreover, in the transfer area of the wafer W, the temperature control of the transfer area and the control of the moisture amount adhering to the wafer may be performed in combination, in which case the higher uniformity of developing line width can be secured because the progress of the resolution reaction of the resist can be further inhibited.

The CHP process station 406 may be installed not only in the interface station S3, but also inside the processing station S2, but when the temperature and the humidity in the transfer area between the aligner S4 and the CHP process station 406 are easy to change, the resolution reaction of the resist during the transfer progresses similarly when the transfer time is shorter, and hence it is preferable to install the CHP process station 406 in the interface station S3, and it is more preferable to install it near the aligner S4.

In the present invention described above, an anti-reflection film may be formed on the surface of the wafer W before coating the resist, instead of the hydrophobic processing. Incidentally, the anti-reflection film is formed to prevent the reflection which occurs on the lower side of the resist in exposure when the chemically amplified resist is used. Further, in the present invention, the substrate is not limited to the wafer, and may be a glass substrate for a liquid crystal display.

As described above, according to the present invention, the substrate is transferred from the aligner to the heating section with the resolution reaction of the resist being inhibited, which makes it possible to enhance the uniformity of developing line width.

(Sixth Embodiment)

Figure 45:
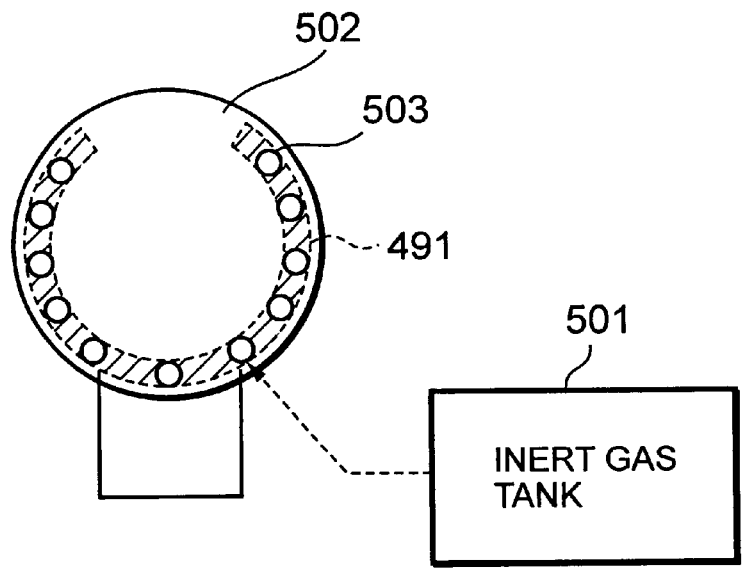
FIG. 45 is an explanatory view of a sixth embodiment of the present invention.
Figure 46:
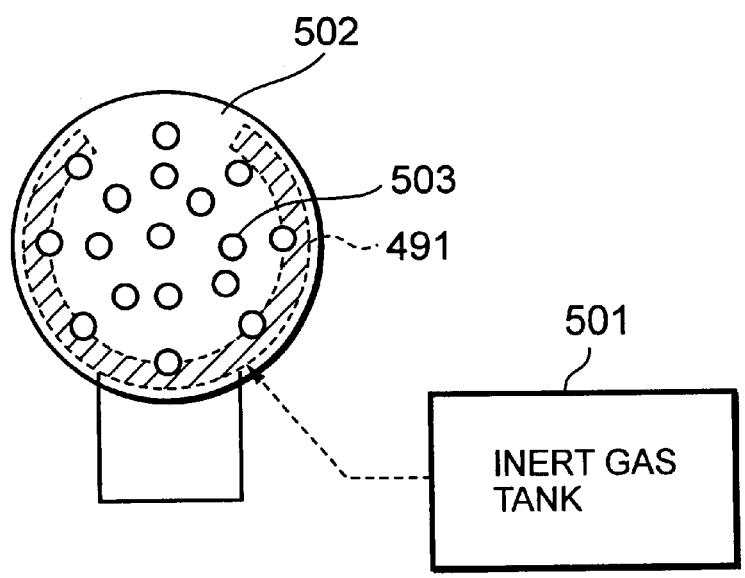
FIG. 46 is an explanatory view of another example of the sixth embodiment of the present invention.

In the embodiment shown in FIG. 43 and FIG. 44, the gas the temperature and the humidity of which are adjusted is supplied from the gas supply holes 494 of the gas supply section 409, but as shown in FIG. 45, an inert gas may be supplied from an inert gas tank 501 which contains nitrogen and the like toward the wafer W on an arm (tweezers) 491 through gas supply holes (blast ports) 503 of a gas supply section (top cover) 502. The blast ports 503 may be provided, as shown in FIG. 45, to correspond to the shape of the tweezers 491, and may be provided, as shown in FIG. 46, to correspond to a circle which is the shape of the wafer W.

Being structured like this, it is prevented that the hydrolysis of a resist occurs due to moisture in air during the transfer of the substrate coated with the resist, and that the pattern resolution is influenced by being united with oxygen in the atmospheric air.

Incidentally, the temperature and the humidity of the inert gas may be controlled as shown in FIG. 43 and FIG. 44.

Further, the inert gas is supplied as described above when the wafer W is transferred from the resist coating unit to the heating processing unit, so that the gas can be supplied efficiently.

The disclosure of Japanese Patent Applications No.2000-24221 filed Feb. 1, 2000, No.2000-38509 filed Feb. 16, 2000, No.2000-137509 filed May 10, 2000 and No.2000-133304 filed May 2, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus for performing coating and developing processing for a substrate, comprising:

a loader/unloader section for carrying the substrate into/out of the substrate processing apparatus;

a processing section having a coating processing unit for at least forming a coating film on the substrate, a developing processing unit for developing the substrate, a thermal processing unit for thermally processing the substrate, and a first transfer device for carrying the substrate into/out of the coating processing unit, the developing processing unit, and the thermal processing unit;

an interface section having a second transfer device for transferring the substrate at least via a route between the processing section and an aligner for subjecting the substrate to exposure processing;

a first gas supply device for supplying an inert gas to the interface section;

a first exhaust device for exhausting an atmosphere in the interface section;

a second gas supply device for supplying the inert gas to the loader/unloader section; and a second exhaust device for exhausting an atmosphere in the loader/unloader section.

2. The apparatus as set forth in claim 1, further comprising:

a third gas supply device for supplying the inert gas to an area having at least the thermal processing unit and the first transfer device in the processing section; and a third exhaust device for exhausting an atmosphere at least in the area.

3. The apparatus as set forth in claim 2, further comprising:

a first partition plate shutting off the atmosphere in the interface section from the atmosphere in the processing section and having a first transit opening for delivering the substrate between the area in the processing section and the interface section; and a first shutter allowing the first transit opening to freely open and close.

4. The apparatus as set forth in claim 3, further comprising:

a second partition plate shutting off the atmosphere in the processing section from the atmosphere in the loader/unloader section and having a second transit opening for delivering the substrate between the area in the processing section and the loader/unloader section; and a second shutter allowing the second transit opening to freely open and close.

5. The apparatus as set forth in claim 1, further comprising:

a cleaning mechanism for cleaning at least a part of the atmosphere exhausted by the first exhaust device and sending the same as the inert gas to the gas supply device again.

6. The apparatus as set forth in claim 1, further comprising:
a temperature regulating mechanism for regulating a temperature of the inert gas.

7. A substrate processing apparatus for performing coating and developing processing for a substrate, comprising:
a loader/unloader section for carrying the substrate into/out of the substrate processing apparatus;
a processing section having a coating processing unit for at least forming a coating film on the substrate, a developing processing unit for developing the substrate, a thermal processing unit for thermally processing the substrate, and a first transfer device for carrying the substrate into/out of the coating processing unit, the developing processing unit, and the thermal processing unit;
an interface section having a second transfer device for transferring the substrate at least via a route between the processing section and an aligner for subjecting the substrate to exposure processing;
a first gas supply device for supplying an inert gas to the interface section;
a first exhaust device for exhausting an atmosphere in the interface section; and
a first pressure regulating mechanism for setting a pressure inside the interface section lower than a pressure inside the aligner.

8. The apparatus as set forth in claim 7, further comprising:
a second pressure regulating mechanism for setting the pressure inside the interface section lower than a pressure inside the area in the processing section.

9. The apparatus as set forth in claim 8, further comprising:
a third pressure regulating mechanism for setting the pressure inside the area in the processing section higher than a pressure inside the loader/unloader section.

10. The apparatus as set forth in claim 8, further comprising:
a third pressure regulating mechanism for setting the pressure inside the area in the processing section lower than pressures inside the coating processing unit and the developing processing unit in the processing section.

11. A substrate processing apparatus for performing coating and developing processing for a substrate, comprising:
a loader/unloader section for carrying the substrate into/out of the substrate processing apparatus;
a processing section having a coating processing unit for at least forming a coating film on the substrate, a developing processing unit for developing the substrate, a thermal processing unit for thermally processing the substrate, and a first transfer device for carrying the substrate into/out of the coating processing unit, the developing processing unit, and the thermal processing unit;
an interface section having a second transfer device for transferring the substrate at least via a route between the processing section and an aligner for subjecting the substrate to exposure processing;
a first gas supply device for supplying an inert gas to the interface section;
a first exhaust device for exhausting an atmosphere in the interface section; and
a pressure regulating mechanism for setting a pressure inside the substrate processing apparatus higher than a pressure outside the substrate processing apparatus.

12. A substrate processing apparatus for performing coating and developing processing for a substrate, comprising:
a processing section having a coating processing unit for at least forming a coating film on the substrate, a developing processing unit for developing the substrate, a thermal processing unit for thermally processing the substrate, and a first transfer device for carrying the substrate into/out of the coating processing unit, the developing processing unit, and the thermal processing unit;
an interface section having a second transfer device for transferring the substrate at least via a route between the processing section and an aligner for subjecting the substrate to exposure processing;
a first gas supply device for supplying an inert gas to the interface section; and
a first exhaust device for exhausting an atmosphere in the interface section; and
a pressure regulating mechanism for setting a pressure inside the interface section lower than a pressure inside the aligner.

13. The apparatus as set forth in claim 12,
wherein the second gas supply device supplies the inert gas having a temperature lower than a temperature of the inert gas supplied by the first gas supply device.

14. The apparatus as set forth in claim 12,
wherein the second gas supply device supplies the inert gas having a low oxygen concentration.

15. The apparatus as set forth in claim 12, further comprising:
a partition plate shutting off the atmosphere in the area before exposure from the atmosphere in the area after exposure.

16. The apparatus as set forth in claim 12, further comprising:
a partition plate shutting off an atmosphere in the processing section from an atmosphere in the interface section and having a first transit opening for delivering the substrate between the processing section and the area before exposure and a second transit opening for delivering the substrate between the processing section and the area after exposure,
a first shutter allowing the first transit opening to freely open and close; and
a second shutter allowing the second transit opening to freely open and close.

17. The apparatus as set forth in claim 12, further comprising:
a temperature regulating mechanism for regulating a temperature of the inert gas.

* * * * *

UNITED STATES PATENT AND TRADEMARK OFFICE
CERTIFICATE OF CORRECTION

PATENT NO. : 6,632,281 B2
DATED : October 14, 2003
INVENTOR(S) : Kitano et al.

It is certified that error appears in the above-identified patent and that said Letters Patent is hereby corrected as shown below:

<u>Title page,</u>
Item [75], Inventors, should read:
-- [75] Inventors: Junichi Kitano, Nirasaki (JP); Yuji Matsuyama, Kumamoto-ken (JP); Takahiro Kitano, Kumamoto-ken (JP) --

Signed and Sealed this

Sixth Day of January, 2004

JAMES E. ROGAN
*Director of the United States Patent and Trademark Office*